United States Patent
Kim

(10) Patent No.: US 11,972,137 B2
(45) Date of Patent: Apr. 30, 2024

(54) SYSTEM AND MEMORY FOR ARTIFICIAL NEURAL NETWORK (ANN) OPTIMIZATION USING ANN DATA LOCALITY

(71) Applicant: DEEPX CO., LTD., Seongnam-si (KR)

(72) Inventor: Lok Won Kim, Seongnam-si (KR)

(73) Assignee: DEEPX CO., LTD., Seongnam-si (KR)

( * ) Notice: Subject to any disclaimer, the term of this patent is extended or adjusted under 35 U.S.C. 154(b) by 0 days.

(21) Appl. No.: 17/514,028

(22) Filed: Oct. 29, 2021

(65) Prior Publication Data

US 2022/0137869 A1    May 5, 2022

(30) Foreign Application Priority Data

Nov. 2, 2020   (KR) .......... 10-2020-0144308
Oct. 25, 2021  (KR) .......... 10-2021-0142774

(51) Int. Cl.
*G06F 3/06*       (2006.01)
*G06N 3/063*      (2023.01)

(52) U.S. Cl.
CPC .......... *G06F 3/0655* (2013.01); *G06F 3/0604* (2013.01); *G06F 3/0679* (2013.01); *G06N 3/063* (2013.01)

(58) Field of Classification Search
CPC .... G06F 3/0604; G06F 3/0655; G06F 3/0679; G06F 12/0862; G06F 13/1621; G06F 13/1668; G06F 2212/6026; G06F 3/0614; G06F 3/0659

See application file for complete search history.

(56) References Cited

U.S. PATENT DOCUMENTS 10,360,971 B1 * 7/2019 Hokenmaier .......... G06N 3/063
2006/0013058 A1   1/2006 Kang et al.
(Continued)

FOREIGN PATENT DOCUMENTS

KR   10-2003-0010469 A   2/2003
KR   10-2006-0007115 A   1/2006
(Continued)

OTHER PUBLICATIONS

L. Peled et al._A neural network memory prefetcher using semantic locality, Jul. 26, 2018.
C. Luk_Memory forwarding enabling aggressive layout optimizations by guaranteeing the safety of data relocation, 1999.
(Continued)

*Primary Examiner* — Jane W Benner
(74) *Attorney, Agent, or Firm* — INVENSTONE PATENT, LLC

(57) ABSTRACT

A system for an artificial neural network (ANN) includes a main memory including a dynamic memory cell electrically coupled to a bit line and a word line; and a memory controller configured to selectively omit a restore operation during a read operation of the dynamic memory cell. The main memory may be configured to selectively omit the restoration operation during the read operation of the dynamic memory cell by controlling a voltage applied to the word line. The memory controller may be further configured to determine whether to perform the restoration operation by determining whether data stored in the dynamic memory cell is reused. Thus, the system optimizes an ANN operation of the processor by utilizing the ANN data locality of the ANN model, which operates at a processor-memory level.

16 Claims, 55 Drawing Sheets

(56) References Cited

U.S. PATENT DOCUMENTS

| | | | |
|---|---|---|---|
| 2007/0106860 A1* | 5/2007 | Foster, Sr. | G06F 1/3275 711/170 |
| 2011/0296097 A1* | 12/2011 | Elnozahy | G06F 1/3275 711/E12.001 |
| 2014/0063950 A1 | 3/2014 | Baek et al. | |
| 2015/0199394 A1* | 7/2015 | Fudono | G11C 11/40622 707/609 |
| 2018/0190339 A1* | 7/2018 | Akin | G11C 7/22 |
| 2019/0057300 A1 | 2/2019 | Mathuriya et al. | |
| 2019/0138892 A1* | 5/2019 | Kim | G06N 3/049 |
| 2019/0187963 A1 | 6/2019 | Bokhari et al. | |
| 2019/0205746 A1 | 7/2019 | Nurvitadhi et al. | |
| 2019/0236445 A1 | 8/2019 | Das et al. | |
| 2020/0387422 A1* | 12/2020 | Bell | G06F 11/0766 |
| 2021/0263865 A1* | 8/2021 | Lee | G06F 13/1668 |
| 2023/0306258 A1 | 9/2023 | Assael et al. | |

FOREIGN PATENT DOCUMENTS

| | | |
|---|---|---|
| KR | 10-2007-0114851 A | 12/2007 |
| KR | 10-2014-0036620 A | 3/2014 |
| KR | 20140088725 A | 7/2014 |
| KR | 10-2018-0062914 A | 6/2018 |
| KR | 20190018888 A | 2/2019 |
| KR | 10-2020-0040560 A | 4/2020 |
| KR | 10-2020-0108363 A | 9/2020 |

OTHER PUBLICATIONS

L. R. Long. A Framework for FPGA-based Acceleration of Neural Network Inference with Limited Numerical Precision via High-level Synthesis with Streaming Functionality. 2016.

S. Park_History-based memory mode prediction for improving memory performance, Jun. 20, 2003.

S. Li_FPGA Acceleration of Recurrent Neural Network Based Language Model, Jul. 16, 2015.

"A neural network memory prefetcher using semantic locality" including the L. Peled etc arXiv: 1804.00478v2 (Jul. 26, 2018).

"Memory forwarding: enabling aggressive layout optimizations by guaranteeing the safety of data relocation". Proceedings of the 26th annual international symposium on Computer architecture. ACM. pp88-99 including the C. Luk etc(May 1, 1999).

"A Framework for FPGA-based Acceleration of Neural Network Inference with Limited Numerical Precision via High- level Synthesis with Streaming Functionality". Thesis, and the University of Toronto, the L. R. Long. (2016).

"History-based memory mode prediction for improving memory performance". 2003 IEEE International Symposium on Circuits and Systems including the S. Park etc (Jun. 20, 2003).

"FPGA Acceleration of Recurrent Neural Network Based Language Model". 2015 IEEE 23rd Annual International Symposium on Field-Programmable Custom Computing Machines including the S. Li etc (Jul. 16, 2015).

E. Baek etc. "A Multi-Neural Network Acceleration Architecture". ISCA '20: Proceedings of the ACM/IEEE 47th Annual International Symposium on Computer Architecture. (Sep. 23, 2020).

* cited by examiner

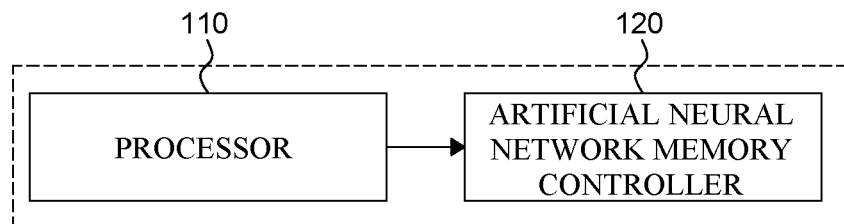
FIG. 1A
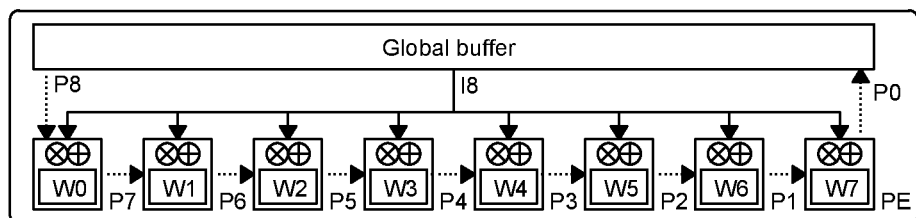
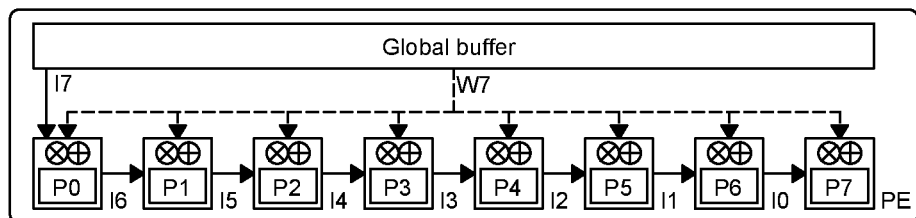
FIG. 1B

| DATA ACCESS REQUEST RECORDING ORDER | Memory Address | | Mode | PATTERN MATCHING | TOKEN |
|---|---|---|---|---|---|
| | Start | End | | | |
| #1 | 0 | 0x1000000 | READ | NO | 1 |
| #2 | 0x1100000 | 0x1110000 | READ | NO | 2 |
| #3 | 0x2000000 | 0x2100000 | WRITE | NO | 3 |
| #4 | 0x2000000 | 0x2100000 | READ | NO | 4 |
| #5 | 0x2110000 | 0x2300000 | READ | NO | 5 |
| #6 | 0x2400000 | 0x2500000 | WRITE | NO | 6 |
| #7 | 0x2400000 | 0x2500000 | READ | NO | 7 |
| #8 | 0x3000000 | 0x3100000 | READ | NO | 8 |
| #9 | 0x3110000 | 0x3121000 | WRITE | NO | 9 |
| #10 | 0 | 0x1000000 | READ | YES | 1 |
| #11 | 0x1100000 | 0x1110000 | READ | YES | 2 |
| #12 | 0x2000000 | 0x2100000 | WRITE | YES | 3 |
| #13 | 0x2000000 | 0x2100000 | READ | YES | 4 |
| #14 | 0x2110000 | 0x2300000 | READ | YES | 5 |
| #15 | 0x2400000 | 0x2500000 | WRITE | YES | 6 |
| #16 | 0x2400000 | 0x2500000 | READ | YES | 7 |
| #17 | 0x3000000 | 0x3100000 | READ | YES | 8 |
| #18 | 0x3110000 | 0x3121000 | WRITE | YES | 9 |

| DATA ACCESS REQUEST | TOKEN | IDENTIFICATION INFORMATION | |
|---|---|---|---|
| | | MEMORY ADDRESS VALUE | OPERATION MODE |
| #1 | [1] | FIRST ADDRESS | READ |
| #2 | [2] | SECOND ADDRESS | READ |
| #3 | [3] | THIRD ADDRESS | WRITE |
| #4 | [4] | THIRD ADDRESS | READ |
| #5 | [5] | FOURTH ADDRESS | READ |
| #6 | [6] | FIFTH ADDRESS | WRITE |
| #7 | [7] | FIFTH ADDRESS | READ |
| #8 | [8] | SIXTH ADDRESS | READ |
| #9 | [9] | SEVENTH ADDRESS | WRITE |

| DATA ACCESS REQUEST TOKEN | PREDICTED DATA ACCESS REQUEST TOKEN | ACTUAL DATA ACCESS REQUEST TOKEN | PATTERN MATCHING |
|---|---|---|---|
| [1] | [1] | [1] | YES |
| [2] | [2] | [2] | YES |
| [3] | [3] | [3] | YES |
| [4] | [4] | [4] | YES |
| [5] | [5] | [5] | YES |
| [6] | [6] | [6] | YES |
| [7] | [7] | [7] | YES |
| [8] | [8] | [8] | YES |
| [9] | [9] | [9] | YES |

FIG. 6

| [1bit] ARTIFICIAL NEURAL NETWORK OPERATION | | [1bit] OPERATION TYPE | | [3bit] OPERATION MODE | | [3bit] DOMAIN | |
|---|---|---|---|---|---|---|---|
| [0] | TRUE | [0] | LEARNING | [000] | READ | [000] | OTHER |
| [1] | FALSE | [1] | INFERENCE | [001] | WRITE | [001] | INFERENCE DATA |
| | | | | [010] | READ-DISCARD | [010] | FEATURE MAP |
| | | | | [011] | REFRESH | [011] | WEIGHT |
| | | | | [100] | READ-BURST | [100] | LEARNING DATA SET |
| | | | | [101] | WRITE-BURST | [101] | EVALUATION DATA SET |

| [5bit] QUANTIZATION | | [4bit] ANN MODEL # | | [4bit] MULTI-THREAD | | [8bit] ANN DATA LOCALITY | |
|---|---|---|---|---|---|---|---|
| [00000] | Default | [0000] | #1 | [0000] | #1 | [00000000] | 1 |
| [00001] | 1 bit width | [0001] | #2 | [0001] | #2 | [00000001] | 2 |
| [00010] | 2 bit width | [0010] | #3 | [0010] | #3 | [00000010] | 3 |
| [00011] | 3 bit width | [0011] | #4 | [0011] | #4 | [00000011] | 4 |
| ... | ... | ... | ... | ... | ... | ... | ... |
| [11111] | 32 bit width | [1111] | #16 | [1111] | #16 | [11111111] | 256 |

FIG. 12

A: Transaction request may be delayed in Queue
B: Transaction request sent to Memory Controller
C: Transaction converted to Command Sequences
                                (may be queued)
D: Command/s Sent to DRAM
$E_1$: Requires only a CAS or
$E_2$: Requires RAS + CAS or
$E_3$: Requires PRE + RAS + CAS
F: Transaction sent back to CPU
DRAM Latency = A + B + C + D + E + F

| Layer name | Input feature map | | | Kernel | | | Output feature map | | | Strides | Algorithm | | Amount of computation | Data size (Byte) | | |
|---|---|---|---|---|---|---|---|---|---|---|---|---|---|---|---|---|
| | Height | Width | Ch # | Height | Width | Ch # | Height | Width | Ch # | | Pooling | Activation | MAC | Kernel_SIZE | IFMAP_SIZE | OFMAP_SIZE |
| 1 | 224 | 224 | 3 | 3 | 3 | 64 | 224 | 224 | 64 | 1 | No | ReLU | 86,704,128 | 1,792 | 3,211,264 | 150,528 |
| 2 | 224 | 224 | 64 | 3 | 3 | 64 | 112 | 112 | 64 | 1 | Max_Pooling | ReLU | 1,849,688,064 | 36,928 | 3,211,264 | 3,211,264 |
| 3 | 112 | 112 | 64 | 3 | 3 | 128 | 112 | 112 | 128 | 2 | No | ReLU | 924,844,032 | 73,856 | 1,605,632 | 802,816 |
| 4 | 112 | 112 | 128 | 3 | 3 | 128 | 56 | 56 | 128 | 1 | Max_Pooling | ReLU | 1,849,688,064 | 147,584 | 1,605,632 | 1,605,632 |
| 5 | 56 | 56 | 128 | 3 | 3 | 256 | 56 | 56 | 256 | 2 | No | ReLU | 924,844,032 | 295,168 | 802,816 | 401,408 |
| 6 | 56 | 56 | 256 | 3 | 3 | 256 | 56 | 56 | 256 | 1 | No | ReLU | 1,849,688,064 | 590,080 | 802,816 | 802,816 |
| 7 | 56 | 56 | 256 | 3 | 3 | 256 | 28 | 28 | 256 | 1 | Max_Pooling | ReLU | 1,849,688,064 | 590,080 | 802,816 | 802,816 |
| 8 | 28 | 28 | 256 | 3 | 3 | 512 | 28 | 28 | 512 | 2 | No | ReLU | 924,844,032 | 401,408 | 401,408 | 200,704 |
| 9 | 28 | 28 | 512 | 3 | 3 | 512 | 28 | 28 | 512 | 1 | No | ReLU | 1,849,688,064 | 401,408 | 2,359,808 | 401,408 |
| 10 | 28 | 28 | 512 | 3 | 3 | 512 | 14 | 14 | 512 | 1 | Max_Pooling | ReLU | 1,849,688,064 | 401,408 | 2,359,808 | 401,408 |
| 11 | 14 | 14 | 512 | 3 | 3 | 512 | 14 | 14 | 512 | 2 | No | ReLU | 462,422,016 | 100,352 | 2,359,808 | 100,352 |
| 12 | 14 | 14 | 512 | 3 | 3 | 512 | 14 | 14 | 512 | 1 | No | ReLU | 462,422,016 | 100,352 | 2,359,808 | 100,352 |
| 13 | 14 | 14 | 512 | 3 | 3 | 512 | 7 | 7 | 512 | 1 | Max_Pooling | ReLU | 462,422,016 | 100,352 | 2,359,808 | 100,352 |
| 14 | 7 | 7 | 512 | 3 | 3 | – | 7 | 7 | 512 | 1 | AVG_Pooling | No | – | 25,088 | – | 25,088 |
| 14' | 1 | 1 | 25088 | – | – | 4096 | 1 | 1 | 4096 | 1 | No | ReLU | 102,760,448 | 4,096 | 102,764,544 | 25,088 |
| 15 | 1 | 1 | 4096 | – | – | 4096 | 1 | 1 | 4096 | 1 | No | ReLU | 16,777,216 | 4,096 | 16,781,312 | 4,096 |
| 16 | 1 | 1 | 4096 | – | – | 1000 | 1 | 1 | 1000 | 1 | No | No | 4,096,000 | 1,000 | 4,097,000 | 4,096 |

FIG. 19

| Layer name | Input feature map | | | Kernel | | | Output feature map | | | Strides | Algorithm | | Amount of computation | Data size (Byte) | | |
|---|---|---|---|---|---|---|---|---|---|---|---|---|---|---|---|---|
| | Height | Width | Ch # | Height | Width | Ch # | Height | Width | Ch # | | Pooling | Activation | MAC | Kernel_SIZE | IFMAP_SIZE | OFMAP_SIZE |
| 1 | 224 | 224 | 3 | 3 | 3 | 32 | 112 | 112 | 32 | 2 | No | ReLU | 10,838,016 | 864 | 150,528 | 401,408 |
| 2 | 112 | 112 | 32 | 3 | 3 | 1 | 112 | 112 | 32 | 1 | No | ReLU | 3,612,672 | 288 | 401,408 | 401,408 |
| 3 | 112 | 112 | 32 | 1 | 1 | 64 | 112 | 112 | 64 | 1 | No | ReLU | 25,690,112 | 2,048 | 401,408 | 802,816 |
| 4 | 112 | 112 | 64 | 3 | 3 | 1 | 56 | 56 | 64 | 2 | No | ReLU | 1,806,336 | 576 | 802,816 | 200,704 |
| 5 | 56 | 56 | 64 | 1 | 1 | 128 | 56 | 56 | 128 | 1 | No | ReLU | 5,690,112 | 8,192 | 200,704 | 401,408 |
| 6 | 56 | 56 | 128 | 3 | 3 | 1 | 56 | 56 | 128 | 1 | No | ReLU | 3,612,672 | 1,152 | 401,408 | 401,408 |
| 7 | 56 | 56 | 128 | 1 | 1 | 128 | 56 | 56 | 128 | 1 | No | ReLU | 51,380,224 | 16,384 | 401,408 | 401,408 |
| 8 | 56 | 56 | 128 | 3 | 3 | 1 | 28 | 28 | 128 | 2 | No | ReLU | 903,168 | 1,152 | 401,408 | 100,352 |
| 9 | 28 | 28 | 128 | 1 | 1 | 256 | 28 | 28 | 256 | 1 | No | ReLU | 25,690,112 | 32,768 | 100,352 | 200,704 |
| 10 | 28 | 28 | 256 | 3 | 3 | 1 | 28 | 28 | 256 | 1 | No | ReLU | 1,806,336 | 2,304 | 200,704 | 200,704 |
| 11 | 28 | 28 | 256 | 1 | 1 | 256 | 28 | 28 | 256 | 1 | No | ReLU | 51,380,224 | 65,536 | 200,704 | 200,704 |
| 12 | 28 | 28 | 256 | 3 | 3 | 1 | 14 | 14 | 256 | 2 | No | ReLU | 451,584 | 2,304 | 200,704 | 50,176 |
| 13 | 14 | 14 | 256 | 1 | 1 | 512 | 14 | 14 | 512 | 1 | No | ReLU | 25,690,112 | 131,072 | 50,176 | 100,352 |
| 14 | 14 | 14 | 512 | 3 | 3 | 1 | 14 | 14 | 512 | 1 | No | ReLU | 903,168 | 4,608 | 100,352 | 100,352 |
| 15 | 14 | 14 | 512 | 1 | 1 | 512 | 14 | 14 | 512 | 1 | No | ReLU | 51,380,224 | 262,144 | 100,352 | 100,352 |
| 16 | 14 | 14 | 512 | 3 | 3 | 1 | 14 | 14 | 512 | 1 | No | ReLU | 903,168 | 4,608 | 100,352 | 100,352 |
| 17 | 14 | 14 | 512 | 1 | 1 | 512 | 14 | 14 | 512 | 1 | No | ReLU | 51,380,224 | 262,144 | 100,352 | 100,352 |
| 18 | 14 | 14 | 512 | 3 | 3 | 1 | 14 | 14 | 512 | 1 | No | ReLU | 903,168 | 4,608 | 100,352 | 100,352 |
| 19 | 14 | 14 | 512 | 1 | 1 | 512 | 14 | 14 | 512 | 1 | No | ReLU | 51,380,224 | 262,144 | 100,352 | 100,352 |
| 20 | 14 | 14 | 512 | 3 | 3 | 1 | 14 | 14 | 512 | 1 | No | ReLU | 903,168 | 4,608 | 100,352 | 100,352 |
| 21 | 14 | 14 | 512 | 1 | 1 | 512 | 14 | 14 | 512 | 1 | No | ReLU | 51,380,224 | 262,144 | 100,352 | 100,352 |
| 22 | 14 | 14 | 512 | 3 | 3 | 1 | 14 | 14 | 512 | 1 | No | ReLU | 903,168 | 4,608 | 100,352 | 100,352 |
| 23 | 14 | 14 | 512 | 1 | 1 | 512 | 14 | 14 | 512 | 1 | No | ReLU | 51,380,224 | 262,144 | 100,352 | 100,352 |
| 24 | 14 | 14 | 512 | 3 | 3 | 1 | 7 | 7 | 512 | 2 | No | ReLU | 225,792 | 4,608 | 100,352 | 25,088 |
| 25 | 7 | 7 | 512 | 1 | 1 | 1024 | 7 | 7 | 1024 | 1 | No | ReLU | 25,690,112 | 524,288 | 25,088 | 50,176 |
| 26 | 7 | 7 | 1024 | 3 | 3 | 1 | 7 | 7 | 1024 | 1 | No | ReLU | 451,584 | 9,216 | 50,176 | 50,176 |
| 27 | 7 | 7 | 1024 | 1 | 1 | 1024 | 7 | 7 | 1024 | 1 | YES | ReLU | 51,380,224 | 1,048,576 | 50,176 | 1,024 |
| 28 | 1 | 1 | 1024 | 1 | 1 | 1000 | 1 | 1 | 1000 | 1 | No | NO | 1,024,000 | 1,025,000 | 1,024 | 1,000 |

FIG. 20

| Layer | start | end | Operation Mode | Domain | ANN DATA LOCALITY | DATA SIZE (Byte) |
|---|---|---|---|---|---|---|
| 1 | 0x000000000 | 0x000024C00 | Read-Burst | IFMAP | 1 | 150,528 |
| 1 | 0x000024C01 | 0x000024F60 | Read-Burst | Kernel | 2 | 864 |
| 1 | 0x000024F61 | 0x000086F60 | Write-Burst | OFMAP | 3 | 401,408 |
| 2 | 0x000024F61 | 0x000086F60 | Read-Burst | IFMAP | 4 | 401,408 |
| 2 | 0x000086F61 | 0x000087080 | Read-Burst | Kernel | 5 | 288 |
| 2 | 0x000087081 | 0x0000E9080 | Write-Burst | OFMAP | 6 | 401,408 |
| 3 | 0x000087081 | 0x0000E9080 | Read-Burst | IFMAP | 7 | 401,408 |
| 3 | 0x0000E9081 | 0x0000E9880 | Read-Burst | Kernel | 8 | 2,048 |
| 3 | 0x0000E9881 | 0x0001AD880 | Write-Burst | OFMAP | 9 | 802,816 |
| 4 | 0x0000E9881 | 0x0001AD880 | Read-Burst | IFMAP | 10 | 802,816 |
| 4 | 0x0001AD881 | 0x0001ADAC0 | Read-Burst | Kernel | 11 | 576 |
| 4 | 0x0001ADAC1 | 0x0001DEAC0 | Write-Burst | OFMAP | 12 | 200,704 |
| 5 | 0x0001ADAC1 | 0x0001DEAC0 | Read-Burst | IFMAP | 13 | 200,704 |
| 5 | 0x0001DEAC1 | 0x0001E0AC0 | Read-Burst | Kernel | 14 | 8,192 |
| 5 | 0x0001E0AC1 | 0x000242AC0 | Write-Burst | OFMAP | 15 | 401,408 |

⋮

| | | | | | | |
|---|---|---|---|---|---|---|
| 27 | 0x0006F13C1 | 0x0007F13C0 | Read-Burst | Kernel | 80 | 1,048,576 |
| 27 | 0x0007F13C1 | 0x0007F17C0 | Write-Burst | OFMAP | 81 | 1,024 |
| 28 | 0x0007F13C1 | 0x0007F17C0 | Read-Burst | IFMAP | 82 | 1,024 |
| 28 | 0x0007F17C1 | 0x0008EBBA8 | Read-Burst | Kernel | 83 | 1,025,000 |
| 28 | 0x0008EBBA9 | 0x0008EBF90 | Write-Burst | OFMAP | 84 | 1,000 |

FIG. 21

| Layer | start | end | Operation Mode | Domain | ANN DATA LOCALITY | DATA SIZE (Byte) |
|---|---|---|---|---|---|---|
| 1 | 0 | A = A' | Read-Burst | IFMAP | 1 | A |
| 1 | A' + 1 | A + 1 + B = B' | Read-Burst | Kernel | 2 | B |
| 1 | B' + 1 | B' + 1 + C = C' | Write-Burst | OFMAP | 3 | C |
| 2 | B' + 1 | B' + 1 + C = C' | Read-Burst | IFMAP | 4 | C |
| 2 | C' + 1 | C' + 1 + D = D' | Read-Burst | Kernel | 5 | D |
| 2 | D' + 1 | D' + 1 + E = E' | Write-Burst | OFMAP | 6 | E |
| 3 | D' + 1 | D' + 1 + E = E' | Read-Burst | IFMAP | 7 | E |
| 3 | E' + 1 | E' + 1 + F = F' | Read-Burst | Kernel | 8 | F |
| 3 | F' + 1 | F' + 1 + G = G' | Write-Burst | OFMAP | 9 | G |
| 4 | F' + 1 | F' + 1 + G = G' | Read-Burst | IFMAP | 10 | G |
| 4 | G' + 1 | G' + 1 + H = H' | Read-Burst | Kernel | 11 | H |
| 4 | H' + 1 | H' + 1 + I = I' | Write-Burst | OFMAP | 12 | I |
| 5 | H' + 1 | H' + 1 + I = I' | Read-Burst | IFMAP | 13 | I |
| 5 | I' + 1 | I' + 1 + J = J' | Read-Burst | Kernel | 14 | J |
| 5 | J' + 1 | J' + 1 + K = K' | Write-Burst | OFMAP | 15 | K |

FIG. 22

| Layer | start | end | Operation Mode | Domain | ANN DATA LOCALITY | DATA SIZE (Byte) |
|---|---|---|---|---|---|---|
| 1 | 0 | A = A' | Read-Burst | Kernel | 1 | A |
| 1 | A' + 1 | A' + 1 + B = B' | Read-Burst | IFMAP | 2 | B |
| 1 | B' + 1 | B' + 1 + C = C' | Write-Burst | OFMAP | 3 | C |
| 2 | C' + 1 | C' + 1 + D = D' | Read-Burst | Kernel | 4 | D |
| 2 | B' + 1 | B' + 1 + C = C' | Read-Burst | IFMAP | 5 | C |
| 2 | D' + 1 | D' + 1 + E = E' | Write-Burst | OFMAP | 6 | E |
| 3 | E' + 1 | E' + 1 + F = F' | Read-Burst | Kernel | 7 | F |
| 3 | D' + 1 | D' + 1 + E = E' | Read-Burst | IFMAP | 8 | E |
| 3 | F' + 1 | F' + 1 + G = G' | Write-Burst | OFMAP | 9 | G |
| 4 | G' + 1 | G' + 1 + H = H' | Read-Burst | Kernel | 10 | H |
| 4 | F' + 1 | F' + 1 + G = G' | Read-Burst | IFMAP | 11 | G |
| 4 | H' + 1 | H' + 1 + I = I' | Write-Burst | OFMAP | 12 | I |
| 5 | I' + 1 | I' + 1 + J = J' | Read-Burst | Kernel | 13 | J |
| 5 | H' + 1 | H' + 1 + I = I' | Read-Burst | IFMAP | 14 | I |
| 5 | J' + 1 | J' + 1 + K = K' | Write-Burst | OFMAP | 15 | K |

FIG. 24

| Layer | start | end | Operation Mode | Domain | ANN DATA LOCALITY | DATA SIZE (Byte) |
|---|---|---|---|---|---|---|
| 1 | 0 | M_FMAP = A' | Read-Burst | IFMAP | 1 | M_FMAP |
| 1 | A' +1 | A' + 1 + B = B' | Read-Burst | Kernel | 2 | B |
| 1 | 0 | C | Write-Burst | OFMAP | 3 | C |
| 2 | 0 | C | Read-Burst | IFMAP | 4 | C |
| 2 | B' + 1 | B' + 1 + D = D' | Read-Burst | Kernel | 5 | D |
| 2 | 0 | E | Write-Burst | OFMAP | 6 | E |
| 3 | 0 | E | Read-Burst | IFMAP | 7 | E |
| 3 | D' + 1 | D' + 1 + F = F' | Read-Burst | Kernel | 8 | F |
| 3 | 0 | G | Write-Burst | OFMAP | 9 | G |
| 4 | 0 | G | Read-Burst | IFMAP | 10 | G |
| 4 | F' + 1 | F' + 1 + H = H' | Read-Burst | Kernel | 11 | H |
| 4 | 0 | I | Write-Burst | OFMAP | 12 | I |
| 5 | 0 | I | Read-Burst | IFMAP | 13 | I |
| 5 | H' + 1 | H' + 1 + J = J' | Read-Burst | Kernel | 14 | J |
| 5 | 0 | K | Write-Burst | OFMAP | 15 | K |

FIG. 26

| Layer | start | end | Operation Mode | Domain | ANN DATA LOCALITY | DATA SIZE (Byte) |
|---|---|---|---|---|---|---|
| 1 | 0 | A = A' | Read-Burst | IFMAP | 1 | A |
| 1 | A' + 1 | A + 1 + B = B' | Read-Burst | Kernel | 2 | B |
| 1 | B' + 1 | B' + 1 + C = C' | Write-Burst | OFMAP | 3 | C |
| 2 | B' + 1 | B' + 1 + C = C' | Read-Burst | IFMAP | 4 | C |
| 2 | C' + 1 | C' + 1 + D = D' | Read-Burst | Kernel | 5 | D |
| 2 | D' + 1 | D' + 1 + E = E' | Write-Burst | OFMAP | 6 | E |
| 3 | D' + 1 | D' + 1 + E = E' | Read-Burst | IFMAP | 7 | E |
| 3 | E' + 1 | E' + 1 + F = F' | Read-Burst | Kernel | 8 | F |
| 3 | F' + 1 | F' + 1 + G = G' | Write-Burst | OFMAP | 9 | G |
| 4 | F' + 1 | F' + 1 + G = G' | Read-Burst | IFMAP | 10 | G |
| 4 | G' + 1 | G' + 1 + H = H' | Read-Burst | Kernel | 11 | H |
| 4 | H' + 1 | H' + 1 + I = I' | Write-Burst | OFMAP | 12 | I |
| 5 | H' + 1 | H' + 1 + I = I' | Read-Burst | IFMAP | 13 | I |
| 5 | I' + 1 | I' + 1 + J = J' | Read-Burst | Kernel | 14 | J |
| 5 | J' + 1 | J' + 1 + K = K' | Write-Burst | OFMAP | 15 | K |

FIG. 43

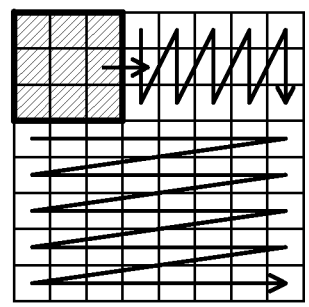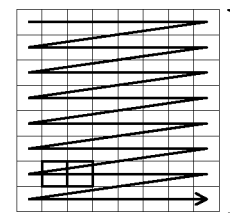
FIG. 53A
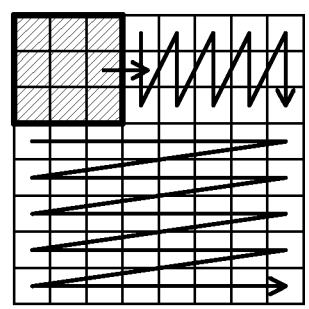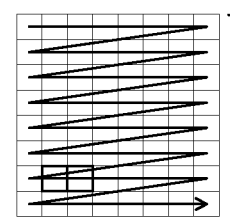
FIG. 53B

SYSTEM AND MEMORY FOR ARTIFICIAL NEURAL NETWORK (ANN) OPTIMIZATION USING ANN DATA LOCALITY

CROSS-REFERENCE TO RELATED APPLICATIONS

This application claims the priority of Korean Patent Application No. 10-2020-0144308 filed on Nov. 2, 2020, Korean Patent Application No. 10-2021-0044773 filed on Apr. 6, 2021, and Korean Patent Application No. 10-2021-0142774 filed on Oct. 25, 2021, in the Korean Intellectual Property Office, the disclosure of which is incorporated herein by reference.

BACKGROUND OF THE DISCLOSURE

Technical Field

The present disclosure relates to an artificial neural network, and more particularly, to a memory controller, a processor and a system for an artificial neural network for an artificial neural network.

Background Art

As artificial intelligence inference ability is developed, various inference services such as sound recognition, voice recognition, image recognition, object detection, driver drowsiness detection, dangerous moment detection, and gesture detection are mounted in various electronic devices. Electronic devices having inference services may include devices such as artificial intelligence (AI) speakers, smart phones, smart refrigerators, VR devices, AR devices, artificial intelligence (AI) CCTVs, artificial intelligence (AI) robot cleaners, tablets, notebook computers, autonomous vehicles, bipedal robots, quadrupedal robots, and industrial robots.

Recently, as the deep learning technique is developed, performance of an artificial neural network inference service by big-data-based learning is developed. The learning and inference services of the artificial neural network repeatedly train the artificial neural network with a vast amount of learning data and infer various and complex data by means of the trained artificial neural network model. Accordingly, various services are provided to the above-mentioned electronic devices by utilizing the artificial neural network technique.

However, the function and accuracy required for the inference service which utilizes the artificial neural network are gradually being increased. Accordingly, a size of the artificial neural network model, a computational amount, and a size of learning data are exponentially increased. The performance required for the processor and the memory, which are capable of handling the inference operation of the artificial neural network model, is gradually increased. Also, an artificial neural network inference service is actively provided to a cloud computing-based server which easily handles the big data.

In the meantime, edge computing which utilizes the artificial neural network model technique is actively being studied. Edge computing refers to an edge or a peripheral portion where the computing is performed. Thus, edge computing refers to a terminal which directly produces data or to various electronic devices located to be adjacent to the terminal and may be referred to as an edge device. An edge device may be utilized to immediately and reliably perform necessary tasks such as those of autonomous drones, autonomous robots, or autonomous vehicles which need to process a vast amount of data within 1/100th of a second. Accordingly, edge devices are applicable to fields which are rapidly increasing in number.

SUMMARY OF THE DISCLOSURE

The inventor of the present disclosure has recognized that operation of a conventional artificial neural network model had problems, such as high-power consumption, heating, and a bottleneck phenomenon of a processor operation, due to a relatively low memory bandwidth and a memory latency. Accordingly, the inventor has further recognized that there were various difficulties to improve the operation processing performance of the artificial neural network model and that an artificial neural network memory system which is capable of improving the problems needed to be developed.

Therefore, the inventor of the present disclosure studied an artificial neural network (ANN) memory system which is applicable to a server system and/or edge computing. Moreover, the inventor of the present disclosure also studied a neural processing unit (NPU) which is a processor of an ANN memory system optimized for processing an artificial neural network (ANN) model.

First, the inventor of the present disclosure has recognized that in order to improve the computational processing speed of the artificial neural network, the key point was to effectively control the memory during the computation of the artificial neural network model. The inventor of the present disclosure has recognized that when the artificial neural network model is trained or inferred, if the memory is not appropriately controlled, necessary data is not prepared in advance so that reduction in the memory effective bandwidth and/or delay of the data supply of the memory may frequently occur. Further, the inventor of the present disclosure has recognized that, in this case, a starvation or idle state in which the processor is not supplied with data to be processed is caused so that an actual operation cannot be performed, which results in the degradation of the operation performance.

Second, the inventor of the present disclosure has recognized a limitation of the operation processing method of the artificial neural network model at an algorithm level of a known art. For example, a known prefetch algorithm is a technique which analyzes the artificial neural network models in a conceptual layer unit so that the processor reads data from the memory in each layer unit. However, the prefetch algorithm cannot recognize an artificial neural network data locality in the word unit or a memory access request unit of the artificial neural network model existing at a processor-memory level, that is, a hardware level. The inventor of the present disclosure has recognized that it is difficult to optimize the data transmitting/receiving operation at the processor-memory level only by the prefetch technique.

Third, the inventor of the present disclosure has recognized an "artificial neural network data locality" which is a unique characteristic of the artificial neural network model. The inventor of the present disclosure has recognized that there is an artificial neural network data locality in the word unit or the memory access request unit at the processor-memory level and that the effective memory bandwidth is maximized and the latency of the data supplying to the processor is minimized by utilizing the artificial neural network data locality to improve the artificial neural network learning/inference operation processing performance of the processor.

Specifically, the "artificial neural network data locality" of the artificial neural network model recognized by the inventor of the present disclosure refers to sequence information of the word unit of data required to computationally process the artificial neural network by a processor which is performed in accordance with the structure of the artificial neural network model and the operation algorithm when the processor processes a specific artificial neural network model. Moreover, the inventor of the present disclosure has recognized that in the operation processing sequence of the artificial neural network model, an artificial neural network data locality is maintained for the operation of the iterative learning and/or inference for the artificial neural network model given to the processor. Accordingly, the inventor of the present disclosure has recognized that when the artificial neural network data locality is maintained, the processing sequence of the data required for the artificial neural network operation processed by the processor is maintained in the word unit and the information is provided or analyzed to be utilized for the artificial neural network operation. In other words, the word unit of the processor may refer to an element unit which is a basic unit to be processed by the processor. For example, when a neural processing unit processes the multiplication of N-bit input data and M-bit kernel weight, an input data word unit of the processor may be N bits and a word unit of the weight data may be M bits. Further, the inventor of the present disclosure has recognized that the word unit of the processor may be set to be different depending on a layer, a feature map, a kernel, an activation function, and the like of the artificial neural network model, respectively. Accordingly, the inventor of the present disclosure also has recognized that a precise memory control technique is necessary for the operation in the word unit.

The inventor of the present disclosure noticed that, when the artificial neural network model is compiled by a compiler to be executed in a specific processor, the artificial neural network data locality is constructed. Further, the inventor has recognized that the artificial neural network data locality may be constructed in accordance with an operation characteristic of the algorithms applied to the compiler and the artificial neural network model, and the architecture of the processor. In addition, the inventor of the present disclosure has recognized that, even in the same artificial neural network model, the artificial neural network data locality of the artificial neural network model to be processed may be constructed in various forms depending on a computing method of the artificial neural network model of the processor, for example, feature map tiling, the stationary technique of a processing element, the number of processing elements of a processor, a feature map in the processor, a cache memory capacity such as a weight, a memory layered structure in the processor, or an algorithm characteristic of a compiler which determines a sequence of a computational operation of the processor to compute the artificial neural network model. This is because even though the same artificial neural network model is computed, the processor may determine the sequence of data necessary at every moment in the clock unit to be different due to the above-mentioned factors. That is, the inventor of the present disclosure has recognized that the sequence of the data necessary for the computation of the artificial neural network model is conceptually the computational sequence of the layers of the artificial neural network, unit convolution, and/or matrix multiplication. Moreover, the inventor of the present disclosure has recognized that in the sequence of data required for physical computation, the artificial neural network data locality of the artificial neural network model is constructed in the word unit at a processor-memory level, that is, a hardware level. Further, the inventor of the present disclosure has recognized that the artificial neural network data locality depends on a processor and a compiler used for the processor.

Fourth, the inventor of the present disclosure has recognized that when an artificial neural network memory system constructed to be supplied with the artificial neural network data locality information to utilize the artificial neural network data locality is provided, the processing performance of the artificial neural network model may be maximized at the processor-memory level.

The inventor of the present disclosure has recognized that when the artificial neural network memory system precisely figures out the word unit of the artificial neural network data locality of the artificial neural network model, the processor also finds operation processing sequence information of the word unit which is a minimum unit by which the processor processes the artificial neural network model. That is, the inventor of the present disclosure has recognized that when the artificial neural network memory system which utilizes the artificial neural network data locality is provided, the artificial neural network memory system may precisely predict whether to read specific data from the memory at a specific timing to provide the specific data to the processor or whether the specific data is to be computed by the processor to store the specific data in the memory at a specific timing, in the word unit. Accordingly, the inventor of the present disclosure has recognized that the artificial neural network system is provided to prepare data to be requested by the processor in the word unit in advance.

In other words, the inventor of the present disclosure has recognized that, if the artificial neural network memory system knows the artificial neural network data locality, when the processor calculates a convolution of the specific input data and a specific kernel using a technique such as feature map tiling, the operation processing sequence of the convolution which is processed while the kernel moves in a specific direction is also known in the word unit.

That is, it was recognized that the artificial neural network memory system predicts which data will be necessary for the processor by utilizing the artificial neural network data locality, so that a memory read/write operation to be requested by the processor is predicted and data to be processed by the processor is prepared in advance to minimize or eliminate the memory effective bandwidth increase and/or the data supply latency of the memory. Further, the inventor has recognized that when the artificial neural network memory system supplies data to be processed by the processor at a necessary timing, the starvation or idle state of the processor may be minimized. Accordingly, the inventor of the present disclosure has recognized that the operation processing performance may be improved and the power consumption may be reduced by the artificial neural network memory system.

Fifth, the inventor of the present disclosure has recognized that, even though an artificial neural network memory controller may not be provided with artificial neural network data locality information, after disposing the artificial neural network memory controller in a communication channel between a processor which is processing the artificial neural network model and the memory, when the processor processes the operation of the specific artificial neural network model, a data access request to the memory is analyzed to infer the artificial neural network data locality of the artificial neural network model which is being processed by the processor in the data access request unit between the processor and the memory. That is, the inventor of the present disclosure has recognized that each artificial neural network model has a unique artificial neural network data locality, so that the processor generates the data access request in a specific sequence according to the artificial neural network data locality at the processor-memory level. Further, the inventor of the present disclosure has recognized that the access queue of data stored in the memory for data request between the processor and the memory is based on the artificial neural network data locality being maintained while the processor iteratively processes the learning/inference operation of the artificial neural network model.

Therefore, the inventor of the present disclosure disposed the artificial neural network memory controller in a communication channel of the processor which was operating the artificial neural network model and the memory. Further, the inventor observed the data access request between the processor and the memory for one or more learning and inference operations to recognize that the artificial neural network memory controller may infer the artificial neural network data locality in the data access request unit. Accordingly, the inventor of the present disclosure has recognized that, even if the artificial neural network data locality information is not provided, the artificial neural network data locality may be inferred by the artificial neural network memory controller.

Therefore, the inventor of the present disclosure has recognized that the memory read/write operation to be requested by the processor based on the artificial neural network data locality which is reconstructed in the data access request unit can be predicted and that the memory effective bandwidth increase and/or the memory data supply latency may be minimized or substantially eliminated by preparing data to be processed by the processor in advance. Further, the inventor of the present disclosure has recognized that, when the artificial neural network memory system supplies data to be processed by the processor at a necessary timing, the starvation or idle state occurrence rate of the processor may be minimized.

Accordingly, an object to be achieved by the present disclosure is to provide an artificial neural network (ANN) memory system which optimizes an artificial neural network operation of a processor by utilizing an artificial neural network (ANN) data locality of an artificial neural network (ANN) model which operates at a processor-memory level.

Accordingly, the problem to be solved by the present disclosure is to provide an artificial neural network memory system including an artificial neural network memory controller capable of decreasing the latency of memory by preparing in advance a data access request that will be requested by a processor by (1) analyzing a plurality of data access requests generated by the processor and (2) generating the data locality pattern of the artificial neural network model being processed by the processor. However, the present disclosure is not limited thereto, and other problems will be clearly understood by those skilled in the art from the following description.

According to an example of the present disclosure, a system is provided. A system may include a main memory including a dynamic memory cell electrically coupled to a bitline and a word line, and a memory controller configured to selectively omit a restore operation during a read operation of the dynamic memory cell.

The dynamic memory cell may be configured to operate in a sequence of precharge, access, sense, and restore, or precharge, access, and sense.

The main memory may be configured to selectively omit a restoration operation during a read operation of the dynamic memory cell by controlling a voltage applied to the word line.

The memory controller may be configured to determine whether to perform the restoration operation by determining whether data stored in the dynamic memory cell is reused.

The memory controller may be configured to determine whether data stored in the dynamic memory cell is reused based on an artificial neural network data locality.

A latency of the read operation of the main memory may be relatively shorter when the restore operation is omitted than when the restore operation is not omitted.

The memory controller may be configured to determine that an output feature map data is not reused during the read operation after storing the output feature map data of an artificial neural network model in the dynamic memory cell.

The omission of the restore operation may be configured to substantially reduce a charging time of the dynamic memory cell such that data stored in the dynamic memory cell is lost.

According to an example of the present disclosure, a memory is provided. A memory may include at least one dynamic memory cell, configured to perform a read-discard operation from a memory controller to selectively omit a restore operation during a read operation, electrically connected to a bitline and a word line.

The at least one dynamic memory cell may be configured to include a first area configured to store data corresponding to the read-discard operation.

The at least one dynamic memory cell may be configured to include a first area configured to store feature map data corresponding to the read-discard operation based on an artificial neural network data locality.

Data corresponding to the read-discard operation may be a feature map data of the artificial neural network model.

An area corresponding to the read-discard operation of the at least one dynamic memory cell may be set in a unit of the word line.

A refresh operation of the word line corresponding to the read-discard operation may be inactivated until the write operation.

According to an example of the present disclosure, a system is provided. A system may include at least one memory cell array having N columns and M rows, and a memory controller configured to operate at least a portion of a read operation commanded to the at least one memory cell array as a read-discard operation based on sequential access information.

The sequential access information may include at least a repeating pattern of an input feature map, a kernel, and an output feature map order.

The sequential access information may include at least a repeating pattern of a kernel, an input feature map, and an output feature map order.

The read-discard operation may be configured to be commanded when stored data is an output feature map and the stored data is read.

The memory controller may include a cache memory. The memory controller may be configured to store data of at least one upcoming operation step that will be requested by a processor from the at least one memory cell array to the cache memory based on the current operation step.

The sequential access information may include information on a predetermined operation sequence of an artificial neural network to be processed by a processor.

The system may include a processor configured to provide an artificial neural network data locality information to the memory controller.

According to the examples of the present disclosure, in the system which processes the artificial neural network, the delay of the data supply of the memory to the processor may be substantially removed or reduced by the artificial neural network data locality.

According to the examples of the present disclosure, the artificial neural network memory controller may prepare data of the artificial neural network model which is processed at a processor-memory level before being requested by the processor.

According to the examples of the present disclosure, the learning and inference operation processing time of the artificial neural network model which is processed by the processor is shortened, to improve the operation processing performance of the processor and to improve the power efficiency for the operation processing at the system level.

The effects according to the present disclosure are not limited to the contents exemplified above, and more various effects are included in the present specification.

BRIEF DESCRIPTION OF THE DRAWINGS

FIG. 1A is a schematic block diagram of an artificial neural network memory system according to an example of the present disclosure.

FIG. 1B is a schematic diagram illustrating an exemplary neural processing unit for explaining reconstruction of an artificial neural network data locality pattern which is applicable to various examples of the present disclosure.

FIG. 2 is a diagram for explaining an artificial neural network data locality pattern according to an example of the present disclosure.

FIG. 5 is a diagram for explaining a token and identification information corresponding to the artificial neural network data locality pattern of FIG. 4.

FIG. 6 is a diagram for explaining a predicted data access request and an actual data access request generated based on an artificial neural network data locality pattern by an artificial neural network memory controller according to an example of the present disclosure.

FIG. 12 is a diagram of exemplary identification information of a data access request.

FIG. 19 is a table exemplarily showing the amount of computation and data size for 16 layers.

FIG. 20 is a table exemplarily showing the amount of computation and data size for 28 layers.

FIG. 21 is a table showing a first example of accessing a memory according to sequence information in artificial neural network data locality (ANN DL) information.

FIG. 22 is an exemplary table showing the table of FIG. 21 in a simplified manner.

FIG. 24 is a table showing a second example of accessing a memory according to sequence information in ANN DL information.

FIG. 26 is a table showing a third example of accessing a memory according to sequence information in ANN DL information.

FIG. 43 is a table showing an example of accessing a memory according to sequence information in ANN DL information.

FIGS. 53A and 53B are exemplary diagrams showing examples of convolution.

DETAILED DESCRIPTION OF THE EMBODIMENT

Figure 3:
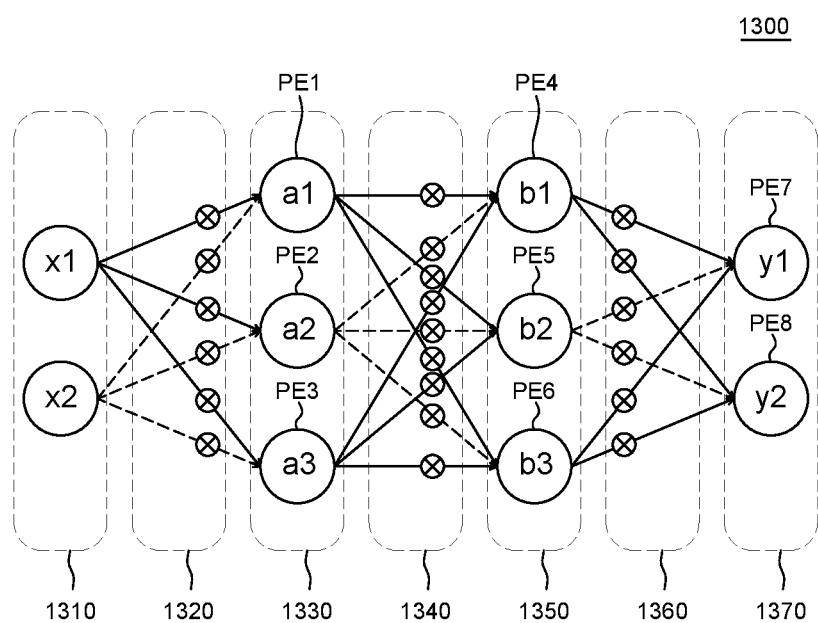
FIG. 3 is a schematic diagram illustrating an exemplary artificial neural network model for explaining an artificial neural network data locality pattern which is applicable to various examples of the present disclosure.

Advantages and characteristics of the present disclosure and a method of achieving the advantages and characteristics will be clear by referring to various examples described below in detail together with the accompanying drawings. However, the present invention is not limited to an example disclosed herein but will be implemented in various forms. The examples are provided to enable the present invention to be completely disclosed and the scope of the present invention to be easily understood by those skilled in the art. Therefore, the present invention will be defined only by the scope of the appended claims.

Detailed description of the present disclosure may be described with reference to the drawings for the convenience of description with specific example by which the present disclosure can be carried out as an example. Although components of various examples of the present disclosure are different from each other, manufacturing methods, operating methods, algorithms, shapes, processes, structures, and characteristics described in a specific example may be combined with or included in other embodiments. Further, it should be understood that a position or a placement of an individual constituent element in each disclosed example may be changed without departing from the spirit and the scope of the present disclosure. The features of various embodiments of the present disclosure can be partially or entirely bonded to or combined with each other and can be interlocked and operated in technically various ways which are understandable by those skilled in the art, and the embodiments can be carried out independently of or in association with each other.

The shapes, sizes, ratios, angles, numbers, and the like illustrated in the accompanying drawings for describing the examples of the present disclosure are merely examples, and the present disclosure is not limited thereto. Like reference numerals indicate like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise. Components are interpreted to include an ordinary error range even if not expressly stated. When the position relation between two parts is described using the terms such as "on," "above," "below," "next to," or "adjacent to," one component may be positioned between the two components unless the terms are used with the term "immediately" or "directly." When an element or layer is disposed "on" another element or layer, another layer or another element may be interposed directly on the other element or therebetween.

FIG. 1A illustrates an artificial neural network memory system 100 based on an artificial neural network data locality according to an example of the present disclosure.

Referring to FIG. 1A, the artificial neural network memory system 100 may be configured to include at least one processor 110 and at least one artificial neural network memory controller 120. That is, at least one processor 110 according to the examples of the present disclosure is provided, and a plurality of processors may be utilized. Meanwhile, at least one artificial neural network memory controller 120 according to the examples of the present disclosure is provided, and a plurality of artificial neural network memory controllers may be utilized.

Hereinafter, for the convenience of description, when the at least one processor 110 includes just one processor, it may be referred to as a processor 110.

Hereinafter, for the convenience of description, when the at least one artificial neural network memory controller 120 includes just one artificial neural network memory controller 120, it may be referred to as an artificial neural network memory controller 120.

The processor 110 is configured to process an artificial neural network model. For example, the processor 110 processes inference of an artificial neural network model which is trained to perform a specific inference function to provide an inference result of the artificial neural network model in accordance with the input data. For example, the processor 110 processes the learning of the artificial neural network model for performing a specific inference function to provide a trained artificial neural network model. The specific inference function may include various inference functions which may be inferred by the artificial neural network, such as object recognition, voice recognition, and image processing.

The processor 110 may be configured to include at least one of a central processing unit (CPU), a graphic processing unit (GPU), an application processor (AP), a digital signal processing device (DSP), an arithmetic and logic unit (ALU), and an artificial neural processing unit (NPU). However, the processor 110 of the present disclosure is not limited to the above-described processors.

The processor 110 may be configured to communicate with the artificial neural network memory controller 120. The processor 110 may be configured to generate a data access request. The data access request may be transmitted to the artificial neural network memory controller 120. Here, the data access request may refer to a request to access data required by the processor 110 to process the inference or the learning of the artificial neural network model.

The processor 110 may transmit a data access request to the artificial neural network memory controller 120 to be supplied with data required for the inference or the learning of the artificial neural network model from the artificial neural network memory controller 120 or provide the inference or the learning result of the artificial neural network processed by the processor 110 to the artificial neural network memory controller 120.

The processor 110 may provide the inference result or learning result obtained by processing a specific artificial neural network model. At this time, the processor 110 may be configured to process the operations of the artificial neural network for inference or learning in a specific sequence.

The reason why the processor 110 needs to process the operations of the artificial neural network in a specific sequence is that each artificial neural network model is configured to have a unique artificial neural network structure. That is, each artificial neural network model is configured to have a unique artificial neural network data locality in accordance with the unique artificial neural network structure. Moreover, an operation sequence of the artificial neural network model which is processed by the processor 110 is determined in accordance with the unique artificial neural network data locality.

In other words, the artificial neural network data locality may be configured when the artificial neural network model is compiled by a complier to be executed in a specific processor. The artificial neural network data locality may be configured in accordance with algorithms applied to the complier and the artificial neural network model and an operation characteristic of the processor.

The artificial neural network model to be processed by the processor 110 may be compiled by the processor 110 and a compiler which may consider an algorithm characteristic of the artificial neural network model. That is, when the driving characteristic of the processor 110 is known with the knowledge of the structure and algorithm information of the artificial neural network model, the compiler may be configured to supply the artificial neural network data locality information in the order of the word unit to the artificial neural network memory controller 120.

For example, a weight value of a specific layer of a specific artificial neural network model of an algorithm level of a known art may be calculated in the layer unit. However, the weight value of the specific layer of the specific artificial neural network model of the processor-memory level according to the examples of the present disclosure may be calculated in the word unit scheduled to be processed by the processor 110.

For example, when a size of the cache memory of the processor 110 is smaller than a data size of weights of a specific layer of an artificial neural network model to be processed, the processor 110 may be compiled so as not to process all the weight values of the specific layer at one time.

That is, when the processor 110 calculates the weight values of the specific layer and node values, a cache memory space in which result values are stored may be insufficient due to the weight value which is too large. In this case, a data access request generated by the processor 110 may be increased to a plurality of data access requests. Accordingly, the processor 110 may be configured to process the increased data access requests in a specific order. In this case, the operation sequence of the algorithm level and the operation order in accordance with the artificial neural network data locality of the processor-memory level may be different from each other.

That is, the artificial neural network operation sequence at the algorithm level may be reconstructed by the artificial neural network data locality of the processor-memory level by considering hardware characteristics of the processor and the memory to process the corresponding artificial neural network model.

The artificial neural network data locality of the artificial neural network model existing at the processor-memory level may be defined as information which predicts an operation order of the artificial neural network model to be processed by the processor 110 at the processor-memory level based on a data access request order which is requested to the memory by the processor 110.

In other words, even in the same artificial neural network model, the artificial neural network data locality of the artificial neural network model may be diversely configured in accordance with an operation function of the processor 110, such as a feature map tiling technique or a stationary technique of the processing element, a cache memory capacity such as the number of processing elements of the processor 110, a feature map in the processor 110, and a weight, a memory layered structure in the processor 110, and an algorithm characteristic of a compiler which determines a sequence of the calculating operation of the processor 110 to calculate the artificial neural network model.

For example, the feature map tiling technique is an artificial neural network technique which divides a convolution, and as a convolutional area is divided, the feature map is divided to be calculated. Accordingly, even the same artificial neural network model may have different artificial neural network data localities due to the tiling convolution.

For example, the stationary technique is a technique which controls a driving method of processing elements PE in the neural processing unit. According to the stationary technique, a data type to be processed, for example, one of an input feature map, a weight, and an output feature map, is fixed to the processing element to be reused. Accordingly, a type of data or sequence which is requested to the memory by the processor 110 may vary.

That is, even in the same artificial neural network model, the artificial neural network data locality may be reconstructed in accordance with various algorithms and/or techniques. Accordingly, the artificial neural network data locality may be entirely or partially reconstructed by various conditions, such as a processor, a compiler, or a memory.

FIG. 1B illustrates an example of an exemplary neural processing unit for explaining reconstruction of an artificial neural network data locality pattern which is applicable to various examples of the present disclosure.

Referring to FIG. 1B, exemplary stationary techniques applicable when the processor 110 is a neural processing unit NPU are illustrated.

A plurality of processing elements may be included in the NPU. The processing elements PE may be configured in the form of an array and each processing element may be configured to include a multiplier (×) and an adder (+). The processing elements PE may be connected to a buffer memory or a cache memory, for example, a global buffer. The processing elements PE may fix one data of an input feature map pixel (Ifmap pixel: I), a filter weight W, and a partial sum (Psum: P) to a register of the processing elements PE. The remaining data may be supplied as input data of the processing elements PE. When the accumulation of the partial sums P is completed, it may become an output feature map pixel. However, the plurality of processing elements may be implemented in an individual driving form instead of in an array form.

A weight stationary (WS) technique is shown in view (a) of FIG. 1B. According to the WS technique, filter weights W0 to W7 are fixed to respective register files of the processing elements PE, and input feature map pixels I input to the processing elements PE in parallel move from a zeroth input feature map pixel 10 to an eighth input feature map pixel 18 to perform the operation. Partial sums P0 to P8 may be accumulated in the processing elements PE which are connected in series. The partial sums P0 to P8 may sequentially move to a subsequent processing element. All multiplication and accumulation (MAC) operations which use the fixed filter weights W0 to W7 need to be mapped to the same processing elements PE for serial processing.

According to the above-described configuration, during the convolutional operation of the filter weight W in the register file, the reuse of the filter weight W is maximized to minimize the access energy consumption of the filter weight W.

It should be noted that as the WS technique is applied to the artificial neural network model in a compile step, the artificial neural network data locality of the artificial neural network model is reconstructed to be optimized for the WS technique at the processor-memory level. For example, according to the WS technique, for the purpose of the efficiency of the operation, the filter weights W0 to W7 may be preferentially stored in the processing elements PE. Accordingly, the artificial neural network data locality may be reconstructed in the order of the filter weight W, the input feature map pixel I, and the partial sum P so that the data access request sequence generated by the processor 110 may be determined in accordance with the reconstructed artificial neural network data locality.

An output stationary (OS) technique is shown in view (b) of FIG. 1B. According to the OS technique, the partial sums P0 to P7 are fixed to the respective register files of the processing elements PE to be accumulated and the filter weight W which is input to the processing elements PE in parallel moves from the zeroth input filter weight W0 to the seventh filter weight W7 to perform the operation. The input feature map pixels 10 to 17 may move to the processing elements PE connected in series. Each partial sum P0 to P7 needs to be fixed to each processing element PE to be mapped to perform the multiplication and accumulation (MAC) operation.

According to the above-described configuration, during the convolutional operation of the filter weight W in the processing elements PE, the partial sum P is fixed to the register file of the processing elements PE to maximize the reuse of the partial sum P and minimize the energy consumption in accordance with the movement of the partial sum P. When the accumulation of the fixed partial sums P is completed, it may become an output feature map.

It should be noted that as the processor 110 applies the output stationary OS technique, the artificial neural network data locality of the artificial neural network model is reconstructed to be optimized for the output stationary OS technique at the processor-memory level. For example, according to the output stationary OS technique, for the purpose of the efficiency of the operation, the partial sums P0 to P7 are preferentially stored in the processing elements PE. Accordingly, the artificial neural network data locality may be reconstructed in the order of the partial sum P, the filter weight W, and the input feature map pixel I, so that the data access request sequence generated by the processor 110 may be determined in accordance with the reconstructed artificial neural network data locality. The artificial neural network model compiler receives hardware characteristic information of the processor 110 and the memory to be converted into a code in which the artificial neural network model operates at the processor-memory level. At this time, the artificial neural network model is converted into a code which is executed by the processor so that the artificial neural network model may be converted into a low-level code.

That is, according to the above-described factors, even though the same artificial neural network model is processed, the processor 110 may change an order of data required at every moment in the clock unit. Accordingly, the artificial neural network data locality of the artificial neural network model may be configured to be different at the hardware level.

However, when the configuration of the artificial neural network data locality is completed, the operation order of the processor 110 and a data processing order required for the operation may be accurately repeated at every learning operation or inference operation of the corresponding artificial neural network model.

Hereinafter, the above-described artificial neural network memory system 100 according to the example of the present disclosure may be configured to predict next data to be requested by the processor 110 based on an accurate operation order provided by the artificial neural network data locality to improve a memory latency problem and a memory bandwidth problem, thereby improving the operation processing performance of the artificial neural network and reducing the power consumption.

The artificial neural network memory controller 120 according to the example of the present disclosure is configured to be provided with the artificial neural network data locality information of the artificial neural network model to be processed by the processor 110 or configured to analyze the artificial neural network data locality of the artificial neural network model which is being processed by the processor 110.

The artificial neural network memory controller 120 may be configured to receive the data access request generated by the processor 110.

The artificial neural network memory controller 120 may be configured to monitor or record the data access request received from the processor 110. The artificial neural network memory controller 120 observes the data access requests output by the processor 110 which is processing the artificial neural network model to precisely predict the data access queue which will be requested later. One data access request may be configured to include at least one word unit data.

The artificial neural network memory controller 120 may be configured to sequentially record or monitor the data access request received from the processor 110.

The data access requests which are recorded by the artificial neural network memory controller 120 may be stored in various forms such as a log file, a table, or a list. However, the artificial neural network memory controller 120 according to the example of the present disclosure is not limited to the recorded type or formant of the data access request.

The data access requests which are monitored by the artificial neural network memory controller 120 may be stored in an arbitrary memory in the artificial neural network memory controller 120. However, the artificial neural network memory controller 120 according to the example of the present disclosure is not limited to the monitoring method of the data access request.

The artificial neural network memory controller 120 may be configured to further include an arbitrary memory for recording or monitoring the data access request. However, the artificial neural network memory controller 120 according to the example of the present disclosure is not limited thereto and may be configured to communicate with an external memory.

The artificial neural network memory controller 120 may be configured to monitor or record the data access request received from the processor 110 to analyze the data access requests.

That is, the artificial neural network memory controller 120 may be configured to analyze the received data access requests to analyze the artificial neural network data locality of the artificial neural network model which is being processed by the processor 110.

That is, the artificial neural network memory controller 120 may be configured to analyze the artificial neural network data locality of the artificial neural network model which is compiled to operate at the processor-memory level.

That is, the artificial neural network memory controller 120 may be configured to analyze the operation processing order of the artificial neural network in the unit of memory access requests generated by the processor, based on the artificial neural network data locality of the artificial neural network model at the processor-memory level to analyze the artificial neural network data locality of the artificial neural network model.

According to the above-described configuration, the artificial neural network memory controller 120 may analyze the artificial neural network data locality reconstructed at the processor-memory level.

In some examples, the compiler may be configured to analyze the artificial neural network data locality of the artificial neural network model in the word unit.

In some examples, at least one artificial neural network memory controller may be configured to be provided with the artificial neural network data locality, which is analyzed by the compiler, in the word unit. Here, the word unit may vary to 8 bits, 16 bits, 32 bits, 64 bits, or the like in accordance with the word unit of the processor 110. Here, the word unit may be set to different word units, such as 2 bits, 3 bits, or 5 bits, in accordance with a quantization algorithm of the kernel, the feature map, or the like of the compiled artificial neural network model.

The artificial neural network memory controller 120 may be configured to include a special function register. The special function register may be configured to store the artificial neural network data locality information.

The artificial neural network memory controller 120 may be configured to operate in different modes depending on whether the artificial neural network data locality information is stored.

If the artificial neural network memory controller 120 stores the artificial neural network data locality information, the artificial neural network memory controller 120 may predict the data processing sequence of the artificial neural network model to be processed by the processor 110 in the word unit order in advance so that the artificial neural network memory controller 120 may be configured so as not to record a separate data access request. However, it is not limited thereto, and the artificial neural network memory controller 120 may be configured to verify whether an error exists in the stored artificial neural network data locality while comparing the stored artificial neural network data locality information and the data access request generated by the processor.

If the artificial neural network memory controller 120 is not provided with the artificial neural network data locality information, the artificial neural network memory controller 120 may be configured to observe the data access request generated by the processor 110 to operate in a mode in which the artificial neural network data locality of the artificial neural network model processed by the processor 110 is predicted.

In some examples, the artificial neural network memory system may be configured to include a processor, a memory, and a cache memory and generate, in advance, a predicted data access request including data to be requested by the processor based on the artificial neural network data locality information. The predicted data access request may be referred to as a data access request predicted based on the ANN DL, or a data access request to be requested. For convenience of description below, the predicted data access request may be referred to as a data access request prepared in advance. The artificial neural network memory system may be configured to store data corresponding to the predicted data access request from the memory in the cache memory before the request of the processor. At this time, the artificial neural network memory system may be configured to operate in any one mode of a first mode configured to operate by receiving the artificial neural network data locality information and a second mode configured to operate by observing data access requests generated by the processor to predict the artificial neural network data locality information. According to the above-described configuration, when the artificial neural network memory system is provided with the artificial neural network data locality information, the data to be requested by the processor is predicted and prepared in advance in the word unit. Further, even though the artificial neural network data locality information is not provided, the data access requests generated by the processor are monitored for a predetermined period to predict the artificial neural network data locality which is being processed by the processor in the data access request unit. Moreover, even though the artificial neural network data locality information is provided, the artificial neural network memory system independently monitors the data access request to reconstruct the artificial neural network data locality to verify the provided artificial neural network data locality. Accordingly, the change or the error of the artificial neural network model may be sensed.

In some examples, at least one artificial neural network memory controller and at least one processor may be configured to directly communicate with each other. According to the above-described configuration, the artificial neural network memory controller may directly receive the data access request from the processor so that a latency caused by a system bus between the processor and the artificial neural network memory controller may be eliminated. In other words, for the direct communication of the processor and the artificial neural network memory controller, a dedicated bus may be further included, or a dedicated communication channel may be further included, but present disclosure is not limited thereto.

In some examples, the artificial neural network data locality information may be configured to be selectively stored in the processor 110 and/or the artificial neural network memory controller 120. The artificial neural network data locality information may be configured to be stored in a special function register included in the processor 110 and/or the artificial neural network memory controller 120. However, it is not limited thereto, and the artificial neural network data locality information may be configured to be stored in an arbitrary memory or a register which is communicable with the artificial neural network memory system.

FIG. 2 illustrates an artificial neural network data locality pattern according to an example of the present disclosure. Hereinafter, an artificial neural network data locality and an artificial neural network data locality pattern of the artificial neural network model will be described with reference to FIG. 2.

The artificial neural network memory controller 120 is configured to record or monitor the data access request received from the processor 110 according to an order.

The artificial neural network memory controller 120 is configured to generate an artificial neural network data locality pattern including a data locality of the artificial neural network model which is being processed by the processor 110. That is, the artificial neural network memory controller 120 may be configured to analyze the data access requests associated with the artificial neural network model generated by the processor 110 to generate a repeated specific pattern. That is, when the data access request is observed, the artificial neural network data locality information may be stored as the artificial neural network data locality pattern.

Referring to FIG. 2, eighteen data access requests are sequentially recorded in the artificial neural network memory controller 120 as an example. Each data access request is configured to include identification information.

The identification information included in the data access request may be configured to include various information.

For example, the identification information may be configured to include at least a memory address value and an operation mode value.

For example, the memory address value may be configured to include memory address values corresponding to the requested data, but the present disclosure is not limited thereto.

For example, the memory address value may be configured to include a start value and an end value of the memory address corresponding to the requested data. According to the above-described configuration, it is considered that data is sequentially stored between the start value and the end value of the memory address. Therefore, a capacity for storing the memory address values may be reduced. That is, when the trigger value is activated, the memory can also operate in burst mode.

For example, the memory address value may be configured to include a start value of the memory address corresponding to the requested data and a data continuous read trigger value. According to the above-described configuration, data may be continuously read from the start value of the memory address until the continuous read trigger value changes. According to the above-described configuration, data may be continuously read so that the memory effective bandwidth may be increased.

For example, the memory address value may be configured to include a start value of the memory address corresponding to the requested data and information about the number of data. The unit of the number of data may be determined based on the unit of the memory capacity. For example, the unit may be one of one byte which is 8 bits, one word which is 4 bytes, and one block which is 1024 bytes, but the present disclosure is not limited thereto. According to the above-described configuration, the data may be continuously read from the start value of the memory address by as many as the number of data of the set unit size, so that the memory effective bandwidth may be increased.

For example, when the memory is a nonvolatile memory, the memory address value may further include a physical-logical address mapping table or flash translation layer information, but the present disclosure is not limited thereto.

For example, the operation mode may be configured to include a read mode and a write mode. Read and write operations may further include burst mode.

For example, the operation mode may be configured to further include overwrite, but the present disclosure is not limited thereto.

The artificial neural network memory controller 120 may be configured to determine whether the identification information of each of the data access requests is the same.

For example, the artificial neural network memory controller 120 may be configured to determine whether the memory address and the operation mode of each of the data access requests are the same. In other words, the artificial neural network memory controller 120 may be configured to detect a data access request value having the same memory address value and the same operation mode.

For example, when a memory address value and an operation mode of a first data access request are the same as a memory address value and an operation mode of a tenth data access request, the artificial neural network memory controller 120 is configured to generate an artificial neural network data locality pattern corresponding to the corresponding memory address value and operation mode.

The artificial neural network data locality pattern is configured to include data in which addresses of the memory of the data access requests are sequentially recorded.

That is, the artificial neural network memory controller 120 may be configured to detect a repeating cycle of the data access requests having the same memory address value and operation mode to generate an artificial neural network data locality pattern configured by the data access requests with repeated memory address value and operation mode.

That is, the artificial neural network memory controller 120 may be configured to generate the artificial neural network data locality pattern by detecting the repeated pattern of the memory address included in the data access request.

Referring to FIG. 2, when the artificial neural network memory controller 120 identifies that the memory address value and the operation mode of the first data access request are the same as the memory address value and the operation mode of the tenth data access request, the artificial neural network memory controller 120 may be configured to generate one artificial neural network data locality pattern from a starting data access request to a predicted data access request of the repeated data access request, among the same data access requests. In this case, the artificial neural network memory controller 120 may be configured to generate the artificial neural network data locality pattern including a first data access request to a ninth data access request.

That is, the artificial neural network data locality pattern described with reference to FIG. 2 may be configured to include the memory address values and the operation mode values in the order of the first data access request, a second data access request, a third data access request, a fourth data access request, a fifth data access request, a sixth data access request, a seventh data access request, an eighth data access request, and a ninth data access request.

The artificial neural network data locality pattern generated by the artificial neural network memory controller 120 may be stored in various forms such as a log file, a table, or a list. The artificial neural network memory controller 120 according to the example of the present disclosure is not limited to a recorded type or format of the artificial neural network data locality pattern.

The artificial neural network data locality pattern generated by the artificial neural network memory controller 120 may be stored in an arbitrary memory of the artificial neural network memory controller 120. The artificial neural network memory controller 120 according to the example of the present disclosure is not limited to a structure or a method of a memory which stores the artificial neural network data locality pattern.

The artificial neural network memory controller 120 may be configured to further include an arbitrary memory for storing the artificial neural network data locality pattern. However, the artificial neural network memory controller 120 according to the example of the present disclosure is not limited thereto and may be configured to communicate with an external memory.

That is, the artificial neural network memory system 100 according to the example of the present disclosure may be configured to include at least one processor 110 configured to generate a data access request corresponding to the artificial neural network operation and an artificial neural network memory controller 120 configured to sequentially record the data access request to generate an artificial neural network data locality pattern.

When the artificial neural network memory controller 120 generates an artificial neural network data locality pattern, the artificial neural network memory controller 120 may be configured to determine whether the memory address value and the operation mode value of the data access request received from the processor 110 match any one of the memory address values and the operation mode value included in the previously generated artificial neural network data locality pattern.

Referring to FIG. 2, when the artificial neural network memory controller 120 receives the tenth data access request from the processor 110, the artificial neural network memory controller 120 may be configured to determine whether the received data access request has the same memory address value as the memory address value included in the artificial neural network data locality pattern.

Referring to FIG. 2, when the artificial neural network memory controller 120 receives the tenth data access request, the artificial neural network memory controller 120 may be configured to detect that a start value [0] and an end value [0x1000000], which are the memory address values of the tenth data access request, are the same start and end memory address values of the first data access request, and may be configured to detect that a read mode value of an operation mode of the tenth data access request is the same as a read mode value of an operation mode of the first data access request. Thus, the artificial neural network memory controller 120 determines that the tenth data access request is the same as the first data access request and that the tenth data access request is an artificial neural network operation.

When the artificial neural network memory controller 120 receives an eleventh data access request, the artificial neural network memory controller 120 may be configured to detect that a start value [0x1100000] and an end value [0x1110000], which are the memory address values of the eleventh data access request, are the same start and end memory address values of the second data access request, and may be configured to detect that a write mode value of an operation mode of the eleventh data access request is the same as a write mode value of an operation mode of the second data access request. Thus, the artificial neural network memory controller 120 determine that the eleventh data access request is the same as the second data access request and that the eleventh data access request is an artificial neural network operation.

That is, the artificial neural network memory controller 120 may distinguish the start and the end of the artificial neural network data locality pattern. In addition, the artificial neural network memory controller 120 may prepare in advance for the start of the artificial neural network data locality pattern even if there is no special command after the end of the artificial neural network data locality pattern. Therefore, when the same operations are repeated, there is an effect that data can be prepared before the start of the next inference by predicting the start of the next inference based on the end of the current inference. Therefore, when the same artificial neural network data locality pattern is repeated, it is possible to prevent or reduce the delay time at the beginning and the end.

Referring to FIG. 2 again, the artificial neural network memory controller 120 does not generate the artificial neural network data locality pattern from the first data access request to the ninth data access request. In this case, the artificial neural network memory controller 120 is initialized or the processor 110 does not perform the artificial neural network operation. Accordingly, the artificial neural network memory controller 120 does not detect the matching of the pattern to the ninth data access request. The artificial neural network memory controller 120 may determine the identity of the first data access request at the time of the tenth data access request, generate the artificial neural network data locality pattern, and record whether the patterns match. The tenth to eighteenth data access requests are the same as the first to ninth data access requests, so that the artificial neural network memory controller 120 may determine that the patterns of the tenth data access request through the eighteenth data access request match the artificial neural network data locality pattern.

That is, the artificial neural network memory controller 120 may be configured to determine whether an operation which is being processed by the processor 110 is an artificial neural network operation by utilizing the artificial neural network data locality pattern. According to the above-described configuration, even though the artificial neural network memory controller 120 receives only the data access request including the memory address value and the operation mode value generated by the processor 110, the artificial neural network memory controller 120 may determine that the processor 110 is processing the artificial neural network operation. Accordingly, the artificial neural network memory controller 120 may determine whether the processor 110 is currently performing the artificial neural network operation based on the artificial neural network data locality pattern, without having separate additional identification information.

As it will be additionally described with reference to FIG. 2, each data access request may be configured to be stored as a token. For example, the data access request of each artificial neural network may be tokenized to be stored. For example, the data access request of each artificial neural network may be tokenized based on the identification information. For example, the data access request of each artificial neural network may be tokenized based on the memory address value. However, the examples of the present disclosure are not limited thereto, and the token may be referred to as a code, an identifier, or the like. For example, a token may be configured in a word unit, a data access request unit, or an ANN DL unit.

For example, the first data access request may be stored as a token [1]. The fourth data access request may be stored as a token [4]. The seventh data access request may be stored as a token [7]. For example, the artificial neural network data locality pattern may be stored as tokens [1-2-3-4-5-6-7-8-9]. For example, the tenth data access request has the same memory address value and the same operation mode value as the token [1] so that the tenth data access request may be stored as the token [1]. The thirteenth data access request has the same memory address value and the same operation mode value as the token [4] so that the thirteenth data access request may be stored as the token [4]. Accordingly, when the artificial neural network memory controller 120 detects the same token as the token of the artificial neural network data locality pattern, the artificial neural network memory controller may be configured to determine that the corresponding data access request is an artificial neural network operation.

According to the above-described configuration, the artificial neural network memory controller 120 may easily and quickly recognize and distinguish the data access request by utilizing the tokenized artificial neural network data locality pattern. Moreover, even when additional identification information and/or data is further added to the data access request, the artificial neural network memory controller uses the same token to utilize the token even when the additional information of the data access request is increased to easily and quickly recognize and distinguish the data access request.

In some examples, the artificial neural network data locality pattern stored in the artificial neural network memory controller may be eliminated or initialized. For example, when the artificial neural network data locality pattern is not utilized before a predetermined time is expired, for example, when the data access request matching the artificial neural network data locality pattern is not generated for a specific time, the artificial neural network memory controller determines that the utilizing frequency of the artificial neural network data locality pattern is low to eliminate or initialize the artificial neural network data locality pattern.

According to the above-described configuration, the availability of the storage space of the memory which stores the artificial neural network data locality pattern may be improved.

In some examples, the artificial neural network memory controller may be configured to store an updated pattern and a previous pattern of the artificial neural network data locality pattern to determine whether the artificial neural network model is changed. That is, when there is a plurality of artificial neural network models, the artificial neural network memory controller may be configured to further generate artificial neural network data locality patterns corresponding to the number of artificial neural network models.

For example, when a first artificial neural network data locality pattern is a token [1-2-3-4-5-6-7-8-9] and a second artificial neural network data locality pattern is a token [11-12-13-14-15-16-17-18], if the processor generates a data access request corresponding to the token [1], the artificial neural network memory controller may be configured to select the first artificial neural network data locality pattern. Alternatively, if the processor generates a data access request corresponding to the token [11], the artificial neural network memory controller may be configured to select the second artificial neural network data locality pattern.

According to the above-described configuration, the artificial neural network memory controller may store a plurality of artificial neural network data locality pattern and, when the artificial neural network model processed by the processor is changed to another artificial neural network model, may quickly apply a previously stored artificial neural network data locality pattern.

In some examples, the artificial neural network memory controller may be configured to determine whether the data access requests are requests of one artificial neural network model or are mixtures of the requests of the plurality of artificial neural network models. Further, the artificial neural network memory controller may be configured to predict the data access request corresponding to the artificial neural network data locality of each of the plurality of artificial neural network models.

For example, the processor may simultaneously process the plurality of artificial neural network models and, in this case, the data access request generated by the processor may be mixed data access requests corresponding to the plurality of artificial neural network models.

For example, when a first artificial neural network data locality pattern is a token [1-2-3-4-5-6-7-8-9] and a second artificial neural network data locality pattern is a token [11-12-13-14-15-16-17-18], the processor 110 may generate tokens corresponding to data access requests in the order of [1-11-2-3-12-13-14-4-5-6-15-16-7-8-9].

The artificial neural network memory controller knows each artificial neural network data locality pattern, so that even though the token [1] is generated and then the token [11] is generated, the artificial neural network memory controller may predict that the token [2] will be generated next. Therefore, the artificial neural network memory controller may generate, in advance, a predicted data access request corresponding to the token [2]. Further, even though the token [2] is generated after the token [11] is generated, the artificial neural network memory controller may predict that the token [12] will be generated next. Therefore, the artificial neural network memory controller may generate, in advance, a predicted data access request corresponding to the token [12].

According to the above-described configuration, the artificial neural network memory controller 120 predicts the data access requests to be generated by the processor 110 which processes the plurality of artificial neural network models, for every artificial neural network model, to predict and prepare the data to be requested by the processor 110.

In some examples, the artificial neural network memory controller may be configured to store a plurality of artificial neural network data locality patterns.

For example, when the processor processes two artificial neural network models, the artificial neural network memory controller may be configured to store the artificial neural network data locality pattern of each artificial neural network model.

According to the above-described configuration, when the operation of each artificial neural network model is processed, an actual data access request corresponding to each model may be predicted so that according to the example of the present disclosure, the processing speed of the artificial neural network operation may be improved.

In some examples, the artificial neural network memory controller may be configured to further include an artificial neural network model which is configured to machine-learn the artificial neural network data locality pattern.

According to the above-described configuration, the artificial neural network model of the artificial neural network memory controller may be configured to perform reinforcement learning on the data access request generated by the processor in real time. Further, the artificial neural network model of the artificial neural network memory controller may be a model trained by utilizing the artificial neural network data locality patterns of a known artificial neural network model as learning data. Accordingly, the artificial neural network memory controller may extract the artificial neural network data locality pattern from various artificial neural network models. Specifically, when various artificial neural network models are processed by requests of a plurality of users, like a server, this method may be effective.

As it will be additionally described with reference to FIG. 2, the artificial neural network memory controller 120 may be configured to monitor the artificial neural network model processed by the processor 110 dynamically and in real time and determine whether the artificial neural network model is changed.

For example, the artificial neural network memory controller 120 may be configured to statistically utilize a pattern matching frequency of the artificial neural network data locality pattern to determine the reliability of the artificial neural network data locality pattern. It may be configured such that, as the pattern matching frequency of the artificial neural network data locality pattern is increased, the reliability of the artificial neural network data locality pattern is increased and such that, as the pattern matching frequency of the artificial neural network data locality pattern is reduced, the reliability of the artificial neural network data locality pattern is reduced.

According to the above-described configuration, when the processor 110 repeatedly processes the specific artificial neural network model, the artificial neural network memory controller 120 may improve the prediction reliability of the artificial neural network data locality of the specific artificial neural network model.

FIG. 3 illustrates an exemplary artificial neural network model for explaining an artificial neural network data locality pattern which is applicable to various examples of the present disclosure.

An exemplary artificial neural network model 1300 which is being processed by the processor 110 as illustrated in FIG. 3 may be an arbitrary artificial neural network model which is trained to perform a specific inference function. For the convenience of description, an artificial neural network model in which all nodes are fully connected has been illustrated, but the present disclosure is not limited thereto.

Even though not illustrated in FIG. 3, an artificial neural network model applicable to the present disclosure may be a convolutional neural network (CNN) which is one of deep neural networks (DNN). An exemplary artificial neural network model may be a model such as a fully convolutional network (FCN) having VGG, VGG16, DenseNET, and an encoder-decoder structure, a deep neural network (DNN) such as SegNet, DeconvNet, DeepLAB V3+, or U-net, or SqueezeNet, Alexnet, ResNet18, MobileNet-v2, GoogLeNet, Resnet-v2, Resnet50, Resnet101, and Inception-v3, or an ensemble model based on at least two different models, but the artificial neural network model of the present disclosure is not limited thereto.

The above-described exemplary artificial neural network models may be configured to have an artificial neural network data locality.

Referring to FIG. 3 again, the artificial neural network data locality of the artificial neural network model processed by the processor 110 will be described in detail.

The exemplary artificial neural network model 1300 includes an input layer 1310, a first connection network 1320, a first hidden layer 1330, a second connection network 1340, a second hidden layer 1350, a third connection network 1360, and an output layer 1370.

The connection networks of the artificial neural network have corresponding weight values. A weight value of the connection network is multiplied with the input node value and an accumulated value of multiplied values is stored in the node of the corresponding output layer.

In other words, the connection network of the artificial neural network model 1300 is represented by lines, and weight is represented by a symbol O.

In other words, various activation functions to impart non-linearity to the accumulated value may be additionally provided. The activation function may be, for example, a sigmoid function, a hyperbolic tangent function, an ELU function, a Hard-Sigmoid function, a Swish function, a Hard-Swish function, a SELU function, a CELU function, a GELU function, a TANHSHRINK function, a SOFTPLUS function, a MISH function, a Piecewise Interpolation Approximation for Non-linear function, or an ReLU function, but the present disclosure is not limited thereto.

The input layer 1310 of the exemplary artificial neural network model 1300 includes input nodes x1 and x2.

The first connection network 1320 of the exemplary artificial neural network model 1300 includes connection networks having six weight values which connect nodes of the input layer 1310 and nodes of the first hidden layer 1330.

The first hidden layer 1330 of the exemplary artificial neural network model 1300 includes nodes a1, a2, and a3. Weight values of the first connection network 1320 are multiplied with a node value of the corresponding input layer 1310 and an accumulated value of the multiplied values is stored in the first hidden layer 1330.

The second connection network 1340 of the exemplary artificial neural network model 1300 includes connection networks having nine weight values which connect nodes of the first hidden layer 1330 and nodes of the second hidden layer 1350.

The second hidden layer 1350 of the exemplary artificial neural network model 1300 includes nodes b1, b2, and b3. The weight value of the second connection network 1340 is multiplied with the node value of the corresponding first hidden layer 1330 and the accumulated value of the multiplied values is stored in the second hidden layer 1350.

The third connection network 1360 of the exemplary artificial neural network model 1300 includes connection networks having six weight values which connect nodes of the second hidden layer 1350 and nodes of the output layer 1370.

The output layer 1370 of the exemplary artificial neural network model 1300 includes nodes y1 and y2. The weight value of the third connection network 1360 is multiplied with the input node value of the corresponding second hidden layer 1350 and the accumulated value of the multiplied values is stored in the output layer 1370.

According to the structure of the above-described artificial neural network model 1300, it is recognized that the operation for each layer needs to be sequentially performed. That is, there may be a problem in that, when the structure of the artificial neural network model is confirmed, the operation order for every layer needs to be determined, and when the operation is performed in a different order, the inference result may be inaccurate. The order of the operation or an order of the data flow in accordance with the structure of the artificial neural network model may be defined as an artificial neural network data locality.

In addition, for the convenience of description, in FIG. 2, even though the layer unit is described, the examples of the present disclosure are not limited to the layer unit. The processor 110 according to the examples of the present disclosure processes the data based on the artificial neural network data locality so that the processor may operate in the word unit or the data access request unit, rather than the layer unit. Here, the data size of the data access request may be smaller than or equal to the data size of the corresponding layer.

Referring to FIG. 3 again, for example, for the multiplication operation of the weight values of the first connection network 1320 and the node value of the input layer 1310, the processor 110 may generate the data access request in the layer unit.

However, the layer operation of the weight values of the first connection network 1320 and the node values of the input layer 1310 is not processed as one data access request, but may be processed as a plurality of divided sequential data access requests in accordance with the feature map division convolution of the processor 110, the stationary technique of the processing element, the number of processing elements of the processor, the cache memory capacity of the processor 110, a memory layered structure of the processor 110, and/or the compiler algorithm of the processor 110.

When a data access request to be requested by the processor 110 is divided into a plurality of data access requests, the order of requesting the divided data access requests may be determined by the artificial neural network data locality. At this time, the artificial neural network memory controller 120 may be configured to be provided with the artificial neural network data locality to be prepared, to provide data corresponding to an actual data access request to be requested by the processor 110. "An actual data access request" may be referred to as "a data access request that is generated by a processor after the predicted data access request." Alternatively, the artificial neural network memory controller 120 may be configured to predict the artificial neural network data locality to be prepared, in order to provide data corresponding to a subsequent data access request to be requested by the processor 110.

Data access requests, which are generated by the processor 110 during the artificial neural network operation of the artificial neural network model 1300 of FIG. 3, and an artificial neural network data locality will be described.

The processor 110 generates a first data access request to read input node values of the input layer 1310 of the artificial neural network model 1300. The first data access request includes a first memory address value and a read mode value. The first data access request may be stored as the token [1].

Next, the processor 110 generates a second data access request to read weight values of the first connection network 1320 of the artificial neural network model 1300. The second data access request includes a second memory address value and a read mode value. The second data access request may be stored as the token [2].

Next, the processor 110 generates a third data access request for storing the node values of the first hidden layer 1330 obtained by multiplying and accumulating the weight values of the first connection network 1320 of the artificial neural network model 1300 and the node values of the input layer 1310. The third data access request includes a third memory address value and a write mode value. The third data access request may be stored as the token [3].

Next, the processor 110 generates a fourth data access request to read node values stored in the first hidden layer 1330 of the artificial neural network model 1300. The fourth data access request includes a third memory address value and a read mode value. The fourth data access request may be stored as the token [4].

Next, the processor 110 generates a fifth data access request to read weight values of the second connection network 1340 of the artificial neural network model 1300. The fifth data access request includes a fifth memory address value and a write mode value. The fifth data access request may be stored as the token [5].

Next, the processor 110 generates a sixth data access request for storing the node values of the second hidden layer 1350 obtained by multiplying and accumulating the weight values of the second connection network 1340 of the artificial neural network model 1300 and the node values of the first hidden layer 1330. The sixth data access request includes a sixth memory address value and a write mode value. The sixth data access request may be stored as the token [6].

Next, the processor 110 generates a seventh data access request to read node values stored in the second hidden layer 1350 of the artificial neural network model 1300. The seventh data access request includes a sixth memory address value and a read mode value. The seventh data access request may be stored as the token [7].

Next, the processor 110 generates an eighth data access request to read weight values of the third connection network 1360 of the artificial neural network model 1300. The eighth data access request includes an eighth memory address value and a read mode value. The eighth data access request may be stored as the token [8].

Next, the processor 110 generates a ninth data access request for storing the node values of the output layer 1370 obtained by multiplying and accumulating the weight values of the third connection network 1360 of the artificial neural network model 1300 and the node values of the second hidden layer 1350. The ninth data access request includes a ninth memory address value and a write mode value. The ninth data access request may be stored as the token [9]. The node values may be a feature map, an activation map, or the like, but are not limited thereto. The weight values may be a kernel window, but are not limited thereto.

That is, the processor 110 needs to generate first to ninth data access requests for the inference of the exemplary artificial neural network model 1300. If the sequence of the data access request generated by the processor 110 is mixed, the artificial neural network data locality of the artificial neural network model 1300 is damaged so that an error may occur in the inference result of the artificial neural network model 1300 or the accuracy may be impaired. For example, the processor 110 may calculate the second layer first and then calculate the first layer. Accordingly, the processor 110 may be configured to sequentially generate the data access request based on the artificial neural network data locality. Therefore, it is assumed that the artificial neural network memory controller 120 may sequentially generate the data access request based on the artificial neural network data locality when the processor 110 operates the artificial neural network.

However, as described above, each data access request may be reinterpreted at the processor-memory level according to the hardware characteristic of the processor. In the above-described example, it has been described that the available capacity of the cache memory of the processor is sufficient and that the data size of the node value and the data size of the weight value are smaller than the available capacity of the cache memory. Accordingly, it is described that each layer is processed in one data access request unit. If the data size such as the weight value, the feature map, the kernel, the activation map, and the like of the artificial neural network model is larger than the available capacity of the cache memory of the processor, the corresponding data access request may be divided into a plurality of data access requests and in this case, the artificial neural network data locality of the artificial neural network model may be reconstructed.

The artificial neural network memory controller 120 according to the example of the present disclosure may generate the artificial neural network data locality pattern so that the artificial neural network memory controller may operate to correspond to the artificial neural network data locality of the artificial neural network model to be actively processed by the processor.

That is, even though the actual artificial neural network data locality of the artificial neural network model which is being processed by the processor 110 is not known, the artificial neural network memory controller 120 may actually analyze the artificial neural network data locality by analyzing the recorded data access request.

That is, even though structure information of the artificial neural network model which is being processed by the processor 110 is not provided, the artificial neural network memory controller 120 may actually analyze the artificial neural network data locality by analyzing the recorded data access request.

In some examples, the artificial neural network memory controller may be configured to be provided with an artificial neural network data locality pattern which is generated in advance at the processor-memory level.

Figure 4:
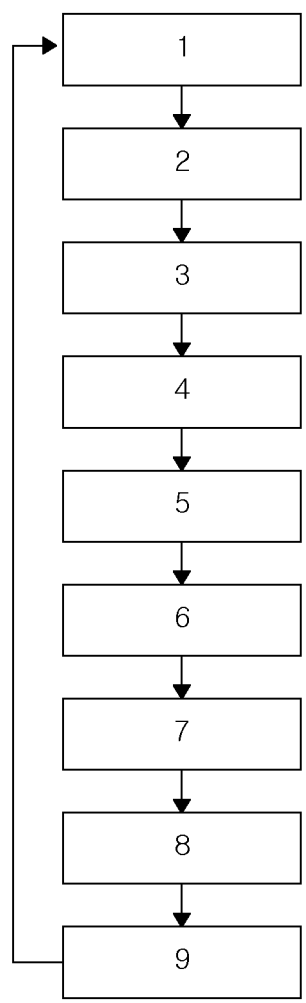
FIG. 4 is a schematic diagram for explaining an artificial neural network data locality pattern generated by analyzing the artificial neural network model of FIG. 3 by an artificial neural network memory controller according to an example of the present disclosure.

FIG. 4 illustrates an artificial neural network data locality pattern 1400 obtained by analyzing the artificial neural network model of FIG. 3 by an artificial neural network memory controller according to an example of the present disclosure. FIG. 5 illustrates a token and identification information 1500 corresponding to the artificial neural network data locality pattern of FIG. 4. That is, FIG. 5 illustrates identification information 1500 corresponding to the token corresponding to the artificial neural network data locality pattern 1400 of FIG. 4.

The artificial neural network data locality pattern 1400 of FIG. 4 is illustrated as tokens for the convenience of description. Referring to FIGS. 1A to 4, the artificial neural network data locality pattern 1400 of the artificial neural network model 1300 is stored as tokens [1-2-3-4-5-6-7-8-9].

Each data access request is configured to include identification information. Each data access request may be represented by a token, but this representation is merely for the convenience of description. That is, the present disclosure is not limited to the token.

According to the artificial neural network data locality pattern 1400, the artificial neural network memory controller 120 may sequentially predict an order of tokens which will be generated after the present token.

For example, the artificial neural network data locality pattern 1400 may be configured to have a loop type pattern in which the orders are connected from the final token to the start token, but the present disclosure is not limited thereto.

For example, the artificial neural network data locality pattern 1400 may be configured by memory addresses having a repeated loop characteristic, but the present disclosure is not limited thereto.

For example, the artificial neural network data locality pattern 1400 may be configured to further include identification information for identifying the start and the end of the operation of the artificial neural network model, but the present disclosure is not limited thereto.

For example, the start and the end of the artificial neural network data locality pattern 1400 may be configured to be distinguished as a start token and a final token of the pattern, but the present disclosure is not limited thereto.

According to the above-described configuration, when the processor 110 repeatedly infers the specific artificial neural network model, since the artificial neural network data locality pattern 1400 is a loop type pattern, even though the present inference of the specific artificial neural network model ends, the start of the next inference may be predicted.

For example, in the case of the artificial neural network model which recognizes an object of an image of a front camera mounted in an autonomous vehicle at a speed of 30 IPS (inferences per second), the same inference is continuously repeated at a specific cycle. Accordingly, when the above-described loop type artificial neural network data locality pattern is utilized, it is possible to predict the repeated data access request.

When the identification information is additionally described as an example, the token [3] and the token [4] of the artificial neural network data locality pattern 1400 have the same memory address value but have different operation modes. Accordingly, even though the memory address values are the same, the operations modes are different, so that the artificial neural network memory controller 120 may be configured to classify the third data access request and the fourth data access request as different tokens. However, the identification information of the examples of the present disclosure is not limited to the operation mode, but may be configured to predict the artificial neural network data locality pattern only with the memory address value.

The artificial neural network memory controller 120 may be configured to generate a corresponding predicted data access request (i.e., a data access request in advance) based on the neural network data locality pattern 1400.

The artificial neural network memory controller 120 may be configured to generate a corresponding predicted data access request based on the artificial neural network data locality pattern 1400.

The artificial neural network memory controller 120 may be configured to sequentially further generate, in advance, a predicted data access request based on the artificial neural network data locality pattern 1400.

According to the above-described configuration, when the processor 110 generates a specific data access request included in the artificial neural network data locality pattern 1400, the artificial neural network memory controller 120 may sequentially predict at least one data access request after the specific data access request. For example, when the processor 110 generates the token [1], the artificial neural network memory controller 120 may predict that a data access request corresponding to the token [2] is subsequently generated. For example, when the processor 110 generates the token [3], the artificial neural network memory controller 120 may predict that a data access request corresponding to the token [4] is subsequently generated. For example, when the processor 110 generates the token [1], the artificial neural network memory controller 120 may predict that corresponding data access requests are generated in the order of tokens [2-3-4-5-6-7-8-9].

In other words, when the processor 110 processes a plurality of artificial neural network models, a data locality pattern which has not been predicted may intervene between the tokens of the artificial neural network data locality pattern 1400. For example, after the token [2], a new token [4] may be interrupted. However, even in this case, the artificial neural network memory controller 120 may predict and prepare that the processor 110 generates the token [3] after the token [2].

For example, when the processor 110 generates the token [9], the artificial neural network memory controller 120 may predict that the processor 110 generates the token [1].

FIG. 6 illustrates the generation 1600 of a predicted data access request and an actual (i.e., next) actual data access request, based on an artificial neural network data locality pattern, by an artificial neural network memory controller according to an example of the present disclosure.

The artificial neural network memory controller 120 according to the example of the present disclosure may be configured to utilize the artificial neural network data locality pattern to predict an actual data access request to be subsequently requested by the processor 110 to generate, in advance, a predicted data access request.

Referring to FIG. 6, the data access request token refers to a token corresponding to a data access request which is received from the processor 110 by the artificial neural network memory controller 120. The predicted data access request token is a token corresponding to a data access request obtained by predicting a data access request to be subsequently requested by the processor 110, based on the artificial neural network data locality pattern by the artificial neural network memory controller 120. The actual data access request token is a data access request token which is actually generated by the processor 110 immediately after generating the predicted data access request token. The token of the present disclosure is just an example for the convenience of description; that is, the present disclosure is not limited to the token.

The data access request that will be generated by a processor and the predicted data access request that is predicted by the artificial neural network memory controller before generation by the processor may correspond to a particular data access request token. In this case, the data access request and the predicted data access request matching a specific data access request token may be configured to have the same memory address. That is, the data access request and the predicted data access request may be configured to include the same memory address.

For example, when the data access request token is [3] and the predicted data access request token is [3], the memory address value of each token may be the same. That is, the data access request and the predicted data access request may be configured to include the same operation mode value. For example, when the data access request token is [3] and the predicted data access request token is [3], the operation mode value of each token may be the same.

Referring to FIG. 6, when the processor 110 generates the data access request corresponding to the token [1], the artificial neural network memory controller 120 generates the predicted data access request corresponding to the token [2]. The processor 110 generates a subsequent (actual) data access request corresponding to the token [2] after generating the predicted data access request. The artificial neural network memory controller 120 is configured to determine whether the predicted data access request precisely predicts the actual data access request. The same token corresponds to the predicted data access request and the actual data access request so that the artificial neural network memory controller 120 may determine that the patterns match.

Next, for example, when the processor 110 generates the data access request corresponding to the token [2], the artificial neural network memory controller 120 generates the predicted data access request corresponding to the token [3]. The processor 110 generates a subsequent (actual) data access request corresponding to the token [3] after generating the predicted data access request. The artificial neural network memory controller 120 is configured to determine whether the predicted data access request precisely predicts the subsequent (actual) data access request. The same token corresponds to the predicted data access request and the subsequent (actual) data access request so that the artificial neural network memory controller 120 may determine that the patterns match.

For example, when the processor 110 generates the data access request corresponding to the token [9], the artificial neural network memory controller 120 generates the predicted data access request corresponding to the token [1]. The processor 110 generates a subsequent (actual) data access request corresponding to the token [9] after generating the predicted data access request. The artificial neural network memory controller 120 is configured to determine whether the predicted data access request precisely predicts the subsequent (actual) data access request. The same token corresponds to the predicted data access request and the subsequent (actual) data access request so that the artificial neural network memory controller 120 may determine that the patterns match.

When the processor 110 generates the subsequent (actual) data access request after the artificial neural network memory controller 120 generates the predicted data access request, the artificial neural network memory controller 120 may be configured to determine whether the predicted data access request and the subsequent (actual) data access request are the same requests.

According to the above-described configuration, the artificial neural network memory system 100 may detect the change of the artificial neural network data locality of the artificial neural network model which is processed by the processor 110. Accordingly, even though the artificial neural network model is changed, the artificial neural network memory controller 120 may analyze the changed artificial neural network data locality.

When the artificial neural network memory controller 120 determines that the predicted data access request and the subsequent (actual) data access request are the same requests, the artificial neural network memory controller 120 may be configured to maintain the artificial neural network data locality pattern.

According to the above-described configuration, the artificial neural network memory system 100 detects that the artificial neural network model processed by the processor 110 is repeatedly used, to more quickly prepare or provide data requested by the processor 110.

When the artificial neural network memory controller 120 determines that the predicted data access request and the subsequent (actual) data access request are different, the artificial neural network memory controller 120 may be configured to update the artificial neural network data locality pattern or to further generate a new artificial neural network data locality pattern.

According to the above-described configuration, the artificial neural network memory system 100 may detect the change of the artificial neural network model which is processed by the processor 110 to generate a predicted data access request corresponding to the changed artificial neural network model.

In some examples, the artificial neural network memory controller may be configured to generate continuous predicted data access requests.

For example, when the data access request token is [2], a predicted data access request which is generated by the artificial neural network memory controller may be a data access request corresponding to the token [3]. However, it is not limited thereto and, for example, the predicted data access request generated by the artificial neural network memory controller may be a plurality of data access requests corresponding to tokens [3-4]. However, it is not limited thereto and, for example, the predicted data access request generated by the artificial neural network memory controller may be a plurality of data access requests corresponding to tokens [3-4-5-6].

According to the above-described configuration, the artificial neural network memory controller may generate a predicted data access request which predicts the entire order of the continuously repeated data access requests, based on the artificial neural network data locality pattern.

According to the above-described configuration, the artificial neural network memory controller may generate a predicted data access request which predicts the order of at least some data access requests, based on the artificial neural network data locality pattern.

Figure 7:
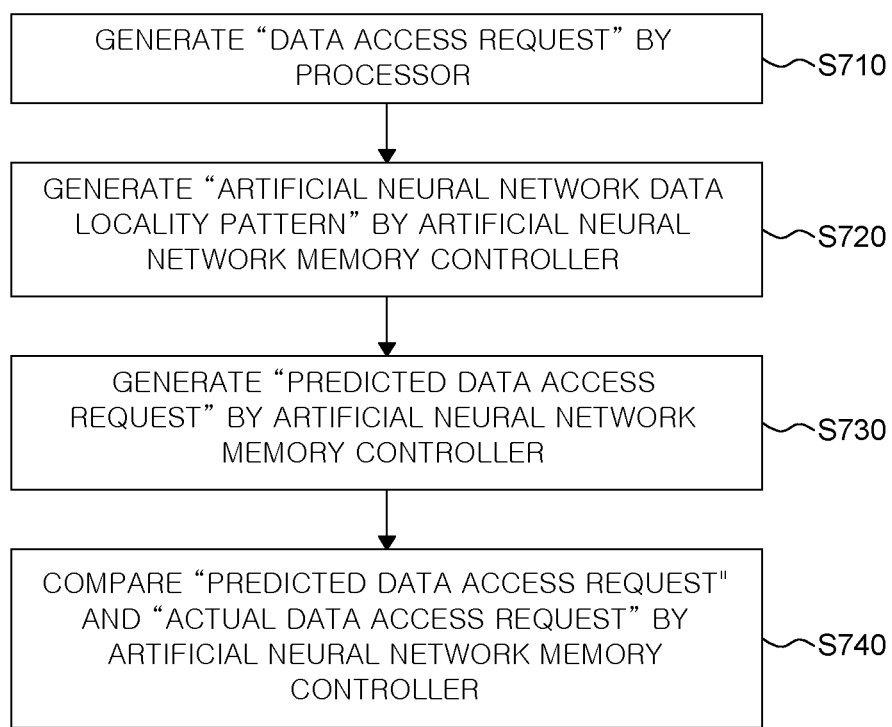
FIG. 7 is a flowchart of an operation of an artificial neural network memory controller according to an example of the present disclosure.

FIG. 7 illustrates an operation of an artificial neural network memory controller according to an example of the present disclosure.

Referring to FIG. 7, for the artificial neural network operation processing, the processor 110 may be configured to generate a data access request corresponding to the artificial neural network model based on the artificial neural network data locality.

The artificial neural network memory controller 120 sequentially records the data access requests generated in the processor 110 to generate the artificial neural network data locality pattern.

The artificial neural network memory controller 120 compares the generated artificial neural network data locality pattern and the data access request generated by the processor 110 to generate, in advance, a predicted data access request which corresponds to a subsequent data access request to be generated by the processor 110.

The artificial neural network memory system 100 according to the example of the present disclosure may be configured to include at least one processor 110 configured to generate a data access request corresponding to the artificial neural network operation (S710) and may be further configured to generate an artificial neural network data locality pattern of an artificial neural network operation by sequentially recording the data access request (S720). The artificial neural network memory system 100 may be configured to include at least one artificial neural network memory controller 120 configured to generate a predicted data access request which predicts a subsequent data access request of the data access request generated by at least one processor 110, based on the artificial neural network data locality pattern.

That is, at least one artificial neural network memory controller 120 generate a predicted data access request before generating a subsequent data access request (S730).

That is, at least one processor 110 is configured to transmit the data access request to at least one artificial neural network memory controller 120 and at least one artificial neural network memory controller 120 may be configured to output the predicted data access request corresponding to the data access request.

The artificial neural network memory system 100 according to one example of the present disclosure may be configured to include at least one processor 110 configured to generate a data access request corresponding to the artificial neural network operation and at least one artificial neural network memory controller 120 configured to generate an artificial neural network data locality pattern of an artificial neural network operation by sequentially recording the data access request generated by at least one processor 110 and to generate a predicted data access request which predicts a subsequent (actual) data access request of the data access request generated by at least one processor 110 based on the artificial neural network data locality pattern.

According to the above-described configuration, the artificial neural network memory controller 120 predicts a subsequent (actual) data access request to be generated by the artificial neural network model, which is being processed by the processor 110 based on the artificial neural network data locality pattern, so that it is advantageous in that the corresponding data may be prepared in advance to be provided before the request of the processor 110.

The artificial neural network memory controller 120 may be configured to compare the generated predicted data access request and a subsequent data access request which is generated by the processor 110 after generating the predicted data access request to determine whether the artificial neural network data locality pattern matches (S740).

According to the above-described configuration, the artificial neural network memory controller 120 generates the predicted data access request before generating the subsequent data access request to be prepared to provide the data in advance. Accordingly, the artificial neural network memory controller 120 may substantially eliminate or reduce a latency which may be generated when the data is provided to the processor 110.

Figure 8:
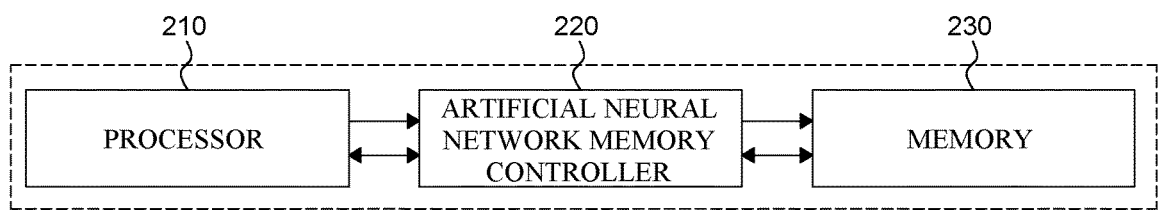
FIG. 8 is a schematic block diagram of an artificial neural network memory system according to another example of the present disclosure.

FIG. 8 illustrates an artificial neural network memory system 200 according to another example of the present disclosure.

Referring to FIG. 8, the artificial neural network memory system 200 may be configured to include a processor 210, an artificial neural network memory controller 220, and a memory 230.

The artificial neural network memory system 200 of FIG. 8 and the artificial neural network memory system 100 of FIG. 1A are substantially the same except that the artificial neural network memory system 200 further includes the memory 230. Therefore, for the convenience of description, the redundant description will be omitted.

The artificial neural network memory system 200 includes the memory 230 configured to communicate with the artificial neural network memory controller 220 and the memory 230 may be configured to operate in accordance with the memory access request output from the artificial neural network memory controller 220.

The processor 210 may be configured to communicate with the artificial neural network memory controller 220. The processor 210 may be configured to generate a data access request to be transmitted to the artificial neural network memory controller 220. The data access request may be generated based on the artificial neural network data locality of the artificial neural network model which is being processed. The processor 210 is configured to be provided with the data corresponding to the data access request from the artificial neural network memory controller 220.

The artificial neural network memory controller 220 may be configured to receive the data access request generated by the processor 210. The artificial neural network memory controller 220 may be configured to generate an artificial neural network data locality pattern by analyzing the artificial neural network data locality of the artificial neural network model which is being processed by the processor 210.

The artificial neural network memory controller 220 may be configured to control the memory 230 by generating the memory access request. The artificial neural network memory controller 220 may be configured to generate the memory access request corresponding to the data access request. That is, the artificial neural network memory controller 220 may be configured to generate the memory access request corresponding to the data access request generated by the processor 210. For example, when the artificial neural network memory controller 220 does not generate the artificial neural network data locality pattern, the artificial neural network memory controller 220 may be configured to generate the memory access request based on the data access request generated by the processor 210. In this case, the memory access request may be configured to include the memory address value and the operation mode value among identification information included in the data access request.

The artificial neural network memory controller 220 may be configured to generate the memory access request corresponding to a predicted data access request. That is, the artificial neural network memory controller 220 may be configured to generate the memory access request based on the predicted data access request which is generated based on the artificial neural network data locality pattern. For example, when the artificial neural network memory controller 220 generates the artificial neural network data locality pattern, the artificial neural network memory controller 220 may be configured to generate the memory access request based on the predicted data access request.

According to the above-described configuration, the artificial neural network memory controller 220 may transmit and receive data to and from the memory 230 by means of the memory access request and, when the memory access request is generated based on the predicted data access request, the artificial neural network memory system 200 may more quickly provide the data to the processor 210.

The artificial neural network memory controller 220 may be configured to generate the memory access request based on one of the data access requests generated by the processor 210 and the predicted data access request generated by the artificial neural network memory controller 220. That is, the memory access request generated by the artificial neural network memory controller 220 may be selectively generated based on the data access request or the predicted data access request.

The artificial neural network memory controller 220 may be configured to generate the memory access request including at least a part of identification information included in the data access request and the predicted data access request. For example, the data access request generated by the processor 210 may include a memory address value and an operation mode value. At this time, the memory access request generated by the artificial neural network memory controller 220 may be configured to include a memory address value and an operation mode value of the corresponding data access request.

That is, each of the data access request, the predicted data access request, and the memory access request may be configured to include the corresponding memory address value and operation mode value. The operation mode may be configured to include a read mode and a write mode. For example, the memory access request generated by the artificial neural network memory controller 220 may be configured to have a data type having the same configuration as the data access request or the predicted data access request. Accordingly, from the viewpoint of the memory 230, even though the data access request and the predicted data access request are not distinguished, the memory access request task may be performed in accordance with the instruction of the artificial neural network memory controller 220.

According to the above-described configuration, the memory 230 may operate regardless of whether the memory access request generated by the artificial neural network memory controller 220 is based on the data access request or based on the predicted data access request. Accordingly, even though the artificial neural network memory controller 220 operates based on the artificial neural network data locality, the artificial neural network memory controller may operate to be compatible with various types of memories.

The artificial neural network memory controller 220 transmits the memory access request to the memory 230 and the memory 230 performs a memory operation corresponding to the memory access request.

The memory according to the examples of the present disclosure may be implemented in various forms. The memory may be implemented by a volatile memory and a non-volatile memory.

The volatile memory may include a dynamic RAM (DRAM) and a static RAM (SRAM). The non-volatile memory may include programmable ROM (PROM), an erasable PROM (EPROM), an electrically erasable PROM (EEPROM), a flash memory, a ferroelectric RAM (FRAM), a magnetic RAM (MRAM), and a phase change memory device (phase change RAM), but the present disclosure is not limited thereto.

The memory 230 may be configured to store at least one of inference data, weight data, and feature map data of the artificial neural network model which is being processed by the processor 210. The inference data may be an input signal of the artificial neural network model.

The memory 230 may be configured to receive a memory access request from the artificial neural network memory controller 220. The memory 230 may be configured to perform a memory operation corresponding to the received memory access request. The operation mode which controls the memory operation may include a read mode or a write mode.

For example, when the operation mode of the received memory access request is a write mode, the memory 230 may store the data received from the artificial neural network memory controller 220 in the corresponding memory address value.

For example, when the operation mode of the received memory access request is a read mode, the memory 230 may transmit the data stored in the corresponding memory address value to the artificial neural network memory controller 220. The artificial neural network memory controller 220 may be configured to transmit the received data to the processor 210 again.

The memory 230 may have a latency. The latency of the memory 230 may refer to a time delay that occurs when the artificial neural network memory controller 220 processes the memory access request. That is, when the memory 230 receives the memory access request from the artificial neural network memory controller 220, actually requested data is output from the memory 230 after a latency of a specific clock cycle.

In order to process the memory access request, the memory 230 may access the memory address value included in the memory access request. Accordingly, a time to access the memory address value is necessary and the time may be defined as a memory latency. For example, a CAS latency of the DDR4 SDRM memory is approximately 10 ns. When the data is not provided to the processor 210 during the latency, the processor 210 is in an idle state so that the processor is not performing an actual operation.

In addition, in the case of the DRAM which is one type of memory 230, a number of clock cycles are consumed to activate a word line (Wordline) and a bit line (Bitline) in accordance with a row address of the memory 230, a number of clock cycles are consumed to activate a column line, and a number of clock cycles are consumed to allow the data to pass through a path through which the data is transmitted to the outside of the memory 230. Further, in the case of the NAND flash memory, units which are activated at one time are large, so that a number of clock cycles may be additionally consumed used to search for data of a required address among them.

The memory 230 may have a bandwidth. A data transfer rate of the memory 230 may be defined as a memory bandwidth. For example, a bandwidth of the DDR4 SDRAM memory is approximately 4 GByte/sec. As the memory bandwidth is higher, the memory 230 may more quickly transmit data to the processor 210.

That is, the processing rate of the artificial neural network memory system 200 is affected by the latency generated when data to be processed by the processor 210 is provided and the bandwidth performance of the memory 230, more than the processing performance of the processor 210.

In other words, the bandwidth of the memory is gradually increased, but the latency of the memory is relatively slowly improved as compared with the improvement speed of the bandwidth. Specifically, whenever the memory access request is generated, the latency of the memory 230 is generated so that the frequent memory access request may be an important cause of the slow artificial neural processing speed.

That is, even though the operation processing speed of the processor 210 is fast, if the latency is generated to take data necessary for the operation, the processor 210 may be in an idle state in which the operation is not performed. Therefore, in this case, the operation processing speed of the processor 210 may become slow.

Therefore, the artificial neural network memory system according to the examples of the present disclosure may be configured to improve the bandwidth and/or the latency of the memory 230.

Figure 9:
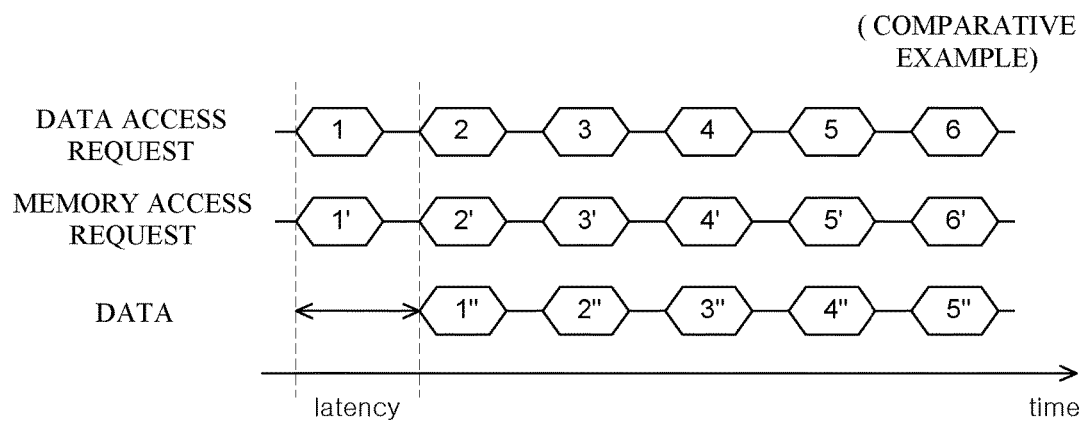
FIG. 9 is a schematic diagram of an operation of a memory system according to a comparative embodiment of the present disclosure.

FIG. 9 illustrates an operation of a memory system according to a comparative embodiment of the present disclosure.

Referring to FIG. 9, the processor generates the data access request, and a known memory system may transmit a memory access request corresponding to the data access request to the memory. At this time, the memory has a latency so that the processor may be provided with the requested data from the memory after waiting for the period of latency.

For example, the known memory system receives a data access request [1] generated by the processor and transmits the memory access request [1'] corresponding to the data access request [1] to the memory. The memory may transmit the data [1"] to the memory system after the latency. Accordingly, a processing time of the processor may be delayed as much as the latency of the memory at every data access request. Accordingly, the time of the inference operation of the artificial neural network may be delayed as much as the memory latency. Specifically, as the processor generates more data access requests, the artificial neural network inference operation time of the known memory system may be further delayed.

Figure 10:
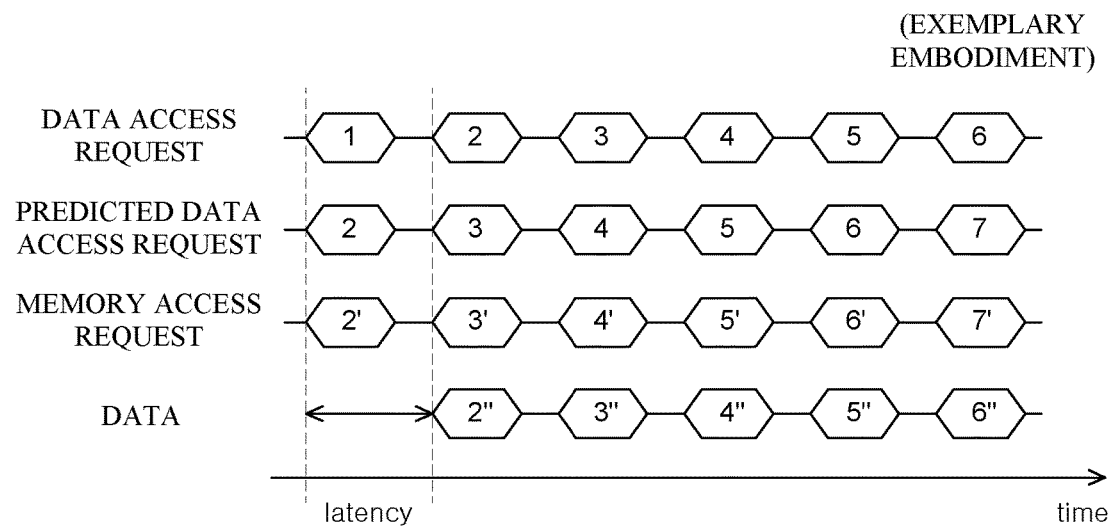
FIG. 10 is a schematic diagram of an operation of the memory system of FIG. 8.

FIG. 10 illustrates an operation of a memory system according to FIG. 8.

Referring to FIG. 10, the processor 210 generates a data access request [1] and the artificial neural network memory controller 220 may transmit the memory access request corresponding to the predicted data access request generated based on the artificial neural network data locality pattern to the memory 230. At this time, even though the memory 230 has a latency, the processor 210 generates a memory access request corresponding to the predicted data access request so that when the processor 210 generates the subsequent data access request, the artificial neural network memory controller 220 may directly provide the data requested by the processor 210 to the processor 210.

For example, the data access request [1] generated by the processor 210 is received by the artificial neural network memory controller 220 to generate the predicted data access request [2] and transmit the memory access request [2'] corresponding to the predicted data access request [2] to the memory 230. The memory 230 may transmit the data [2"] to the artificial neural network memory controller 220 after the latency. However, the data [2"] provided by the memory 230 is data corresponding to the memory access request [2'] based on the predicted data access request [2]. Accordingly, when the processor 210 generates the subsequent data access request [2], the artificial neural network memory controller 220 may immediately provide the data [2"] to the processor 210.

If a time between the memory access request based on the predicted data access request and the subsequent data access request is longer than the latency of the memory 230, the artificial neural network memory controller 220 may provide the data to the processor 210 as soon as the subsequent data access request is received from the processor 210. In this case, the artificial neural network memory controller 220 may substantially eliminate the latency of the memory 230.

In other words, when the memory access request based on the predicted data access request is transmitted to the memory 230, the latency of the memory 230 may be shorter than or equal to a time from the generation of the predicted data access request to the generation of the subsequent data access request. In this case, the artificial neural network memory controller 220 may immediately provide data without causing the latency as soon as the processor 210 generates the subsequent data access request.

Even though the time between the memory access request based on the predicted data access request and the subsequent data access request is shorter than the latency of the memory 230, the latency of the memory 230 may be substantially reduced, that is, by as much as the time between the memory access request and the subsequent data access request.

According to the above-described configuration, the artificial neural network memory controller 220 may substantially eliminate or reduce the latency of the data to be provided to the processor 210.

In some examples, the artificial neural network memory controller of the artificial neural network memory system may be configured to measure the latency of the memory or be provided with a latency value of the memory from the memory.

According to the above-described configuration, the artificial neural network memory controller may be configured to determine a timing of generating a memory access request based on the predicted data access request, based on the latency of the memory. Accordingly, the artificial neural network memory controller may generate a memory access request based on the predicted data access request which substantially minimizes the latency of the memory.

In some examples, the memory of the artificial neural network memory system may be a memory configured to include a refresh function which updates a voltage of a memory cell (i.e., array of memory cells). The artificial neural network memory controller may be configured to selectively control the refresh to the memory address area of the memory corresponding to the memory access request corresponding to the predicted data access request. For example, the memory may be a SAM or DRAM including a refresh function.

If the DRAM does not refresh the voltage of the memory cell, the memory cell is slowly discharged so that the stored data may be lost. Accordingly, the voltage of the memory cell needs to be refreshed at every specific cycle. If the timing of the memory access request of the artificial neural network memory controller and the refresh timing overlap, the artificial neural network memory system may be configured to advance or delay the timing of refreshing the voltage of the memory cell.

The artificial neural network memory system may predict or calculate the timing of generating the memory access request based on the artificial neural network data locality pattern. Accordingly, the artificial neural network memory system may be configured to limit the voltage refresh of the memory cell during the memory access request operation.

In other words, the inference operation of the artificial neural network operation operates with the concept of accuracy, so that even though the stored data is partially lost due to the delayed refresh of the voltage of the memory cell, the degradation of the inference accuracy may be substantially negligible.

According to the above-described configuration, the artificial neural network memory system may be provided with the data in accordance with the memory access request from the memory by adjusting the voltage refresh cycle of the memory cell. Accordingly, the operation speed lowering of the artificial neural network in accordance with the voltage refresh of the memory cell may be improved without substantially degrading the inference accuracy.

In some examples, the memory of the artificial neural network memory system may be configured to further include a precharge function which charges a global bit line (Bitline) of the memory with a specific voltage. At this time, the artificial neural network memory controller may be configured to selectively provide the precharge to the memory address area of the memory corresponding to the memory access request corresponding to the predicted data access request.

In some examples, the artificial neural network memory controller may be configured to precharge or delay the Bitline of the memory which performs a memory task corresponding to the predicted data access request based on the artificial neural network data locality pattern.

Generally, the memory performs the precharge operation to perform a read operation or a write operation by receiving the memory access request. When one memory operation is completed, signals remain in the Bitline which performs the data read and write operations and each data input/output line so that only when the above-mentioned lines are precharged to a predetermined level, a subsequent memory operation may be smoothly performed. However, since the time required for precharge is quite long, when the timing of generating a memory access request and the timing of precharge overlap, the memory operation may be delayed by the precharge time. Accordingly, the time for processing the data access request requested by the processor may be delayed.

The artificial neural network memory controller may predict that a memory operation is performed on a Bitline of a specific memory at a specific order based on the artificial neural network data locality pattern. Accordingly, the artificial neural network memory controller may advance or delay the precharge timing so as not to overlap the precharge timing and a time when the memory operation is performed on a specific Bitline.

In other words, the inference operation of the artificial neural network model operates with the concept of accuracy, so that even though the stored data is partially lost due to the delayed precharge, the degradation of the inference accuracy may be substantially negligible.

In other words, the artificial neural network is a mathematical model modeled by simulating a brain neural network of a biological system. A human nerve cell called a neuron exchanges information through a junction between nerve cells called synapses and the information exchange between the nerve cells is very simple, but a massive number of nerve cells are gathered to create the intelligence. This structure has advantages in that, even though some nerve cells transmit wrong information, it does not affect the overall information so that it is very robust against small errors. Therefore, due to the above-described characteristic, even though the precharge and refresh functions of the memory which stores the data of the artificial neural network model are selectively limited, the accuracy of the artificial neural network model may not substantially cause problems and the memory latency due to the precharge or the refresh may be reduced.

According to the above-described configuration, the operation speed lowering of the artificial neural network in accordance with the precharge may be improved without substantially degrading the inference accuracy.

In some examples, the artificial neural network memory controller may be configured to independently control the refresh function and the precharge function of the memory based on the artificial neural network data locality pattern.

Figure 11:
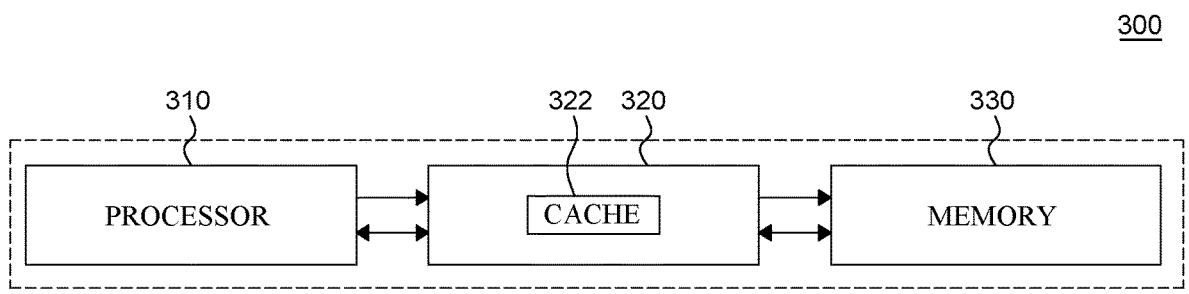
FIG. 11 is a schematic block diagram of an artificial neural network memory system according to still another example of the present disclosure.

FIG. 11 illustrates an artificial neural network memory system 300 according to still another example of the present disclosure.

Referring to FIG. 11, the artificial neural network memory system 300 may be configured to include a processor 310, an artificial neural network memory controller 320 including a cache memory 322, and a memory 330.

The memory 330 that may be included in various examples of the present disclosure may be a memory specialized for artificial neural network operation, and may be referred to as a sequential access memory (SAM). However, the present disclosure is not limited thereto and the memory of various examples of the present disclosure may refer to a memory device specialized for an artificial neural network operation that can be controlled based on artificial neural network data locality.

The artificial neural network memory system 300 and the artificial neural network memory system 200 are substantially the same except that the artificial neural network memory system 300 further includes the cache memory 322. Therefore, for the convenience of description, the redundant description will be omitted.

The artificial neural network memory system 300 may be configured to include an artificial neural network memory controller 320 including a cache memory 322 configured to store data transmitted by the memory 330 in response to a memory access request based on a predicted data access request.

According to the above-described configuration, the artificial neural network memory controller 320 may read data in response to the memory access request based on the predicted data access request from the memory 330 and store the data in the cache memory 322. Therefore, when the processor 310 generates a subsequent data access request, the artificial neural network memory controller 320 may immediately provide the data stored in the cache memory 322 to the processor 310.

A latency of the cache memory 322 is much shorter than the latency of the memory 330. A bandwidth of the cache memory 322 is higher than the bandwidth of the memory 330.

An artificial neural network model processing performance of the artificial neural network memory system 300 including a cache memory 322 may be better than the artificial neural network memory system 200.

The artificial neural network memory system 300 will be described with reference to the artificial neural network model 1300 of FIG. 3.

The artificial neural network model 1300 may be compiled by a specific compiler to be operated in the processor 310. The compiler may be configured to provide the artificial neural network data locality pattern to the artificial neural network memory controller 320.

In order to infer the artificial neural network model 1300, the processor 310 may be configured to generate data access requests according to the order based on the artificial neural network data locality. Accordingly, the artificial neural network memory controller 320 may monitor the data access requests to generate the artificial neural network data locality pattern 1400. Alternatively, the artificial neural network memory controller 320 may store an artificial neural network data locality pattern 1400 which has been generated in advance.

Hereinafter, an example in which an artificial neural network data locality pattern 1400 is not generated will be described.

First, the processor 310 may generate a data access request of a token [1] corresponding to a node value read mode of the input layer 1310. Accordingly, the artificial neural network memory controller 320 generates the memory access request of the token [1] to transmit the node value of the input layer 1310 which is transmitted from the memory 330 to the processor 310.

Next, the processor 310 may generate a data access request of a token [2] corresponding to a weight value of the first connection network 1320. Accordingly, the artificial neural network memory controller 320 generates the memory access request of the token [2] to transmit the weight value of the first connection network 1320 which is transmitted from the memory 330 to the processor 310.

Next, the processor 310 receives the node value of the input layer 1310 and the weight value of the first connection network 1320 to calculate the node value of the first hidden layer 1330. That is, the processor 310 may generate a data access request of a token [3] corresponding to a node value write mode of the first hidden layer 1330. Accordingly, the artificial neural network memory controller 320 generates the memory access request of the token [3] to store the node value of the first hidden layer 1330 in the memory 330.

Next, the processor 310 may generate a data access request of a token [4] corresponding to a node value read mode of the first hidden layer 1330. Accordingly, the artificial neural network memory controller 320 generates the memory access request of the token [4] to transmit the node value of the first hidden layer 1330 which is transmitted from the memory 330 to the processor 310.

Next, the processor 310 may generate a data access request of a token [5] corresponding to a weight value of the second connection network 1340. Accordingly, the artificial neural network memory controller 320 generates the memory access request of the token [5] to transmit the weight value of the second connection network 1340 which is transmitted from the memory 330 to the processor 310.

Next, the processor 310 receives the node value of the first hidden layer 1330 and the weight value of the second connection network 1340 to calculate the node value of the second hidden layer 1350. That is, the processor 310 may generate a data access request of a token [6] corresponding to a node value write mode of the second hidden layer 1350. Accordingly, the artificial neural network memory controller 320 generates the memory access request of the token [6] to store the node value of the second hidden layer 1350 in the memory 330.

Next, the processor 310 may generate a data access request of a token [7] corresponding to a node value read mode of the second hidden layer 1350. Accordingly, the artificial neural network memory controller 320 generates the memory access request of the token [7] to transmit the node value of the second hidden layer 1350 which is transmitted from the memory 330 to the processor 310.

Next, the processor 310 may generate a data access request of a token [8] corresponding to a weight value of the third connection network 1360. Accordingly, the artificial neural network memory controller 320 generates the memory access request of the token [8] to transmit the weight value of the third connection network 1360 which is transmitted from the memory 330 to the processor 310.

Next, the processor 310 receives the node value of the second hidden layer 1350 and the weight value of the third connection network 1360 to calculate the node value of the output layer 1370. That is, the processor 310 may generate a data access request of a token [9] corresponding to a node value write mode of the output layer 1370. Accordingly, the artificial neural network memory controller 320 generates the memory access request of the token [9] to store the node value of the output layer 1370 in the memory 330.

Accordingly, the artificial neural network memory system 300 may store the inference result of the artificial neural network model 1300 in the output layer 1370.

In the above-described example, the artificial neural network data locality pattern 1400 has not been generated in the artificial neural network memory controller 320. Therefore, according to the above-described example, the predicted data access request cannot be generated. Accordingly, since the artificial neural network memory controller 320 does not provide the data in advance, the latency of the memory 330 may be caused in every memory access request.

However, since the artificial neural network memory controller 320 records the data access requests, when the processor 310 generates the data access request of the token [1] corresponding to a node value read mode of the input layer 1310 again, the artificial neural network data locality pattern 1400 may be generated.

Hereinafter, generation of the artificial neural network data locality pattern 1400 is described with reference to FIG. 4.

In the following example, the artificial neural network data locality pattern 1400 is generated and the processor 310 is repeatedly inferring the artificial neural network model 1300, but the present disclosure is not limited thereto.

The processor 310 detects the repeated data access request of the token [1] to generate the artificial neural network data locality pattern 1400. In other words, since the artificial neural network memory controller 320 sequentially stores from the token [1] to the token [9], when the artificial neural network memory controller 320 detects the token [1] again, the artificial neural network data locality may be determined.

However, as described above, the artificial neural network memory controller according to the examples of the present disclosure is not limited to the token. The token is merely used for the convenience of description and the examples of the present disclosure may be implemented by the identification information included in the data access request and the memory access request.

For example, when the processor 310 generates the data access request corresponding to the token [9], the artificial neural network memory controller 320 generates the predicted data access request of the token [1]. Accordingly, the artificial neural network memory controller 320 generates the memory access request of the token [1] to store the node value of the input layer 1310 in the cache memory 322 in advance.

That is, if the data access request of the token [9] is the final step of the artificial neural network model 1300, the artificial neural network memory controller 320 may predict that the data access request of the token [1], which is a start step of the artificial neural network model 1300, will be generated.

Next, when the processor 310 generates a data access request of the token [1], the artificial neural network memory controller 320 determines whether the predicted data access request of the token [1] and the data access request of the token [1] are the same. When it is determined that the requests are the same, the node value of the input layer 1310 stored in the cache memory 322 may be immediately provided to the processor 310.

At this time, the artificial neural network memory controller 320 generates the predicted data access request of the token [2].

Accordingly, the artificial neural network memory controller 320 generates the memory access request of the token [2] to store the weight value of the first connection network 1320 in the cache memory 322 in advance.

Next, when the processor 310 generates a data access request of the token [2], the artificial neural network memory controller 320 determines whether the predicted data access request of the token [2] and the data access request of the token [2] are the same. When it is determined that the requests are the same, the node value of the first connection network 1320 stored in the cache memory 322 may be immediately provided to the processor 310.

At this time, the artificial neural network memory controller 320 generates the predicted data access request of the token [3].

Next, the processor 310 receives the node value of the input layer 1310 and the weight value of the first connection network 1320 to calculate the node value of the first hidden layer 1330. When the processor 310 generates a data access request of the token [3], the artificial neural network memory controller 320 determines whether the predicted data access request of the token [3] and the data access request of the token [3] are the same. When it is determined that the requests are the same, the calculated node value of the first hidden layer 1330 may be stored in the memory 330 and/or the cache memory 322.

The cache memory 322 will be additionally described. When the same data is stored in the memory 330 as the memory access request of the token [3] without having the cache memory 322, and then is read from the memory 330 as the memory access request of the token [4], the latency of the memory 330 may be doubled.

In this case, the artificial neural network memory controller 320 stores the node value of the layer calculated based on the fact that the memory address values of continuous tokens are the same and an operation mode of a previous token is a write mode, and an operation mode of the subsequent token is a read mode and determines to use the corresponding node value as an input value of a subsequent layer.

That is, when the data of the token [3] is stored in the cache memory 322, the data access requests corresponding to the token [3] and the token [4] may be processed in the cache memory 322. Accordingly, the artificial neural network memory controller 320 may be configured so as not to generate the memory access requests corresponding to the data access request of the token [3] and the data access request of the token [4]. According to the above-described configuration, the latency of the memory 330 by the memory 330 may be eliminated by the memory access request of the token [3] and the memory access request of the token [4]. In particular, the cache memory 322 operation policy may be performed based on the artificial neural network data locality pattern 1400.

At this time, the artificial neural network memory controller 320 generates the predicted data access request of the token [4].

Next, when the processor 310 generates a data access request of the token [4], the artificial neural network memory controller 320 determines whether the predicted data access request of the token [4] and the data access request of the token [4] are the same. When it is determined that the requests are the same, the node value of the first hidden layer 1330 stored in the cache memory 322 may be immediately provided to the processor 310.

At this time, the artificial neural network memory controller 320 generates the predicted data access request of the token [5].

Accordingly, the artificial neural network memory controller 320 generates the memory access request of the token [5] to store the weight value of the second connection network 1340 in the cache memory 322 in advance.

Next, when the processor 310 generates a data access request of the token [5], the artificial neural network memory controller 320 determines whether the predicted data access request of the token [5] and the data access request of the token [5] are the same. When it is determined that the requests are the same, the weight value of the second connection network 1340 stored in the cache memory 322 may be immediately provided to the processor 310.

At this time, the artificial neural network memory controller 320 generates the predicted data access request of the token [6].

Next, the processor 310 receives the node value of the first hidden layer 1330 and the weight value of the second connection network 1340 to calculate the node value of the second hidden layer 1350. When the processor 310 generates a data access request of the token [6], the artificial neural network memory controller 320 determines whether the predicted data access request of the token [6] and the data access request of the token [6] are the same. When it is determined that the requests are the same, the calculated node value of the second hidden layer 1350 may be stored in the memory 330 and/or the cache memory 322.

At this time, the artificial neural network memory controller 320 generates the predicted data access request of the token [7].

Next, when the processor 310 generates a data access request of the token [7], the artificial neural network memory controller 320 determines whether the predicted data access request of the token [7] and the data access request of the token [7] are the same. When it is determined that the requests are the same, the node value of the second hidden layer 1350 stored in the cache memory 322 may be immediately provided to the processor 310.

At this time, the artificial neural network memory controller 320 generates the predicted data access request of the token [8].

Accordingly, the artificial neural network memory controller 320 generates the memory access request of the token [8] to store the weight value of the third connection network 1360 in the cache memory 322 in advance.

Next, when the processor 310 generates a data access request of the token [8], the artificial neural network memory controller 320 determines whether the predicted data access request of the token [8] and the data access request of the token [8] are the same. When it is determined that the requests are the same, the weight value of the third connection network 1360 stored in the cache memory 322 may be immediately provided to the processor 310.

At this time, the artificial neural network memory controller 320 generates the predicted data access request of the token [9].

Next, the processor 310 receives the node value of the second hidden layer 1350 and the weight value of the third connection network 1360 to calculate the node value of the output layer 1370. When the processor 310 generates a data access request of the token [9], the artificial neural network memory controller 320 determines whether the predicted data access request of the token [9] and the data access request of the token [9] are the same. When it is determined that the requests are the same, the calculated node value of the output layer 1370 may be stored in the memory 330 and/or the cache memory 322.

Accordingly, the artificial neural network memory system 300 may store the inference result of the artificial neural network model 1300 in the output layer 1370.

Even though the inference of the artificial neural network model 1300 ends by the artificial neural network data locality pattern 1400, the artificial neural network memory system 300 may be prepared to immediately start the next inference.

That is, the artificial neural network memory system 300 of FIG. 11 may be configured to generate a predicted data access request based on the artificial neural network data locality, determine whether the predicted data access request and an actual data access request are the same, and if the requests are the same, further generate a next predicted data access request. According to the above-described configuration, the artificial neural network memory controller 320 may eliminate or reduce the latency of the memory 330 at the time of processing the data access request.

In some examples, the artificial neural network memory controller may be configured to operate to minimize an available space of the cache memory by generating at least one predicted data access request.

That is, the artificial neural network memory controller compares the memory available space of the cache memory and a size of the data value to be stored and when the memory available space of the cache memory is present, generates at least one predicted data access request to minimize the available space of the cache memory.

That is, the artificial neural network memory controller may be configured to generate a plurality of predicted data access requests in accordance with a capacity of the cache memory.

That is, the artificial neural network memory controller may be configured to sequentially generate at least one memory access request based on a remaining capacity of the cache memory to minimize the remaining capacity of the cache memory.

The example will be described with reference to FIGS. 2 to 6. When the processor generates a data access request of the token [1], the artificial neural network memory controller generate a predicted data access request of the token [2] to store the weight value of the first connection network 1320 in the cache memory in advance. Next, the artificial neural network memory controller may allocate a space for storing and reading the node value calculating result of the first hidden layer 1330 corresponding to the token [3] and the token [4] to the cache memory in advance. Next, the artificial neural network memory controller may store the weight value of the second connection network 1340 corresponding to the token [5] in the cache memory in advance. When there is a margin in the cache memory, the artificial neural network memory controller may be configured to further generate sequentially the predicted data access request based on the artificial neural network data locality pattern. That is, when there is a margin in the capacity of the cache memory, the artificial neural network memory controller may be configured to store weight values in the cache memory in advance based on the artificial neural network data locality pattern or ensure an area to store the artificial neural network operation result in advance.

If the capacity of the cache memory is sufficient, weight values of all connection networks of the artificial neural network model 1300 may be stored in the cache memory. Specifically, in the case of the artificial neural network model which completes the learning, the weight values are fixed. Accordingly, when the weight values reside in the cache memory, the latency of the memory caused by the memory access request to read the weight values may be eliminated.

According to the above-described configuration, the data required for the cache memory is stored based on the artificial neural network data locality to optimize an operational efficiency of the cache memory and improve the processing speed of the artificial neural network memory system 300.

According to the above-described configuration, the cache memory sequentially generates the predicted data access request in consideration of both the artificial neural network data locality pattern and the capacity of the cache memory so that the processing speed of the artificial neural network memory system may be improved.

According to the above-described configuration, when the processor generates a specific data access request included in the artificial neural network data locality pattern 1400, the artificial neural network memory controller may sequentially predict at least one data access request after the specific data access request. For example, when the processor generates the data access request of the token [1], the artificial neural network memory controller may predict that corresponding data access requests are generated in the order of tokens [2-3-4-5-6-7-8-9].

According to the above-described configuration, the artificial neural network memory controller 320 may cause the specific weight values to reside in the cache memory for a specific period. For example, when the processor infers at a speed of 30 times per second by utilizing the artificial neural network model, the weight value of the specific layer may reside in the cache memory. In this case, the artificial neural network memory controller may reutilize the weight value stored in the cache memory for every inference. Accordingly, the corresponding memory access request may be selectively deleted. Accordingly, the latency in accordance with the memory access request may be eliminated.

In some examples, the cache memory may be configured by a plurality of layered cache memories. For example, the cache memory may include a cache memory configured to store the weight value or a cache memory configured to store a feature map.

In some examples, when the artificial neural network data locality pattern 1400 is generated, the artificial neural network memory controller may be configured to predict the weight value and the node value based on the identification information included in the data access request. Accordingly, the artificial neural network memory controller may be configured to identify the data access request corresponding to the weight value. Specifically, when it is assumed that the learning is completed so that a weight value of the connection network is fixed, in the artificial neural network data locality pattern 1400, the weight value may be configured to operate only in the read mode. Accordingly, the artificial neural network memory controller may determine the token [2], the token [5], and the token [8] as weight values. In other words, the token [1] is a start step of the inference so that it may be determined as an input node value. In other words, the token [9] is a last step of the inference so that it may be determined as an output node value. In other words, the tokens [3] and [4] have orders of the write mode and the read mode of the same memory address value so that the tokens [3] and [4] may be determined as a node value of the hidden layer. However, it may vary depending on the artificial neural network data locality of the artificial neural network model.

The artificial neural network memory controller may be configured to analyze the artificial neural network data locality pattern to determine whether the data access request is a weight value, a kernel window value, a node value, an activation map value, or the like of the artificial neural network model.

In some examples, the artificial neural network memory system includes a processor configured to generate a data access request corresponding to the artificial neural network operation, an artificial neural network memory controller configured to store an artificial neural network data locality pattern generated by a compiler and generate a predicted data access request, which predicts a subsequent data access request of the data access request generated by the processor based on the artificial neural network data locality pattern; and a memory configured to communicate with the artificial neural network memory controller. The memory may be configured to operate in accordance with the memory access request output from the artificial neural network memory controller.

According to the above-described configuration, the artificial neural network memory controller may be configured to be provided with the artificial neural network data locality pattern generated from the compiler. In this case, the artificial neural network memory controller may allow the data access requests of the artificial neural network model, which is being processed by the processor, to be prepared in the cache memory in advance based on the artificial neural network data locality pattern generated by the compiler. Specifically, the artificial neural network data locality pattern generated by the compiler may be more accurate than the artificial neural network data locality pattern generated by monitoring the artificial neural network data locality.

In other words, the artificial neural network memory controller may be configured to respectively store the artificial neural network data locality pattern generated by the compiler and the artificial neural network data locality pattern generated by independently monitoring the data access request.

FIG. 12 illustrates exemplary identification information of a data access request.

A data access request generated by a processor according to the examples of the present disclosure may be configured to further include at least one piece of additional identification information. The additional identification information may also be referred to as a sideband signal or sideband information.

A data access request generated by the processor may be an interface signal with a specific structure. That is, the data access request may be an interface signal for the communication of the processor and the artificial neural network memory controller. The data access request may be configured to further include an additional bit to additionally provide identification information required for the artificial neural network operation, but the present disclosure is not limited thereto, and the additional identification information may be provided in various ways.

In some examples, the data access request of the artificial neural network memory system may be configured to further include identification information to identify whether it is an artificial neural network operation, but the examples of the present disclosure are not limited thereto.

For example, the artificial neural network memory system adds one bit of identification code to the data access request to identify whether the data access requests received by the artificial neural network memory controller is a data access request related to the artificial neural network operation. However, the number of bits of the identification code according to the examples of the present disclosure is not limited and may be adjusted in accordance with the number of cases of an object to be identified.

For example, when the identification code is [0], the artificial neural network memory controller may determine that the corresponding data access request is related to the artificial neural network operation.

For example, when the identification code is [1], the artificial neural network memory controller may determine that the corresponding data access request is not related to the artificial neural network operation.

In this case, the artificial neural network memory controller may be configured to generate the artificial neural network data locality pattern by recording only the data access request related to the artificial neural network operation based on the identification information included in the data access request. According to the above-described configuration, the artificial neural network memory controller may not record the data access request which is not related to the artificial neural network operation. By doing this, the accuracy of the artificial neural network data locality pattern generated by recording the data access requests may be improved, but the examples of the present disclosure are not limited thereto.

In some examples, the data access request of the artificial neural network memory system may be configured to further include identification information to identify whether the artificial neural network operation is an operation for learning or an operation for inference, but the examples of the present disclosure are not limited thereto.

For example, the artificial neural network memory system adds one bit of identification code to the data access request so that the data access requests received by the artificial neural network memory controller are configured to identify whether an operation type of the artificial neural network model is learning or inference. However, the number of bits of the identification code according to the examples of the present disclosure is not limited and may be adjusted in accordance with the number of cases of an object to be identified.

For example, when the identification code is [0], the artificial neural network memory controller may determine that the corresponding data access request is a learning operation.

For example, when the identification code is [1], the artificial neural network memory controller may determine that the corresponding data access request is an inference operation.

In this case, the artificial neural network memory controller may be configured to generate the artificial neural network data locality pattern by individually recording the data access request of the learning operation and the data access request of the inference operation. For example, in the learning mode, an evaluation step of updating each layer of the artificial neural network model and/or the weight values of the kernel window and determining an inference accuracy of the trained artificial neural network model may be further included. Accordingly, even though the structures of the artificial neural network models are the same, the artificial neural network data locality to be processed by the processor may be different in the learning operation and the inference operation.

According to the above-described configuration, the artificial neural network memory controller may be configured to separately generate the artificial neural network data locality pattern of the learning mode and the artificial neural network data locality pattern of the inference mode of the specific artificial neural network model. By doing this, the accuracy of the artificial neural network data locality pattern generated by recording the data access requests by the artificial neural network memory controller may be improved, but the examples of the present disclosure are not limited thereto.

In some examples, the data access request of the artificial neural network memory system may be configured with an operation mode including identification information to identify the memory read operation and the memory write operation, but not limited thereto, so that the data access request of the artificial neural network memory system may be configured with an operation mode which further includes the identification information to identify the overwrite operation and/or protective operation, but the examples of the present disclosure are not limited thereto.

For example, one bit of identification code is added to the data access request of the artificial neural network memory system to include the read operation and the write operation. Alternatively, two bits of identification code are added to the data access request of the artificial intelligence network memory system to identify the read operation, the write operation, the overwrite operation, and the protective operation. However, the number of bits of the identification code according to the examples of the present disclosure is not limited and may be adjusted in accordance with the number of cases of an object to be identified.

In other words, for the operation of the artificial neural network memory system, the data access request needs to include identification information to identify the memory address value and the read operation, and the write operation. The artificial neural network memory controller receives the data access request to generate a corresponding memory access request to perform the memory operation.

For example, when the identification code is [000], the artificial neural network memory controller may be configured to determine the corresponding data access request as a read operation.

For example, when the identification code is [001], the artificial neural network memory controller may be configured to determine the corresponding data access request as a write operation.

For example, when the identification code is [010], the artificial neural network memory controller may be configured to determine the corresponding data access request as an overwrite operation.

For example, when the identification code is [011], the artificial neural network memory controller may be configured to determine the corresponding data access request as a protection operation.

For example, when the identification code is [100], the artificial neural network memory controller may be configured to determine the corresponding data access request as a read-burst operation.

For example, when the identification code is [001], the artificial neural network memory controller may be configured to determine the corresponding data access request as a write-burst operation. However, examples of the present disclosure are not limited thereto.

According to the above-described configuration, the artificial neural network memory controller controls the memory in accordance with the read mode or the write mode to be provided with various data of the artificial neural network model or store the data in the memory.

According to the above-described configuration, the artificial neural network memory controller may update the weight value of the specific layer by the overwrite mode during the learning operation of the artificial neural network. Specifically, the updated weight value is stored in the same memory address value so that a new memory address may not be allocated. Accordingly, the overwrite mode may be more effective than the write mode during the learning operation.

According to the above-described configuration, the artificial neural network memory controller may protect data stored in the specific memory address by a protective mode. Specifically, in an environment in which a plurality of users is accessing, like a server, the data of the artificial neural network model may not be arbitrarily eliminated. Further, the weight values of the artificial neural network model which ends the learning may be protected with the protective mode.

In some examples, the data access request of the artificial neural network memory system may be configured to further include identification information capable of identifying inference data, a weight, a feature map, a learning data set, an evaluation data set, and others, but the examples of the present disclosure are not limited thereto.

For example, the artificial neural network memory system may be configured to add three bits of identification code to the data access request to allow the artificial neural network memory controller to identify a domain of the data to access. However, the number of bits of the identification code according to the examples of the present disclosure is not limited and may be adjusted in accordance with the number of cases of an object to be identified.

For example, when the identification code is [000], the artificial neural network memory controller may determine that the corresponding data is data which is not related to the artificial neural network model.

For example, when the identification code is [001], the artificial neural network memory controller may determine that the corresponding data is the inference data of the artificial neural network model.

For example, when the identification code is [010], the artificial neural network memory controller may determine that the corresponding data is the feature map of the artificial neural network model.

For example, when the identification code is [011], the artificial neural network memory controller may determine that the corresponding data is the weight of the artificial neural network model.

For example, when the identification code is [100], the artificial neural network memory controller may determine that the corresponding data is the learning data set of the artificial neural network model.

For example, when the identification code is [101], the artificial neural network memory controller may determine that the corresponding data is the inference data set of the artificial neural network model.

According to the above-described configuration, the artificial neural network memory controller may be configured to identify the domain of the data of the artificial neural network model and to allocate an address of a memory in which data corresponding to the domain is stored. For example, the artificial neural network memory controller may set a starting address and the end address of the memory area allocated to the domain. According to the above-described configuration, the data allocated to the domain may be stored to correspond to the order of the artificial neural network data locality pattern.

For example, data of the domain of the artificial neural network model may be sequentially stored in the memory area allocated to the domain. At this time, the memory may be a memory which supports a read-burst function. According to the above-described configuration, when the artificial neural network memory controller reads data of a specific domain from the memory, the specific data may be configured to be stored in accordance with the artificial neural network data locality pattern to be optimized for the read-burst function. That is, the artificial neural network memory controller may be configured to set the storage area of the memory in consideration of the read-burst function.

In some examples, the memory further includes a read-burst function and at least one artificial neural network memory controller may be configured to write the storage area of at least one memory in consideration of the read-burst function.

In some examples, the data access request of the artificial neural network memory system may be configured to further include identification information to identify the quantization of the artificial neural network model, but the examples of the present disclosure are not limited thereto.

For example, when the data access request includes at least the memory address value, the domain, and the quantization identification information, the artificial neural network memory system may be configured to identify the quantization information of the data of the domain.

For example, when the identification code is [00001], the artificial neural network memory controller may determine that the corresponding data is data quantized to one bit.

For example, when the identification code is [11111], the artificial neural network memory controller may determine that the corresponding data is data quantized to 32 bits.

In some examples, various identification information may be selectively included in the data access request.

According to the above-described configuration, the artificial neural network memory controller analyzes the identification code of the data access request to generate a more accurate artificial neural network data locality pattern. Further, each identification information is figured out to selectively control the storage policy of the memory.

For example, when the learning and the inference are identified, each artificial neural network data locality pattern may be generated.

For example, when the domain of the data is identified, a policy of storing the data of the artificial neural network data locality pattern in a specific memory area is established to improve the efficiency of the memory operation.

In some examples, when the artificial neural network memory system is configured to process a plurality of artificial neural network models, the artificial neural network memory controller may be configured to further generate identification information of the artificial neural network model, for example, additional identification information, such as a first artificial neural network model or a second artificial neural network model. At this time, the artificial neural network memory controller may be configured to distinguish the artificial neural network model based on the artificial neural network data locality of the artificial neural network model, but the present disclosure is not limited thereto.

The sideband signal and artificial neural network (ANN) data locality information shown in FIG. 12 may be selectively integrated or separated.

Artificial Neural Network Calculation: it is possible to determine whether ANN operation of the corresponding data is performed in the SAM MEMORY CONTROLLER.

Operation type: it is possible to determine whether the corresponding data is training or inference in the SAM MEMORY CONTROLLER (schedule for weight value update in inference mode).

Operation mode: RAM can be controlled in the SAM MEMORY CONTROLLER. (In the case of the kernel, it can be refreshed by looking at the domain, and in the case of the feature map, it can be read-discarded.)

DOMAIN: it may be information required for MEMORY MAP setting in SAM MEMORY CONTROLLER. (DOMAIN may allocate the same data to a specific area according to ANN data locality information.)

Quantization: SAM MEMORY CONTROLLER may provide quantization information of the corresponding data.

ANN MODEL #: SAM MEMORY CONTROLLER may allocate each model to MEMORY MAP according to ANN data locality information. The minimum ANN's total DATA size can be secured.

MULTI-THREAD: SAM MEMORY CONTROLLER may share the kernel and allocate individual feature maps, respectively, according to the number of THREADs of each ANN MODEL.

ANN data locality: it is information meaning a specific processing stage of the data locality information of the ANN.

On the other hand, all sideband signals may be implemented as PACKET.

Figure 13:
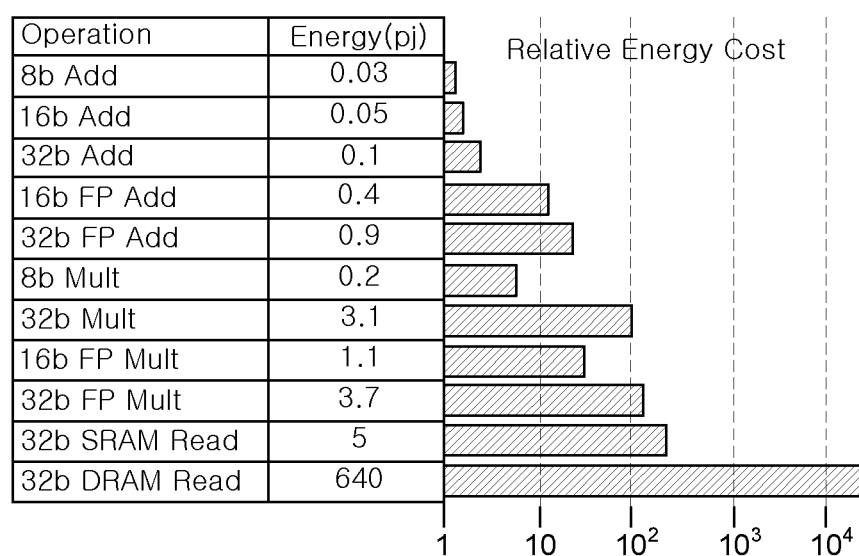
FIG. 13 is a diagram for explaining energy consumption per unit operation of an artificial neural network memory system.

FIG. 13 is a diagram for explaining energy consumption per unit operation of an artificial neural network memory system.

Referring to FIG. 13, in a table, an energy consumed per unit operation of the artificial neural network memory system 300 is schematically explained. The energy consumption may be explained to be divided into a memory access, an addition operation, and a multiplication operation.

"8b Add" refers to 8-bit integer addition operation of an adder. The 8-bit integer addition operation may consume energy of 0.03 pj.

"16b Add" refers to 16-bit integer addition operation of an adder. The 16-bit integer addition operation may consume energy of 0.05 pj.

"32b Add" refers to 32-bit integer addition operation of an adder. The 32-bit integer addition operation may consume energy of 0.1 pj.

"16b FP Add" refers to 16-bit floating point addition operation of an adder. The 16-bit floating point addition operation may consume energy of 0.4 pj.

"32b FP Add" refers to 32-bit floating point addition operation of an adder. The 32-bit floating point addition operation may consume energy of 0.9 pj.

"8b Mult" refers to 8-bit integer multiplication operation of a multiplier. The 8-bit integer multiplication operation may consume energy of 0.2 pj.

"32b Mult" refers to 32-bit integer multiplication operation of a multiplier. The 32-bit integer multiplication operation may consume energy of 3.1 pj.

"16b FP Mult" refers to 16-bit floating point multiplication operation of a multiplier. The 16-bit floating point multiplication operation may consume energy of 1.1 pj.

"32b FP Mult" refers to 32-bit floating point multiplication operation of a multiplier. The 32-bit floating point multiplication operation may consume energy of 3.7 pj.

"32b SRAM Read' refers to 32-bit data read access when the cache memory 322 of the artificial neural network memory system 300 is a static random access memory (SRAM). An energy of 5 pj may be consumed to read 32 bits of data from the cache memory 322 to the processor 310.

"32b DRAM Read' refers to 32-bit data read access when the memory 330 of the artificial neural network memory system 300 is a DRAM. An energy of 640 pj may be consumed to read 32 bits of data from the memory 330 to the processor 310. The energy unit is picojoules (pj).

When the 32-bit floating point multiplication and 8-bit integer multiplication which are performed by the artificial neural network memory system 300 are compared, the difference in the energy consumed per unit operation is approximately 18.5 times. When 32-bit data is read from the memory 330 configured by the DRAM and 32-bit data is read from the cache memory 322 configured by the SRAM, the difference in the energy consumed per unit operation is approximately 128 times.

That is, from the viewpoint of the power consumption, the larger the bit size of the data, the more the power consumption. Further, when the floating point operation is used, the power consumption is increased more than the integer operation. Further, when the data is read from the DRAM, the power consumption is rapidly increased.

In the artificial neural network memory system 300 according to still another example of the present disclosure, a capacity of the cache memory 322 may be configured to be enough to store all the data values of the artificial neural network model 1300.

The cache memory according to the examples is not limited to the SRAM. Examples of the static memories which are capable of performing a high speed operation like the SRAM include SRAM, MRAM, STT-MRAM, eMRAM, OST-MRAM, and the like. Moreover, MRAM, STT-MRAM, eMRAM, and OST-MRAM are static memories having a non-volatile characteristic. Accordingly, when the power of the artificial neural network memory system 300 is shut off and then rebooted, the artificial neural network model 1300 does not need to be provided from the memory 330 again, but the examples according to the present disclosure are not limited thereto.

According to the above-described configuration, when the artificial neural network memory system 300 performs the inference operation of the artificial neural network model 1300 based on the artificial neural network data locality pattern 1400, the power consumption due to the reading operation of the memory 330 may be significantly reduced.

Figure 14:
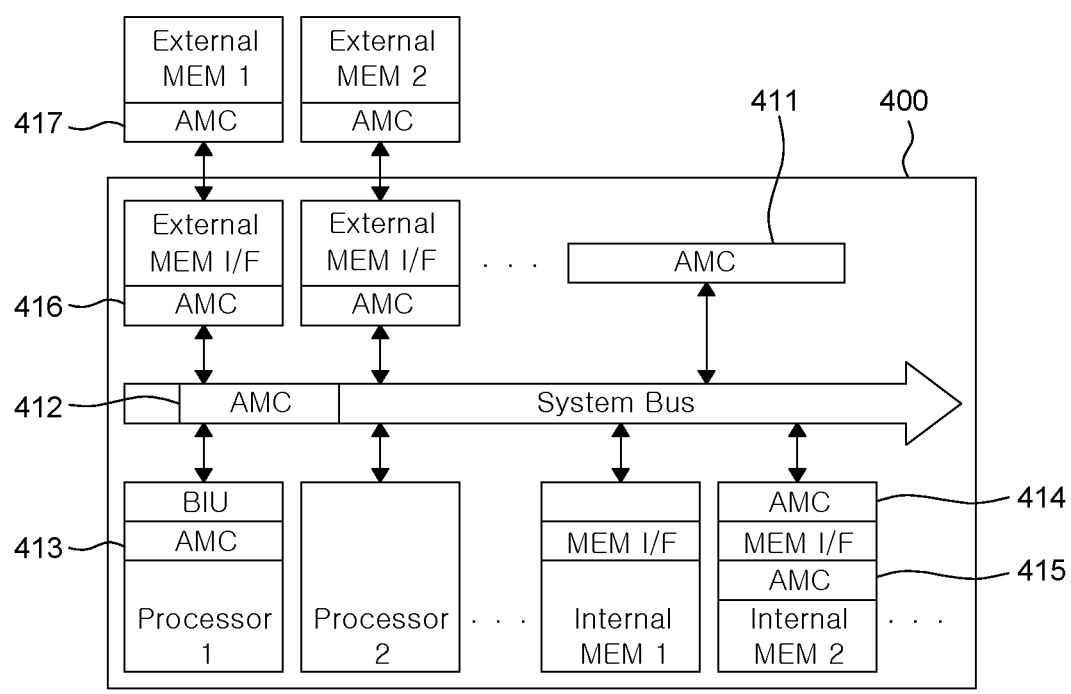
FIG. 14 is a schematic diagram for explaining an artificial neural network memory system according to various examples of the present disclosure.

FIG. 14 is a schematic diagram for explaining an artificial neural network memory system according to various examples of the present disclosure.

Hereinafter, various examples according to the present disclosure will be described with reference to FIG. 14. FIG. 14 may explain the number of various cases in which various examples according to the present disclosure may be carried out.

According to various examples of the present disclosure, an artificial neural network memory system 400 includes at least one processor, at least one memory, and at least one artificial neural network memory controller AMC configured to include at least one processor and receive a data access request from at least one processor to provide the memory access request to at least one memory. The at least one AMC may be configured to be substantially the same as the exemplary artificial neural network memory controllers 120, 220, and 320. However, it is not limited thereto, and one artificial neural network memory controller of the artificial neural network memory system 400 may be configured to be different from the other artificial neural network memory controllers. Hereinafter, the repeated description of the artificial neural network memory controllers 411, 412, 413, 414, 415, 416, and 517 and the above-described artificial neural network memory controllers 120, 220, and 320 will be omitted for the convenience of description.

The at least one artificial neural network memory controller is configured to connect at least one processor and at least one memory. At this time, in a data transferring path between at least one processor and at least one memory, there may be a corresponding artificial neural network data locality. Accordingly, the artificial neural network memory controller located in the data transferring path may be configured to extract the corresponding artificial neural network data locality pattern.

Each AMC may be configured to monitor each data access request to generate an artificial neural network data locality pattern. The artificial neural network memory system 400 may be configured to include at least one processor. The at least one processor may be configured to process the artificial neural network operation alone or in cooperation with other processors.

The artificial neural network memory system 400 may be configured to include at least one internal memory. The artificial neural network memory system 400 may be configured to be connected to at least one external memory. The internal memory or the external memory may include a dynamic RAM (DRAM), a high bandwidth memory (HBM), a static RAM (SRAM), a programmable ROM (PROM), an erasable PROM (EPROM), an electrically erasable PROM (EEPROM), a flash memory, a ferroelectric RAM (FRAM), a flash memory, a magnetic RAM (MRAM), a hard disk, a phase change memory device (phase change RAM), and the like, but the present disclosure is not limited thereto.

External memory (External MEM 1, External MEM 2) or internal memory (Internal MEM1, Internal MEM2) can communicate with the artificial neural network memory system 400 via corresponding memory interface (External MEM I/F).

A processor (Processor 1) can include bus interface unit (BIU) communicating with a system bus.

The artificial neural network memory system 400 may include an external memory interface connected to the external memory (External MEM). The external memory interface transmits the memory access request to at least one external memory of the artificial neural network memory system 400 and may receive data in response to the memory access request from the at least one external memory. The configurations and functions disclosed in the exemplary artificial neural network memory controllers 120, 220, and 320 are distributed to a plurality of artificial neural network memory controllers 411, 412, 413, 414, 415, 416, and 517 to be disposed in a specific position of the artificial neural network memory system 400. In some examples, the processor may be configured to include an artificial neural network memory controller.

In some examples, the memory may be a DRAM and, in this case, the artificial neural network memory controller may be configured to be included in the DRAM.

For example, at least one of the artificial neural network memory controllers 411, 412, 413, 414, 415, 416, and 517 may be configured to include a cache memory. Further, the cache memory may be configured to be included in the processor, the internal memory and/or the external memory.

For example, at least one of the artificial neural network memory controllers 411, 412, 413, 414, 415, 416, and 517 may be configured to be distributed in the data transferring path between the memory and the processor.

For example, the artificial neural network memory controller which may be implemented in the artificial neural network memory system 400 may be configured by one of an independently configured artificial neural network memory controller 411, an artificial neural network memory controller 412 included in the system bus, an artificial neural network memory controller 413 configured as an interface of the processor, an artificial neural network memory controller 414 included in a wrapper block between the memory interface of the internal memory and the system bus, an artificial neural network memory controller included in the memory interface of the internal memory, an artificial neural network memory controller 415 included in the internal memory, an artificial neural network memory controller included in a memory interface corresponding to the external memory, an artificial neural network memory controller 416 included in the wrapper block between the memory interface of the external memory and the system bus and/or an artificial neural network memory controller 517 included in the external memory. However, the artificial neural network memory controller according to the examples of the present disclosure is not limited thereto.

For example, individual artificial neural network data locality patterns generated by the first artificial neural network memory controller 411 and the second artificial neural network memory controller 412 may be the same or may be different from each other.

In other words, the first artificial neural network memory controller 411 may be configured to connect a first processor (Processor 1) and a first internal memory internal MEM1 by means of the system bus. At this time, in the data transferring path between the first processor (Processor 1) and the first internal memory internal MEM1, there may be a first artificial neural network data locality.

In such case, the third artificial neural network memory controller 413 is illustrated in said path. However, it is merely illustrative and the third artificial neural network memory controller 413 may be omitted. That is, when at least one artificial neural network memory controller is disposed between the processor and the memory, the artificial neural network data locality pattern of the artificial neural network model which is processed by the processor may be generated.

In other words, the second artificial neural network memory controller 412 may be configured to connect a second processor (Processor 2) and a first external memory external MEM1. At this time, in the data transferring path between the second processor (Processor 2) and the first external memory external MEM1, there may be a second artificial neural network data locality.

For example, a first artificial neural network model which is processed by the first processor (Processor 1) may be an object recognition model, and a second artificial neural network model which is processed by the second processor (Processor 2) may be a voice recognition model. Accordingly, the artificial neural network models may be different from each other, and corresponding artificial neural network data locality patterns may also be different from each other.

That is, the artificial neural network data locality patterns generated by the artificial neural network memory controllers 411, 412, 413, 414, 415, 416, and 517 may be determined in accordance with a pattern characteristic of the data access request generated by the corresponding processor.

That is, even though the artificial neural network memory controller of the artificial neural network memory system 400 is disposed between an arbitrary processor and an arbitrary memory, the artificial neural network memory controller may provide adaptability to generate the artificial neural network data locality pattern in the corresponding position. In other words, when two processors cooperate to process one artificial neural network model in parallel, the artificial neural network data locality pattern of the artificial neural network model may be divided to be assigned to each processor. For example, a convolution operation of a first layer is processed by a first processor and a convolution operation of a second layer is processed by a second processor to distribute the operation of the artificial neural network model. In this case, even though the artificial neural network model is the same, the artificial neural network data locality of the artificial neural network model processed by the respective processors may be reconstructed in the unit of the data access request. In this case, each artificial neural network memory controller may provide adaptability to generate an artificial neural network data locality pattern corresponding to the data access request of the processor which is processed by the artificial neural network memory controller.

The data access request unit may include at least one word unit. The ANN DL unit may include at least one data access request unit.

According to the above-described configuration, even though the plurality of artificial neural network memory controllers is distributed between a plurality of processors and a plurality of memories, the performance of the artificial neural network memory system 400 may be optimized by the artificial neural network data locality patterns generated to be suitable for each situation. That is, each artificial neural network memory controller analyzes the artificial neural network data locality in its position to be optimized for the artificial neural network operation which is variably processed in real time.

In some examples, at least one of the artificial neural network memory controllers 411, 412, 413, 414, 415, 416, and 517 may be configured to confirm at least one information of the number of memories, a memory type, an effective bandwidth of a memory, a latency of a memory, and a memory size.

In some examples, at least one of the artificial neural network memory controllers 411, 412, 413, 414, 415, 416, and 517 may be configured to measure an effective bandwidth of a memory which responds to the memory access request. Here, the memory may be at least one memory and each artificial neural network memory controller may measure an effective bandwidth of a channel which communicates with each memory. The effective bandwidth may be calculated by measuring a time that the artificial neural network memory controller generates a memory access request and the memory access request ends and a data transfer bit rate.

In some examples, at least one of the artificial neural network memory controllers 411, 412, 413, 414, 415, 416, and 517 may be configured to be provided with a necessary bandwidth of at least one memory which responds to the memory access request.

In some examples, the artificial neural network memory system 400 includes a plurality of memories and at least one artificial neural network memory controller may be configured to measure effective bandwidths of the plurality of memories.

In some examples, the artificial neural network memory system 400 includes a plurality of memories and at least one artificial neural network memory controller may be configured to measure the latencies of the plurality of memories.

That is, at least one artificial neural network memory controller may be configured to perform auto-calibration of memories connected thereto. The auto-calibration may be configured to be executed when the artificial neural network memory system starts or at a specific cycle. At least one artificial neural network memory controller may be configured to collect information such as the number of memories connected thereto, a type of the memory, an effective bandwidth of the memory, a latency of the memory, and a size of the memory, by means of the auto-calibration.

According to the above-described configuration, the artificial neural network memory system 400 may know the latency and the effective bandwidth of the memory corresponding to the artificial neural network memory controller.

According to the above-described configuration, even though an independent artificial neural network memory controller is connected to the system bus, an artificial neural network data locality of an artificial neural network model which is being processed by the processor is generated to control the memory.

In some examples, at least one artificial neural network memory controller of the artificial neural network memory system 400 may be configured to calculate a time taken to repeat the artificial neural network data locality pattern one time and calculate a data size, in order to calculate an effective bandwidth required for the artificial neural network operation. Specifically, when all the data access requests included in the artificial neural network data locality pattern are processed, it is determined that the processor completes the inference of the artificial neural network model. The artificial neural network memory system 400 may be configured to measure a time taken to perform one inference based on the artificial neural network data locality pattern to calculate the number of inferences per second (IPS). Further, the artificial neural network memory system 400 may be provided with target inference number per second information from the processor. For example, a specific application requires 30 IPS as the inference rate of a specific artificial neural network model. If the measured IPS is lower than a target IPS, the artificial neural network memory controller 400 may be configured to operate to improve the artificial neural network model processing speed of the processor.

In some examples, the artificial neural network memory system 400 may be configured to include a system bus configured to control communication of an artificial neural network memory controller, a processor, and a memory. Further, at least one artificial neural network memory controller may be configured to have a master authority of the system bus.

In other words, the artificial neural network memory system 400 may not be a dedicated device for the artificial neural network operation. In this case, various peripheral devices such as WIFI devices, displays, cameras, or microphones may be connected to the system bus of the artificial neural network memory system 400. In this case, the artificial neural network memory system 400 may be configured to control the bandwidth of the system bus for stable artificial neural network operation.

In some examples, at least one artificial neural network memory controller may operate to preferentially process the artificial neural network operation for the processing time of the memory access request and to process operations other than the artificial neural network operation for the other (remaining) time.

In some examples, at least one artificial neural network memory controller may be configured to ensure an effective bandwidth of the system bus until at least one memory completes a memory access request.

In some examples, at least one artificial neural network memory controller is disposed in the system bus and the system bus may be configured to dynamically change the bandwidth of the system bus based on the artificial neural network data locality pattern generated in the system bus.

In some examples, at least one artificial neural network memory controller is disposed in the system bus and at least one artificial neural network memory controller may be configured to increase the control authority of the system bus to be higher than that when there is no memory access request, until at least one memory completes the response for the memory access request.

In some examples, at least one artificial neural network memory controller may be configured to set a priority of a data access request of a processor which processes an artificial neural network operation, among a plurality of processors, to be higher than that of a processor which processes an operation other than the artificial neural network operation.

In some examples, the artificial neural network memory controller may be configured to directly control the memory.

In some examples, the artificial neural network memory controller is included in the memory and the artificial neural network memory controller may be configured to generate at least one access queue. The artificial neural network memory controller may be configured to separately generate an access queue dedicated for the artificial neural network operation.

In some examples, at least one of the plurality of memories may be a SAM or a DRAM. In this case, at least one artificial neural network memory controller may be configured to readjust the access queue of the memory access requests. The access queue readjustment may be an access queue re-order.

In some examples, the artificial neural network memory controller may be configured to include an access queue of a plurality of memory access requests. In this case, the first access queue may be an access queue dedicated to the artificial neural network operation and the second access queue may be an access queue for operations other than the artificial neural network operation. The artificial neural network memory controller may be configured to provide data by selecting each access queue in accordance with the priority setting.

In some examples, at least one artificial neural network memory controller may be configured to calculate a specific bandwidth required for the system bus to process a specific memory access request based on the artificial neural network data locality pattern, and at least one artificial neural network memory controller may be configured to control the effective bandwidth of the system bus based on the specific bandwidth.

According to the above-described configuration, the artificial neural network memory system 400 may be configured to lower the priority of the memory access requests of various peripheral devices or raise a priority of a predicted data access request based on the artificial neural network data locality pattern.

According to the above-described configuration, the artificial neural network memory controller readjusts the processing order of the data access request of the system bus to fully utilize the bandwidth of the system bus while the artificial neural network operation is processed and to yield the bandwidth for processing data of other peripheral devices when there is no artificial neural network operation.

According to the above-described configuration, the artificial neural network memory controller may readjust the processing sequence of the data access request based on the artificial neural network data locality pattern. Further, the artificial neural network memory controller readjusts the priority based on identification information included in the data access request. That is, from the viewpoint of the artificial neural network operation, the effective bandwidth of the system bus dynamically varies so that the effective bandwidth may be improved. Accordingly, an operation efficiency of the system bus may be improved. Accordingly, the effective bandwidth of the system bus may be improved from the viewpoint of the artificial neural network memory controller.

In some examples, at least one artificial neural network memory controller may be configured to perform machine learning of the data access request. That is, at least one artificial neural network memory controller may further include an artificial neural network model which is configured to machine-learn the artificial neural network data locality pattern. That is, the artificial neural network data locality pattern is machine-learned so that specific patterns, whereby another data access request is interrupted in the middle of the data access request processing according to the actual artificial neural network data locality, are learned in order to be predicted.

When a predicted data access request is generated, the artificial neural network model embedded in the artificial neural network memory controller may be machine-trained to increase the control authority of the system bus to be higher than when the predicted data access requests are not generated.

In some examples, at least one artificial neural network memory controller further includes a plurality of layered cache memories and at least one artificial neural network memory controller may be configured to perform machine-learning of data access requests between layers of the plurality of layered cache memories.

In some examples, at least one artificial neural network memory controller may be configured to be provided with at least one of an effective bandwidth, a power consumption, and latency information of each layer of the plurality of layered cache memories.

According to the above-described configuration, the artificial neural network memory controller may be configured to generate an artificial neural network data locality pattern by means of the machine learning, and the machine-learned artificial neural network data locality pattern may improve a probability of predicting a specific pattern occurrence when various data access requests regardless of the artificial neural network operation are generated with the specific pattern. Further, characteristics of various artificial neural network models and other operations processed by the processor are predicted by the reinforcement learning to improve the efficiency of the artificial neural network operation.

In some examples, at least one artificial neural network memory controller may be configured to divide and store data to be stored in the plurality of memories based on the effective bandwidth and the latency of each of the plurality of memories.

For example, data is configured by L bits of bit groups and a plurality of memories includes a first memory and a second memory. The first memory is configured to divide and store M bits of data from the L bits of bit groups based on a first effective bandwidth or a first latency and the second memory is configured to divide and store N bits of data from the L bits of bit groups based on a second effective bandwidth or a second latency. The sum of M bits and N bits may be configured to be smaller than or equal to the L bits. Further, the plurality of memories further includes a third memory and the third memory is configured to store O bits of data from the L bits of bit groups based on a third effective bandwidth or a third latency, and the sum of the M bits, N bits, and O bits may be configured to be equal to the L bits.

For example, the data is configured by P data packets and a plurality of memories includes a first memory and a second memory. The first memory is configured to store R data packets among P data packets based a first effective bandwidth or a first latency and the second memory is configured to store S data packets among P data packets based a second effective bandwidth or a second latency. The sum of R and S may be configured to be smaller than or equal to P. In addition, the plurality of memories further includes a third memory and the third memory is configured to store T data packets from the P data packets based on a third effective bandwidth or a third latency, and the sum of R, S, and T may be configured to be equal to P.

According to the above-described configuration, when a bandwidth of one memory is low, the artificial neural network memory controller may distribute the data to be stored or read, so that the effective bandwidth of the memory may be improved. For example, the artificial neural network memory controller may be configured to divide 8 bits of quantized weight value to store or read 4 bits in the first memory and 4 bits in the second memory. Accordingly, the effective bandwidth of the memory may be improved from the viewpoint of the artificial neural network memory controller.

The artificial neural network memory controller may be configured to further include a cache memory which is configured to merge and store data which is divided to be stored in the plurality of memories. That is, at least one artificial neural network memory controller further includes a cache memory and may be configured to merge data distributed to be stored in the plurality of memories to store the merged data in the cache memory. Accordingly, the processor may be provided with the merged data.

In order to merge the divided data, at least one artificial neural network memory controller may be configured to store division information of the data which is divided to be stored in the plurality of memories. Various examples of the present disclosure will be described as follows.

According to one example of the present disclosure, the artificial neural network memory system may be configured to include at least one processor configured to generate a data access request corresponding to the artificial neural network operation and at least one artificial neural network memory controller configured to generate an artificial neural network data locality pattern of an artificial neural network operation by sequentially recording the data access request and to generate a predicted data access request which predicts a subsequent data access request of the data access request generated by at least one processor based on the artificial neural network data locality pattern. Here, the artificial neural network data locality is an artificial neural network data locality which is reconstructed at a processor-memory level.

According to the examples of the present disclosure, the artificial neural network memory system may be configured to include at least one processor configured to process the artificial neural network model and at least one artificial neural network memory controller configured to store artificial neural network data locality information of an artificial neural network model and to predict data to be requested by at least one processor based on the artificial neural network data locality information to generate a predicted data access request.

The artificial neural network memory system may be configured to further include at least one memory and a system bus configured to control communication of the artificial neural network memory controller, at least one processor, and at least one memory. According to the example of the present disclosure, the artificial neural network memory system includes a processor, a memory, and a cache memory and is configured to generate a predicted data access request including data to be requested by the processor based on the artificial neural network data locality information and to store data corresponding to the predicted data access request from the memory in the cache memory before the processor requests.

According to the example of the present disclosure, the artificial neural network memory system may be configured to operate in either one of a first mode configured to operate by receiving the artificial neural network data locality information and a second mode configured to operate by observing data access requests generated by the processor to predict the artificial neural network data locality information.

At least one artificial neural network memory controller may be configured to sequentially further generate a predicted data access request based on the artificial neural network data locality pattern.

At least one artificial neural network memory controller may be configured to generate a predicted data access request before generating a subsequent data access request.

At least one processor may be configured to transmit a data access request to at least one artificial neural network memory controller.

At least one artificial neural network memory controller may be configured to output a predicted data access request in response to a data access request.

The data access request may be configured to further include a memory address.

The data access request may be configured to further include a start address and an end address of the memory.

At least one artificial neural network memory controller may be configured to generate a memory access request based on one of the data access requests generated by at least one processor and the predicted data access request generated by the artificial neural network memory controller.

The data access request may be configured to further include a start address of the memory and a continuous data read trigger.

The data access request may be configured to further include a start address of the memory and information of the number of continuous data.

The data access request and the predicted data access request may be configured to further include a data access request token of the same matching memory address.

The data access request may be configured to further include identification information to identify whether it is a memory read command or a write command.

The data access request may be configured to further include identification information to identify whether it is a memory overwrite command.

The data access request may be configured to further include identification information to identify whether it is inference data, weight data, or feature map data.

The data access request may be configured to further include identification information to identify whether it is learning data or evaluation data.

The data access request may be configured to further include identification information to identify whether the artificial neural network operation is an operation for learning or an operation for inference.

When at least one processor generates a subsequent data access request, at least one artificial neural network memory controller may be configured to determine whether a predicted data access request and a subsequent data access request are the same requests.

When the predicted data access request and the subsequent data access request are the same requests, at least one artificial neural network memory controller may be configured to maintain the artificial neural network data locality pattern.

When the predicted data access request and the subsequent data access request are different, at least one artificial neural network memory controller may be configured to update the artificial neural network data locality pattern.

The artificial neural network data locality pattern may be configured to further include data in which addresses of the memory of the data access requests are sequentially recorded.

At least one artificial neural network memory controller may be configured to generate the artificial neural network data locality pattern by detecting the repeated pattern of the memory address included in the data access request.

The artificial neural network data locality pattern may be configured by memory addresses having a repeated loop characteristic.

The artificial neural network data locality pattern may be configured to further include identification information for identifying the start and the end of the operation of the artificial neural network model.

At least one processor may be configured to be provided with data corresponding to the data access request from the artificial neural network memory controller.

At least one artificial neural network memory controller may be configured to further include an artificial neural network model which is configured to machine-learn the artificial neural network data locality pattern.

At least one artificial neural network memory controller may be configured to store an updated pattern and an advance pattern of the artificial neural network data locality pattern to determine whether the artificial neural network model is changed.

At least one artificial neural network memory controller may be configured to determine whether the data access requests are requests of one artificial neural network model or are mixtures of the requests of the plurality of artificial neural network models.

When there is a plurality of artificial neural network models, at least one artificial neural network memory controller may be configured to further generate artificial neural network data locality patterns corresponding to the number of artificial neural network models.

At least one artificial neural network memory controller may be configured to individually generate corresponding predicted data access requests based on the artificial neural network data locality patterns.

At least one artificial neural network memory controller may be configured to further generate a data access request corresponding to the data access request.

At least one artificial neural network memory controller may be configured to further generate a data access request corresponding to the predicted data access request.

Each of the data access request, the predicted data access request, and the memory access request may be configured to include the corresponding memory address value and operation mode.

At least one artificial neural network memory controller may be configured to further generate a memory access request including at least a part of information included in the data access request and the predicted data access request.

At least one memory configured to communicate with at least one artificial neural network memory controller is further included, and at least one memory may be configured to operate in response to the memory access request output from at least one artificial neural network memory controller.

At least one memory may be configured to store at least one of inference data, weight data, and feature map data.

At least one neural network artificial neural network memory controller may be configured to further include a cache memory configured to store data transmitted from at least one memory in response to the memory access request.

When at least one processor outputs a subsequent data access request, at least one artificial neural network memory controller determines whether the predicted data access request and the subsequent (i.e., next) data access request are the same requests. If the predicted data access request and the subsequent data access request are the same, at least one artificial neural network memory controller may be configured to provide data stored in the cache memory to at least one processor and if the predicted data access request and the subsequent data access request are not the same, at least one artificial neural network memory controller may be configured to generate a new memory access request based on the subsequent data access request.

At least one artificial neural network memory controller sequentially generates at least one memory access request based on a remaining capacity of the cache memory to minimize the remaining capacity of the cache memory.

At least one artificial neural network memory controller may be configured to measure an effective bandwidth of at least one memory which responds to the memory access request.

At least one artificial neural network memory controller may be configured to be provided with a necessary bandwidth of at least one memory which responds to the memory access request.

At least one artificial neural network memory controller may be configured to measure the number of inferences per second (IPS) of the artificial neural network operation by calculating the number of repeating times of the artificial neural network data locality patterns for a specific time.

At least one artificial neural network memory controller may be configured to calculate a time taken to repeat the artificial neural network data locality pattern one time and calculate a data size, in order to calculate an effective bandwidth required for the artificial neural network operation.

At least one memory further includes a DRAM including a refresh function to update a voltage of a memory cell and at least one artificial neural network memory controller may be configured to selectively control the refresh of a memory address area of at least one memory corresponding to the memory access request corresponding to the predicted data access request.

At least one memory further includes a precharge function to charge a global Bitline of the memory with a specific voltage and at least one artificial neural network memory controller may be configured to selectively provide precharge to a memory address area of at least one memory corresponding to the memory access request corresponding to the predicted data access request.

At least one memory further includes a plurality of memories and at least one artificial neural network memory controller may be configured to measure effective bandwidths of the plurality of memories, respectively.

At least one memory further includes a plurality of memories and at least one artificial neural network memory controller may be configured to measure latencies of the plurality of memories, respectively.

At least one memory further includes a plurality of memories and at least one artificial neural network memory controller may be configured to divide and store data to be stored in the plurality of memories based on the effective bandwidth and the latency of each of the plurality of memories.

Data is configured by L bits of bit groups and a plurality of memories further includes a first memory and a second memory. The first memory is configured to divide and store M bits of data from the L bits of bit groups based on a first effective bandwidth or a first latency and the second memory is configured to divide and store N bits of data from the L bits of bit groups based on a second effective bandwidth or a second latency. The sum of M bits and N bits may be configured to be smaller than or equal to the L bits.

The plurality of memories further includes a third memory and the third memory is configured to store O bits of data from the L bits of bit groups based on a third effective bandwidth or a third latency, and the sum of the M bits, N bits, and O bits may be configured to be equal to the L bits.

At least one artificial neural network memory controller may be configured to further include a cache memory which is configured to merge and store data which is divided to be stored in the plurality of memories.

Data is configured by P data packets, and a plurality of memories includes a further first memory and a second memory. The first memory is configured to store R data packets among P data packets based a first effective bandwidth or a first latency and the second memory is configured to store S data packets among P data packets based a second effective bandwidth or a second latency. The sum of R and S may be configured to be smaller than or equal to P.

The plurality of memories further includes a third memory and the third memory is configured to store T data packets from the P data packets based on a third effective bandwidth or a third latency, and the sum of R, S, and T may be configured to be equal to P.

At least one memory further includes a plurality of memories, and at least one artificial neural network memory controller further includes a cache memory and is configured to merge data distributed to be stored in the plurality of memories to store the merged data in the cache memory.

At least one memory further includes a plurality of memories, and at least one artificial neural network memory controller may be configured to store divided information of the data which is divided to be stored in the plurality of memories.

At least one artificial neural network memory controller may be configured to store a part of the data in the cache memory as much as the latency, based on the predicted data access request and the latency value of at least one memory.

At least one artificial neural network memory controller may be configured to store a part of the data in the cache memory based on the predicted data access request and a required data bandwidth of at least one memory.

When at least one processor generates a subsequent data access request, at least one artificial neural network memory controller provides data stored in cache memory first and controls the remaining data in a read-burst mode, from at least one memory, to reduce the latency of at least one memory.

When at least one processor generates a subsequent data access request based on the predicted data access request and the latency value of at least one memory, at least one artificial neural network memory controller starts with a read-burst mode of at least one memory in advance by as much as the latency value, to reduce the latency of at least one memory.

A system bus configured to control communication of the artificial neural network memory controller, at least one processor, and at least one memory may be further included.

At least one artificial neural network memory controller may be configured to have a master authority of the system bus.

At least one artificial neural network memory controller further includes an artificial neural network model and, when a predicted data access request is generated, the artificial neural network model may be machine-trained to increase the control authority of the system bus to be higher than when the predicted data access requests are not generated.

At least one artificial neural network memory controller may be configured to ensure an effective bandwidth of the system bus until at least one memory completes a memory access request.

At least one artificial neural network memory controller may be configured to calculate a specific bandwidth required for the system bus to process a specific memory access request based on the artificial neural network data locality pattern and at least one artificial neural network memory controller may be configured to control the effective bandwidth of the system bus based on the specific bandwidth.

At least one artificial neural network memory controller is disposed in the system bus, and the system bus is configured to dynamically change the bandwidth of the system bus based on the artificial neural network data locality pattern generated in the system bus.

At least one artificial neural network memory controller may operate to preferentially process the artificial neural network operation for the processing time of the memory access request and to process operations other than the artificial neural network operation for the other time.

At least one artificial neural network memory controller and at least one processor may be configured to directly communicate with each other.

The artificial neural network memory controller may be configured to further include a first access queue which is an access queue dedicated to the artificial neural network operation, and a second access queue which is an access queue other than the artificial neural network operation and the artificial neural network memory controller may be configured to select the access queue in accordance with the priority setting to provide data.

At least one artificial neural network memory controller further includes a plurality of layered cache memories and at least one artificial neural network memory controller may be configured to further include an artificial neural network model which is configured to perform machine-learning of data access requests between layers of the plurality of layered cache memories.

At least one artificial neural network memory controller may be configured to be further provided with at least one of an effective bandwidth, a power consumption, and latency information of each layer of the plurality of layered cache memories.

At least one processor configured to generate a data access request corresponding to the artificial neural network operation, at least one artificial neural network memory controller configured to store an artificial neural network data locality pattern of an artificial neural network operation generated from a compiler and generate a predicted data access request which predicts a subsequent data access request of the data access request generated by at least one processor based on the artificial neural network data locality pattern, and at least one memory configured to communicate with at least one artificial neural network memory controller are included. At least one memory may be configured to operate in accordance with the memory access request output from at least one artificial neural network memory controller.

At least one artificial neural network memory system may be configured to further include at least one memory and a system bus configured to control communication of an artificial neural network memory controller, at least one processor, and at least one memory.

At least one artificial neural network memory controller is disposed in the system bus, and at least one artificial neural network memory controller may be configured to increase the control authority of the system bus to be higher than that when there is no memory access request, until at least one memory completes the response for the memory access request.

The at least one artificial neural network memory controller includes one or more artificial neural network memory controllers that are configured to be included in the DRAM.

The at least one artificial neural network memory controller includes one or more artificial neural network memory controllers that are configured to be included in at least one processor.

At least one memory further includes a DRAM or at least one memory is DRAM and at least one artificial neural network memory controller may be configured to readjust an access queue of the memory access request. That is, at least one artificial neural network memory controller may be configured to control a reordered cue of the memory controller of the DRAM.

An artificial neural network operation-related memory access request provided from the artificial neural network memory controller to the memory controller of the memory may further include priority information which can be interpreted by the memory controller of the memory.

According to the above-described configuration, the memory controller of the memory may be configured to reorder the memory access queue in the memory controller based on the priority information included in the memory access request generated by the artificial neural network memory controller regardless of whether the memory access request is related to the artificial neural network operation. Accordingly, the access queue of the memory access request for processing the artificial neural network operation may be processed earlier than the access queue of another type of memory access request. Accordingly, the artificial neural network memory controller may increase the effective bandwidth of the corresponding memory.

The memory access request processing order determined by the memory controller of the DRAM may be readjusted by the priority information provided by the artificial neural network memory controller.

For example, when the priority of the memory access request generated by the artificial neural network memory controller is set to be urgent, the memory controller of the DRAM may change the processing sequence of the memory access request to a first priority.

The artificial neural network memory controller may be configured to generate at least one access queue.

At least one memory includes an artificial neural network memory controller, and the artificial neural network memory controller may be configured to separately generate the access queue dedicated to the artificial neural network operation.

At least one artificial neural network memory controller may be configured to readjust the access queue of the memory access requests.

At least one memory further includes a read-burst function, and at least one artificial neural network memory controller may be configured to set the storage area of at least one memory in consideration of the read-burst function.

At least one memory further includes a read-burst function, and at least one artificial neural network memory controller may be configured to process the write operation in the storage area of at least one memory in consideration of the read-burst function.

At least one processor further includes a plurality of processors, and at least one artificial neural network memory controller may be configured to set a priority of a data access request of a processor which processes an artificial neural network operation, among a plurality of processors, to be higher than that of a processor which processes an operation other than the artificial neural network operation.

For example, a processor according to the present disclosure may be configured with one of the exemplary NPUs of the present disclosure. For example, the SoC according to the present disclosure may include an artificial neural network memory system. The NPU and SoC will be described later.

At least one AMC may be configured to independently operate from each other based on ANN DL information respectively stored in the at least one AMC. The ANN DL information of each AMC may be the same or different from each other according to its position within a system. The ANN DL information corresponding to each AMC may be configured to have the same information at least in part according to the its position of a system. To elaborate, each AMC is configured to customize the ANN DL information of an ANN model being processed through a particular communication bus which is controlled by a particular AMC. In other words, the first ANN DL information of the first AMC of a first bus may be different from the second ANN DL information of the second AMC of the bus. Thus, each AMC has an advantage of being able to operate independently for a particular communication bus based on its ANN DL information.

Figure 15:
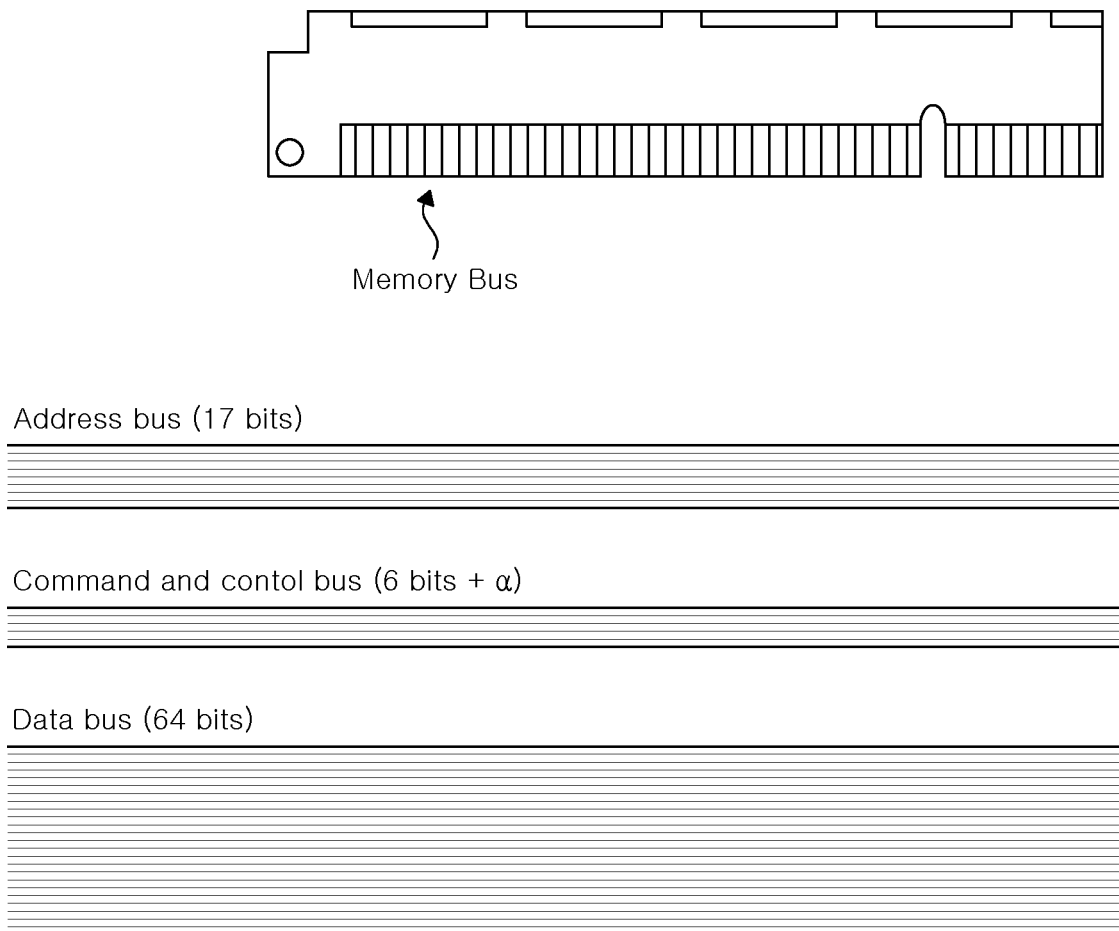
FIG. 15 is an exemplary view showing a substrate and a channel on which a memory is mounted.

FIG. 15 is an exemplary view showing a substrate and a channel on which a memory is mounted.

As shown, a plurality of pins for communication with the memory bus may be formed on a substrate on which the memory is mounted, that is, the circuit board.

The memory bus of the memory may include an address bus (e.g., 17 bits), a command and control bus (e.g., 6 bits), and a data bus (e.g., 64 bits). To elaborate, it is also possible that the memory bus may include at least one sideband signal illustrated in FIG. 12.

That is, according to the added sideband signal, the SAM controller according to various examples of the present disclosure may be configured to selectively classify and control the memory cell area of the memory. However, the present disclosure is not limited thereto, and it is possible to implement an IP header packet instead of a sideband signal.

The present disclosure may provide a memory configured to operate according to an artificial neural network (ANN) data locality (DL), for example, a sequential access memory (SAM) and a SAM controller. The SAM may be referred to as a memory dedicated to the artificial neural network. The SAM control unit may mean a memory controller that controls the SAM.

That is, the SAM according to an example of the present disclosure may mean a memory specialized for artificial neural network processing that may exclude the random access characteristic of the DRAM memory, and is set to sequentially operate according to the ANN DL information. However, the structure of the memory cell of the SAM is not limited to DRAM, and it may be applied to a memory having a memory cell structure similar to the DRAM. That is, based on the ANN DL information, sequential access information capable of sequentially accessing an address of a memory may be derived.

The SAM may be configured to process read/write commands in a burst mode basically. In this case, the read/write command may be set to operate in a unit of ANN DL information. That is, the SAM controller may be configured to request a memory operation from the SAM in a unit of ANN DL. In this case, the memory address map of the SAM may be set so that the memory operation in a unit of ANN DL is operated in a substantial burst mode without a specific burst mode command. Here, the unit of ANN DL may mean a data access request of the minimum unit requested by the processor to the memory or the AMC based on the ANN DL information. The minimum size of the unit of ANN DL may be one word unit such as 16 bits, 32 bits, or 64 bits or the like.

As the ANN DL is provided, the SAM can substantially eliminate the random access nature of the memory. Since the SAM operates in the substantial burst mode based on the ANN DL information, the frequency of occurrence of CAS latency & RAS latency can be minimized.

In other words, the conventional random access operation of the memory is effective only in a situation where the memory operation sequence from the processor is unpredictable.

On the other hand, the SAM can know in advance the sequence of memory operation requests to be requested by the processor based on the ANN DL. Therefore, the SAM can provide a memory operation with minimized power consumption and latency based on the ANN DL.

The memory bus between the SAM and the SAM controller may further include at least one sideband signal.

The system bus between the SAM controller and the processor may further include at least one sideband signal. The number of sideband signals of each of the memory bus and the system bus may be the same or different from each other.

However, the present disclosure is not limited thereto, and may be implemented in the form of a packet including information corresponding to a sideband signal.

Since the SAM excludes the random access characteristic of the memory and operates based on the ANN DL information, it can be configured to enable precise refresh timing control of the memory cells of the SAM. A dynamic memory cell may need periodic refresh, and a dynamic memory implemented with SAM may be configured such that refresh is controlled based on ANN DL.

Since the SAM excludes the random access characteristic of the memory and operates based on the ANN DL information, it can be configured to enable precise precharge timing control of the memory cell of the SAM. A dynamic memory cell may require precharge for a sense amplifier operation, and a dynamic memory implemented with SAM may be configured to control precharge based on the ANN DL.

The SAM may be configured to determine the area of memory allocated for each ANN DL information or for each domain.

Figure 16:
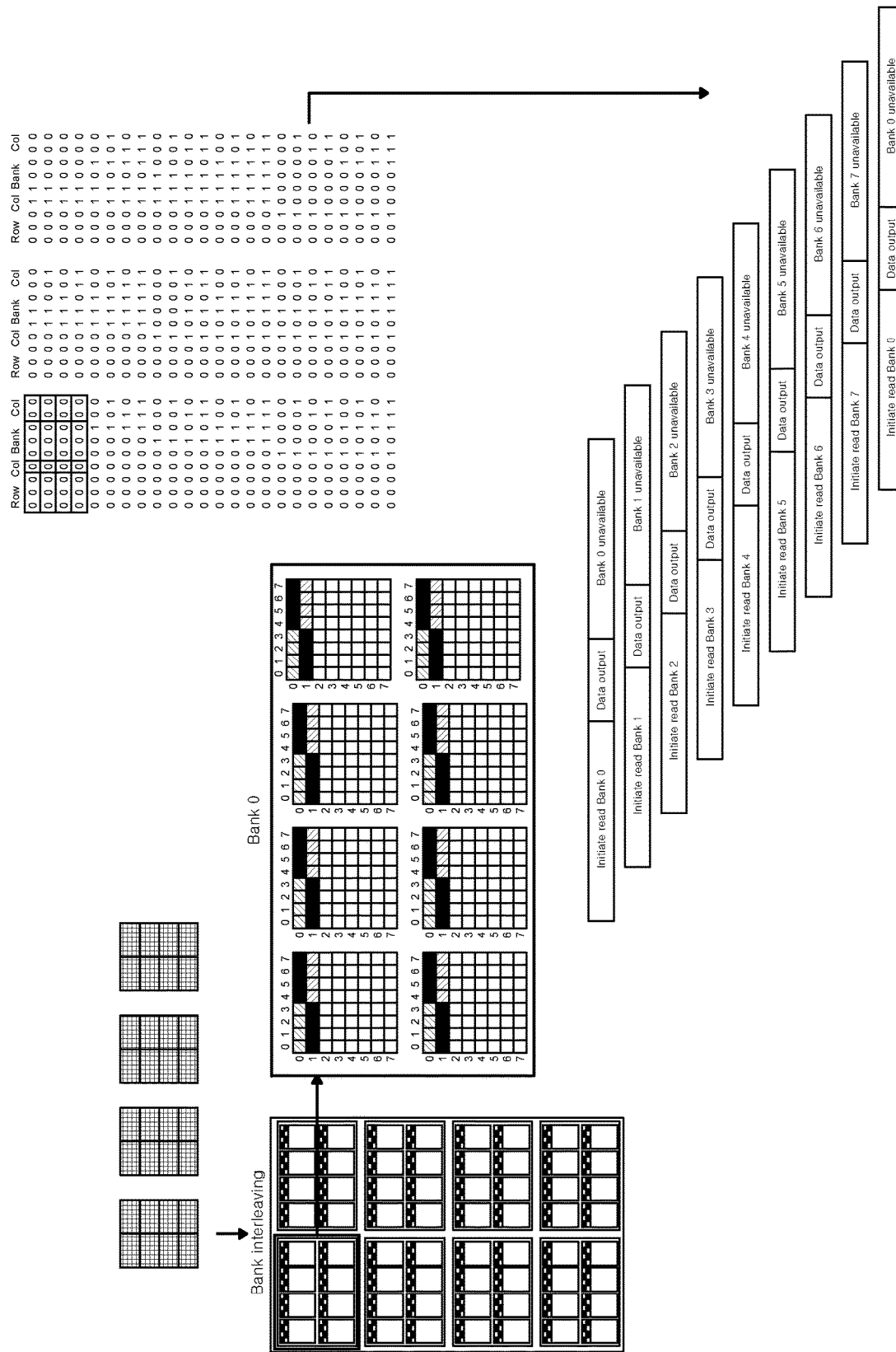
FIG. 16 is an exemplary diagram illustrating a process of reading data from a memory of a multi-bank structure.

FIG. 16 is an exemplary diagram illustrating a process of reading data from a memory of a multi-bank structure.

The SAM shown in FIG. 16 may utilize a part of the memory cell operations of a conventional DRAM. The SAM may include at least one bank.

Referring to FIG. 16, the SAM may be configured such that memory cells in a matrix form have row and column addresses. A bank of the SAM may be configured by bundling a plurality of memory cells.

In order to improve the bandwidth of the SAM, the SAM may be configured to interlace memory cells in each bank of the SAM.

In order to improve the bandwidth of the SAM, the SAM may be configured to perform interleaving in units of banks of the SAM.

A row address strobe (RAS) signal and/or a column address strobe (CAS) signal of the memory cells of the SAM may be directly controlled according to the ANN DL information. Accordingly, the SAM controller may control the SAM to sequentially read data or write data according to the ANN DL.

Referring to FIG. 12, 15, or 16, the SAM according to an example of the present disclosure may include a plurality of banks. In this case, the SAM may be configured to allocate a specific bank and/or a specific area of memory cells for a specific purpose based on at least one sideband signal.

For example, depending on the domain, the first bank of the SAM may be allocated exclusively for the feature map.

For example, depending on the domain, the second bank of the SAM may be allocated exclusively for the kernel.

A SAM according to an example of the present disclosure may include at least one bank. In this case, the SAM may be configured to allocate specific rows of at least one bank for a specific purpose based on at least one sideband signal.

A SAM according to an example of the present disclosure may include at least one bank. In this case, the SAM may be configured to allocate specific rows of at least one bank for a specific purpose based on the domain.

For example, depending on the domain, the second bank of the SAM may be allocated exclusively for the kernel.

A SAM according to an example of the present disclosure may include at least one bank. In this case, the SAM may be configured to allocate specific rows of at least one bank for a specific purpose based on at least one sideband signal.

For example, the SAM may allocate the rows of the first area of the first bank exclusively to the feature map according to the domain.

For example, the SAM may allocate the rows of the second area of the first bank exclusively for weights according to the domain.

Referring to FIG. 12 or 15 again, the SAM according to an example of the present disclosure may be configured to allocate specific rows of a specific bank for a specific purpose based on the ANN MODEL # signal. The SAM according to an example of the present disclosure may be configured to allocate specific rows of a specific bank to a specific purpose based on at least ANN DL. That is, the SAM may be configured to allocate memory cells of a specific bank or specific rows for a specific purpose based on at least one sideband signal.

However, the present disclosure is not limited thereto, and even if there are no additional sideband signals, the SAM controller may be implemented by directly controlling the memory address of the SAM based on the ANN DL information.

Figure 17:
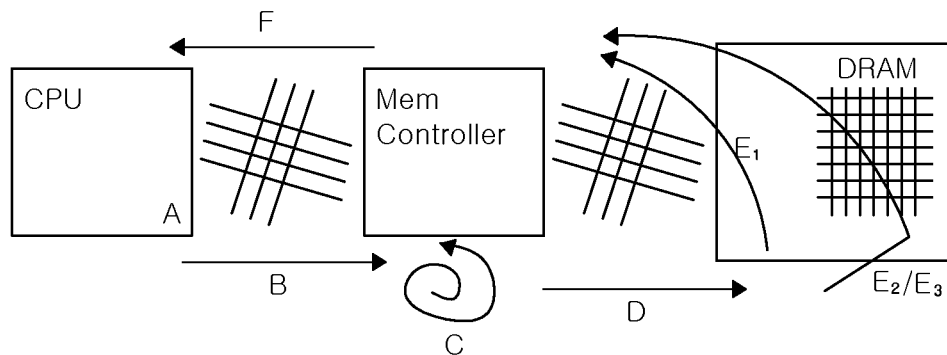
FIG. 17 is an exemplary diagram illustrating latency occurring in a conventional DRAM.

FIG. 17 is an exemplary diagram illustrating latency occurring in a conventional DRAM.

Referring to FIG. 17, the latency between a CPU, a conventional memory controller, and a conventional DRAM is illustrated.

A conventional CPU uses a virtual memory utilizing a translation lookaside buffer (TLB) to process various operations. Therefore, artificial neural network data stored in the conventional DRAM is fragmented and stored in the DRAM.

The operation of the CPU reading data from the DRAM may include steps A through F. Each process may incur latency.

In step A, the CPU generates a transaction request. In this process, the transaction request may be temporarily queued in a queue of the CPU, and thus latency may occur. In step B, the CPU may transmit the transaction request to the memory controller. In step C, the memory controller may convert the transaction request into instruction sequences. In step D, the memory controller may transfer the command sequences to the DRAM. In step E, the DRAM may use a single CAS signal, a combination of a RAS signal and a CAS signal, or a combination of a precharge (PRE) signal, a RAS signal, and a CAS signal to process the command sequences. In process F, data according to the transaction is transferred to the CPU.

The latency from process A to process F may include A+B+C+D+E+F.

Figure 31A:
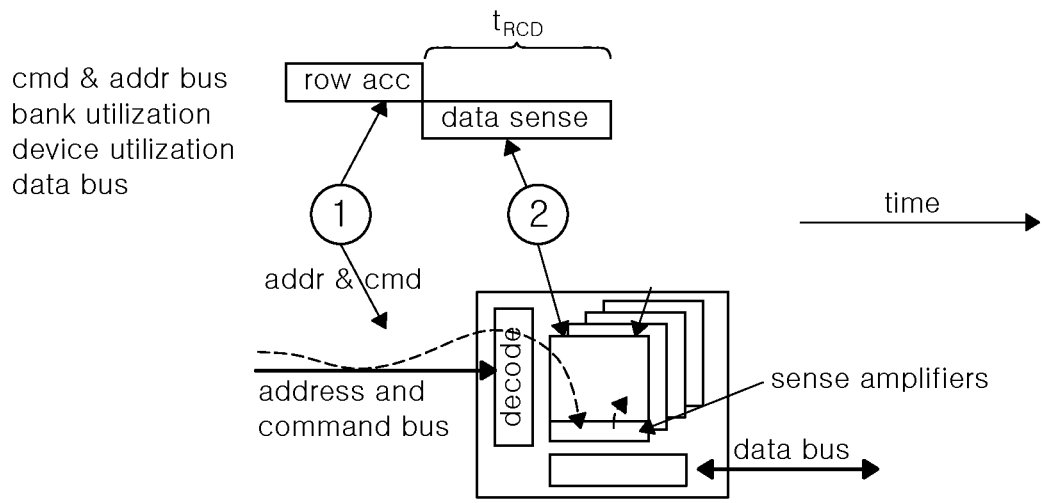
FIG. 31A is an exemplary diagram illustrating a READ_DISCARD command transmitted through a sideband signal according to an example of the present disclosure.

Process E1 may occur when all data corresponding to a data operation requested by the conventional DRAM is latched in the sense amplifier shown in FIG. 31A.

The process E2 may occur when a portion of data corresponding to a data operation requested by the conventional DRAM is fragmented in memory cells of a plurality of rows.

The process E3 may occur when a portion of data corresponding to a data operation requested by the conventional DRAM is fragmented into a plurality of rows of memory cells, and the memory cells are precharged for various reasons.

Here, RAS refers to a Row Address Strobe (RAS) signal, CAS refers to a Column Address Strobe (CAS) signal, and PRE refers to a precharge signal. Each signal includes a corresponding latency, respectively.

When a conventional DRAM and a conventional memory controller process artificial neural network data, the ANN DL information is not considered. Thus, the artificial neural network data is fragmented and processed as a virtual memory. Therefore, in the conventional case, the cases of E2 and E3 are frequently occurred instead of the case of E1. Therefore, it is possible to cause a bottleneck of artificial neural network processing by using the conventional DRAM.

In contrast, in the case of the SAM according to an example of the present disclosure, since the operations are based on the ANN DL, the frequency of occurrence of E1 may be maximized by removing or minimizing the frequency of occurrence of E2 and E3. Thus, the latency according to the CAS signal, the RAS signal, and the PRE signal may be reduced. Therefore, it is possible to improve the processing speed of an artificial neural network.

Figure 18:
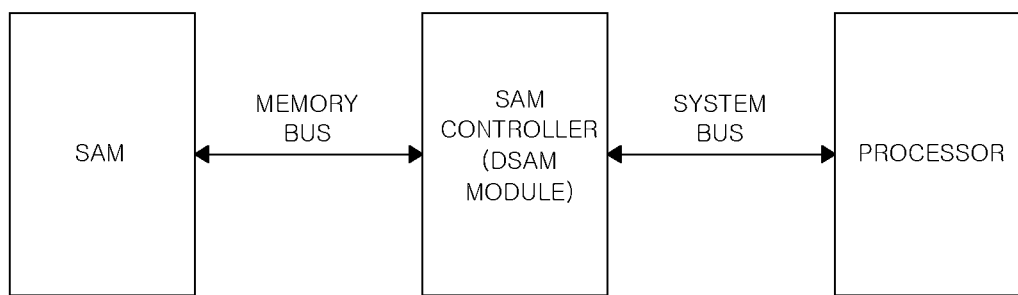
FIG. 18 is an exemplary diagram showing the basic concept of a Sequential Access Memory (SAM) according to the present disclosure.

FIG. 18 is an exemplary diagram showing the basic concept of a Sequential Access Memory (SAM) according to the present disclosure.

FIG. 18 shows the main memory, the SAM, the SAM controller, and the processor. The SAM controller is disposed between the processor and the SAM to control the SAM.

The SAM controller may be integrated with the SAM, which is the main memory, or may be implemented physically separated from the SAM. Alternatively, the SAM controller may be embedded in the processor. In addition, the SAM controller may be implemented in various forms.

The SAM controller may receive ANN DL information from a processor to process an artificial neural network (ANN), for example, an NPU or a compiler.

The ANN DL information may be included in a register map for NPU control or may be provided as a separate register map or a table.

The ANN DL information may be provided to the processor (i.e., NPU) and the SAM controller, respectively. In addition, the ANN DL information provided to the NPU and the SAM controller may be identical to each other, or may be at least partially identical to each other.

The SAM controller may serve to transmit a read/write command to the SAM, which is the main memory, according to sequence information (i.e., sequential access information) in the ANN DL information, and to provide data requested by the processor.

The SAM, which is the main memory, may determine a data size to request according to the sequence information in the ANN DL information. The ANN DL information may vary depending on the number of PEs in the processor (i.e., NPU), the cache memory size of the processor (i.e., NPU), the kernel to be used for the corresponding layer, the feature map size, and the like.

For example, when the size of data is larger than the size of the cache memory, the processor may use the tiling algorithm. In addition, the SAM controller may be configured to operate according to the processing method of the processor.

For example, for latency hiding of the main memory, the ANN DL may be determined. In other words, for latency hiding, it is also possible to set the ANN DL so that data having a size corresponding to the minimum number of clocks is first cached.

When the processing method of the processor is changed, for example, the ANN DL information may be changed according to the weight stationary, input stationary, or output stationary methods.

Unless there is a special circumstance, the SAM according to examples of the present disclosure may be configured to minimize the frequency of occurrence of the E2 or E3 latency described above with reference to FIG. 17. That is, the memory operation of the SAM may operate to sequentially access the rows of the memory cells of the bank unless there is a special circumstance. Accordingly, the frequency of occurrence of latency E2 or E3 as shown in FIG. 17 can be minimized.

That is, the SAM may be configured to operate by sequentially addressing memory cells for each memory operation in a unit of ANN DL. Memory cells of all columns corresponding to one row of one memory cell of the SAM may be latched by the corresponding sense amplifier. All data latched in the sense amplifier can be read without additional RAS latency. Accordingly, memory cells of columns corresponding to one row may be sequentially read.

However, the present disclosure is not limited thereto, and the order of reading data latched in the sense amplifier may be changed, and even in this case, separate RAS latency may not occur.

In other words, the sequential addressing technique of the SAM may mean that the address of the row and column of the memory cell is gradually changed when processing the memory operations in a unit of ANN DL.

The SAM controller may be configured to directly control the addresses of the SAM, which is the main memory, in a unit of ANN DL. Accordingly, the SAM controller may be configured to directly control the RAS signal and the CAS signal for accessing the memory cells of the SAM.

FIG. 19 is a table exemplarily showing the amount of computation and data size for 16 layers.

In the example of FIG. 19, when the artificial neural network model is VGG16, the structure information of the input feature map, the output feature map, and the kernel for each 16 layers are described. Various examples of the present disclosure may be configured to generate at least one ANN DL information based on at least one artificial neural network model.

In the table of FIG. 19, layers 1 to 13 are layers for convolutional, and layers 14 to 16 include fully-connected layers.

In general, the artificial neural network model should be calculated according to the order of the layers, but for various reasons, the number of the operation sequence of the artificial neural network model processed by the processor may increase or decrease.

Theoretically, one layer of an artificial neural network model can be processed with one convolution operation. However, one convolution operation can be performed in multiple divisions under various conditions. That is, the number of convolution operations may increase as much as the number of tiles.

For example, the ANN DL information may be changed according to the layer structure of the artificial neural network, the PE array structure of the processor (i.e., NPU), and the size of the internal memory of the processor.

For example, if the size of the internal memory for the kernel is 256 Kbytes and the size of the kernel of layer 1 is 3.2 Mbytes, the number of tiling operations suitable for the internal memory for the kernel may be thirteen.

In addition, the sequence of the thirteen tiling operations to be processed by the processor may be determined.

That is, the number of steps of ANN DL may change according to the size of the processor's internal memory. Therefore, it is also possible to increase the number of steps of ANN DL. On the other hand, if the size of the internal memory for the input feature map is 256 Kbytes and the size of the input feature map of layer 1 is 1.7 Kbytes, tiling may not be necessary. Even for the output feature map of layer 1, tiling may not be necessary.

That is, when the operation sequence of the artificial neural network model processed by the processor is changed, the ANN DL information of the artificial neural network model is also changed.

Accordingly, the ANN DL information of the artificial neural network model may be configured to include sequence information changed due to tiling.

FIG. 20 is a table exemplarily showing the amount of computation and data size for 28 layers.

In the example of FIG. 20, when the artificial neural network model is Mobilenet V1.0, the structure information of the input feature map, the output feature map, and the kernel are described for each 28 layers. Various examples of the present disclosure may be configured to generate at least one ANN DL information based on at least one artificial neural network model.

In the table shown in FIG. 20, layers 1 to 28 include a convolutional layer, a depth-wise convolutional layer, and a point-wise convolutional layer.

In general, the artificial neural network model should be calculated according to the order of the layers, but the sequence of operations may be changed for various reasons. If the sequence of operations is changed, the ANN DL information of the artificial neural network model is also changed.

For example, when one processor processes two artificial neural network models, the ANN DL information processed by the one processor may be a combination of artificial neural network data locality information of each artificial neural network model shown in FIGS. 19 and 20 in a specific sequence.

For example, when two processors process one artificial neural network model, the ANN DL information processed by the two processors may be separated so that the ANN DL information of the artificial neural network model shown in FIG. 19 is processed by two processors, respectively.

FIG. 21 is a table showing a first example of accessing a memory according to sequence information in artificial neural network data locality (ANN DL) information.

In the first example shown in FIG. 21, when the artificial neural network model is Mobilenet V1.0, the SAM controller may be configured to have ANN DL information including 84 steps in order to process the calculation of the 28 layers. That is, sequential access information may be determined from the viewpoint of the row and column addresses of the SAM based on the sequence of each step.

The SAM, which is the main memory, may be configured to operate based on ANN DL information included in the SAM controller.

Here, the ANN DL information refers to the data processing sequence of the artificial neural network model of the processor generated by the compiler or the SAM controller in consideration of at least one of the following conditions.

a. ANN model structure (VGG16 or Mobilenet V1.0, etc.).

b. Architecture of the processor (e.g., depending on the architecture of the CPU, GPU, and NPU). For example, in the case of NPU, the number of PEs, stationary structure such as input stationary, output stationary, or weight stationary and the like.

c. Size of cache memory (Tiling algorithm needs to be applied when the size of cache memory is smaller than the size of data and the like).

d. Data size for each domain and each layer. For example, the domain may include an input feature map IFMAP, an output feature map OFMAP, and a kernel Kernel.

e. Processing policy.

f. Data Reuse Rate. For example, a data request sequence of a specific domain may be determined, such as an input feature map IFMAP read first or a kernel Kernel read first.

The policy may vary according to the structure of the processor or the compiler algorithm.

The SAM controller according to examples of the present disclosure may set the row and column addresses of the memory cells of the SAM to be sequential based on the ANN DL. For example, it can be set so that the row and column addresses of the memory cells of the SAM are sequential in a unit of ANN DL.

FIG. 22 is an exemplary table showing the table shown in FIG. 21 in a simplified manner.

In FIG. 22, data sizes and memory addresses are denoted by symbols for convenience of explanation.

As can be seen with reference to FIG. 22, the SAM controller may establish a policy regarding address allocation of the SAM according to sequence information in the ANN DL information. In more detail, the SAM controller may be configured to directly control the row and column addresses of memory cells of the SAM.

According to the sequential access information in the ANN DL information, at least a portion of, or all of, the data may be stored in the memory in a unit of ANN DL. In this case, the data may be optimized and stored with respect to the burst mode.

The ANN DL information may include, for example, pattern information in the order of i) reading the input feature map, ii) reading the corresponding kernel, and iii) writing the output feature map. However, the present disclosure is not limited to the above pattern, and various patterns are disclosed. In addition, the pattern may be set differently for each layer.

At this time, the SAM, which is the main memory, may control the CAS signal or the RAS signal according to the ANN DL information to operate in the burst mode. Referring to the examples of FIG. 41 or FIG. 42, an example of directly controlling the row address decoder and the column multiplexer/demultiplexer by controlling the CAS signal, the RAS signal and the address signal is shown.

In this case, the SAM controller may predict that the processor will request data in a specific sequence based on sequence information in the ANN DL information.

The SAM controller may analyze the ANN DL information of the compiled artificial neural network model and directly controls the CAS signal and/or the RAS signal of the SAM, so that the data requested by the processor can be sequentially arranged in the memory cells of the SAM. Alternatively, the fragmented data can be continuously rearranged. Therefore, the SAM can sequentially provide data to the SAM controller.

That is, the SAM, which is the main memory, may be configured to operate in burst mode from the start address to the end address in a unit of ANN DL.

Alternatively, the SAM, which is the main memory, may analyze the compiled ANN DL information, arrange the data to be requested by the NPU into sequential addresses, and then sequentially provide the data.

Accordingly, the SAM controller according to examples of the present disclosure may set the row and column addresses of the memory cells of the SAM to be sequential based on the ANN DL.

Each unit of ANN DL may have a corresponding data size. For example, the first ANN DL unit may have data of size A, and may have a start address and an end address corresponding to size A. Accordingly, the operation mode of the SAM may be configured to basically operate as same as the burst mode of the DRAM, and the SAM may basically operate in the burst mode when the SAM controller generates a read command.

Also, even when the command from the processor is the read mode instead of the read-burst mode, the SAM may operate in the substantial burst mode based on the ANN DL.

In addition, based on the ANN DL, it is possible for all data to operate in burst mode. However, the present disclosure is not limited thereto, and it is also possible that most of the data is set in the burst mode. That is, at least a portion of the data may not be operated in the burst mode.

Figure 23:
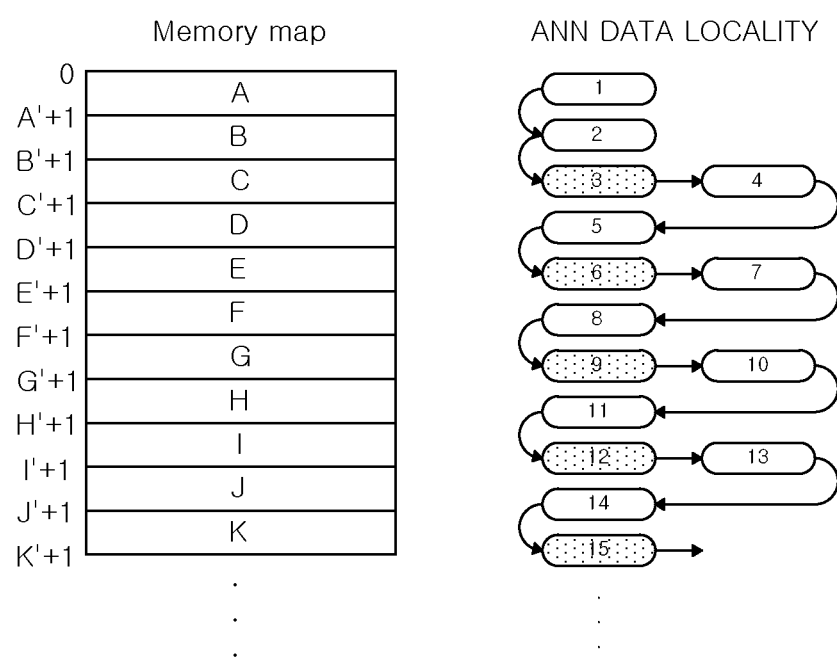
FIG. 23 shows an example in which the SAM sets a memory address map according to the table of FIG. 22.

FIG. 23 shows an example in which the SAM sets a memory address map according to the table shown in FIG. 22.

The SAM controller may control the CAS signal and/or the RAS signal of the SAM based on the compiled ANN DL information, and may arrange data to be requested by the processor so as to be sequential in the memory map.

Since the SAM already knows in what sequence the processor will generate a read or write command for data of a specific size at a specific address in the memory, the data can be arranged in the following sequence.

According to the example shown in FIG. 23, each of A data to K data is stored using sequential addresses. As such, since data is sequentially stored based on the ANN DL, it may be possible to operate in a burst mode at least for each ANN DL unit. In addition, according to examples of the present disclosure, since adjacent units of ANN DL may also have sequential addresses, a burst mode operation of a plurality of ANN DL units is also possible. In each of A data to K data, data bits may be sequentially stored. Therefore, the SAM can be operated in a burst mode. The sequential addresses may mean column addresses and low addresses of memory cell array, which are sequentially increased.

Accordingly, each data of ANN DL unit may be read in the burst mode, and data stored with consecutive addresses may also be read in the burst mode.

Preferably, all of the ANN DL units from #1 to #15 may operate in the burst mode, but the present disclosure is not limited thereto, and data of at least one ANN DL unit may be configured to operate in the burst mode.

Hereinafter, a procedure after the memory address map is set based on the ANN DL information will be described.

ANN DL unit #1: Processor and/or SAM controller may request SAM to read A data in read-burst mode. In the case of ANN DL unit #1, since A data is sequentially stored, the SAM may be operated in read-burst mode until A data is read.

ANN DL unit #2: Processor and/or SAM controller may request the SAM to read B data in read-burst mode. In the case of ANN DL unit #2, since data is sequentially stored, it can be operated in read-burst mode until B data is read.

Since A and B data are sequentially stored in the memory address map, A and B data, that is, data of consecutive ANN DL units, can be operated in read-burst mode.

ANN DL unit #3: Processor and/or SAM controller may request the SAM to write the output feature map OFMAP C data in write-burst mode. Since the C data has a memory address that follows the B data, it can be written into the SAM according to the write-burst mode.

ANN DL unit #4: Processor and/or SAM controller may request the SAM to read the C data, which is the input feature map IFMAP, again in read-burst mode.

ANN DL unit #3 and ANN DL unit #4 will be further described. C data, which is an output feature map of the first layer, is reused as an input feature map in the second layer.

As described above, since the artificial neural network model can request a read operation again immediately after writing operation, which are the same data, a refresh operation of a memory cell that may occur during write and read operations can be omitted based on the ANN DL. Accordingly, the time required for refreshing C data can be omitted and power consumption can be reduced.

In addition, the feature map of a specific artificial neural network model may have a characteristic that is no longer reused after its ANN DL sequence has passed. Therefore, since such a feature map does not need to maintain the data any longer, an error may not occur in the artificial neural network operation even if the stored data is damaged by not refreshing.

ANN DL unit #5: Processor and/or SAM controller may request SAM to read D data in read-burst mode. Since D data has an address following that of C data, it can be read continuously in read-burst mode.

ANN DL unit #6: Processor and/or SAM controller may request the SAM to write E data in write-burst mode. Since E data has an address following that of D data, it can be continuously written into the SAM according to the write-burst mode.

ANN DL unit #7: Processor and/or SAM controller may request SAM to read E data again in read-burst mode.

ANN DL unit #6 and ANN DL unit #7 will be further described. D data, which is an output feature map OFMAP of the second layer, is reused as an input feature map IFMAP in the third layer. As such, since the artificial neural network model can request to read again immediately after writing the same data, the refresh operation performed on the memory cell that may occur between writing and reading can be omitted based on the ANN DL. Accordingly, the time required to refresh the E data can be saved and power consumption can be reduced.

In addition, the feature map of a specific artificial neural network model may not be reused any more when the ANN DL sequence passes due to the nature of the artificial neural network model. Therefore, since such a feature map does not need to maintain data any longer, an error may not occur in the artificial neural network operation even if the memory cell is not refreshed.

FIG. 24 is a table showing a second example of accessing a memory according to sequence information in ANN DL information.

In the second example shown in FIG. 24, the ANN DL may be configured to read the kernel before the input feature map when the artificial neural network model is Mobilenet V1.0. To this end, the sequence information in the ANN DL information may include the sequence of reading the kernel before the input feature map.

This second example may be more effective as the data size of the feature map increases.

After the kernel is read from the SAM, convolution can be started as soon as the input feature map IFMAP is received.

Specifically, the ANN DL information according to the second example may include information on a sequence pattern of i) first reading the kernel, ii) reading the corresponding input feature map, and 3) writing the output feature map to the memory.

The SAM, which is the main memory, may control the CAS signal and/or the RAS signal according to the ANN DL information to operate in the burst mode.

The sequence of data operation requests of the processor is based on the preset ANN DL sequence.

The SAM controller may control the CAS signal and/or the RAS signal of the SAM based on the compiled ANN DL information to sequentially allocating the data requested by the processor or the NPU, and then sequentially operate in the burst mode.

Based on the compiled ANN DL information, the SAM controller may perform optimization to operate the SAM in burst mode by sequentially arranging data requested by the processor or NPU.

Compared with the first example of FIG. 23, the memory address map of the second example may be different from the memory address map of the first example even if the same artificial neural network model is processed.

Figure 25:
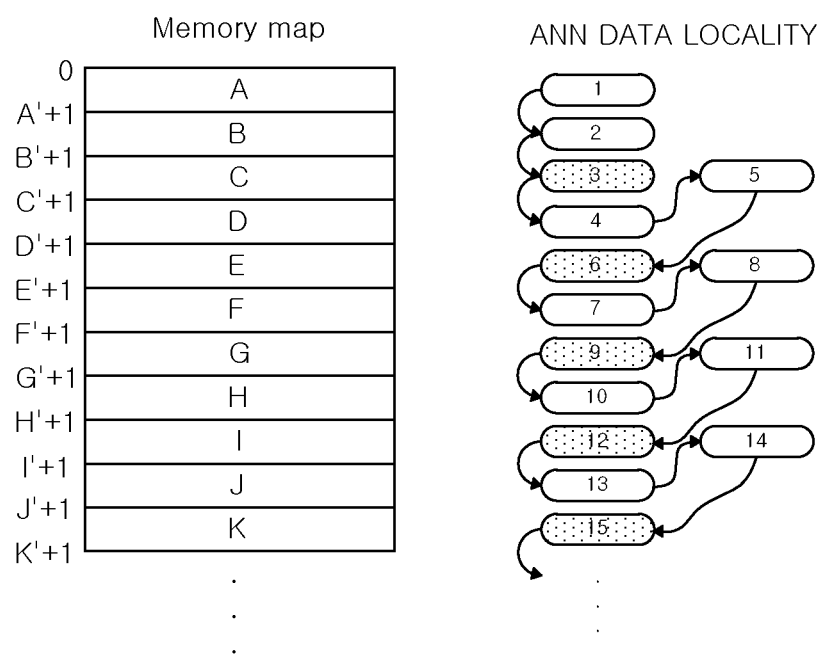
FIG. 25 shows an example in which the SAM sets a memory address map according to the table of FIG. 24.

FIG. 25 shows an example in which the SAM sets a memory address map according to the table shown in FIG. 24.

The SAM, which is the main memory, may control the CAS signal and/or the RAS signal based on the compiled ANN DL information, so that the data to be requested by the processor are arranged so as to be sequential in the memory address map.

The SAM controller may control the CAS signal and/or the RAS signal of the SAM based on the compiled ANN DL information to sequentially arranging the data to be requested by the processor in the memory address map.

Since the SAM controller knows whether the processor will transmit a read command or a write command of data of a specific size to a specific address in the memory, the SAM can know in what sequence the data will be processed.

Referring to FIG. 25, each of A data to K data is stored according to sequential memory addresses. Since data is sequential in this way, the SAM can be operated in burst mode at least in a unit of ANN DL. In addition, according to examples of the present disclosure, since adjacent units of ANN DL may also have sequential addresses, a burst mode operation of a plurality of ANN DL units is also possible.

Since the data bits in A data to K data are also stored sequentially, the memory can be operated in burst mode.

That is, bits constituting each data may also be read or written in burst mode, and since each data is continuous with each other, it may be read or written in burst mode.

Hereinafter, some explanations of the inference steps that follow after setting the memory map (i.e., memory address map) based on the ANN DL is described.

i) The processor and/or the SAM controller may request the SAM to read data according to the read-burst mode. Since data is sequentially stored, the read-burst mode may be performed while A data is read.

ii) The processor and/or the SAM controller may request the SAM to read B data according to the read-burst mode. Since the data is sequentially stored, the read-burst mode may be performed while the B data is read.

Since the A and B data are stored sequentially, the A and B data can be operated in read-burst mode. That is, continuous data of ANN DL may be operated in continuous read-burst mode.

iii) The processor and/or the SAM controller may request the SAM to write the C data, which is the output feature map, according to the write-burst mode. Since C data has a memory address that follows B data, it can be written into memory according to the write-burst mode.

iv) The processor and/or the SAM controller may request the SAM to read D data according to the read-burst mode.

v) The processor and/or the SAM controller may request the SAM to read the C data again according to the read-burst mode. That is, the output feature map OFMAP of the previous layer may be used as the input feature map IFMAP of the next layer. Since the processor and/or the SAM controller know in advance to request the SAM to read C data after D data, operations such as precharge and/or refresh of the corresponding memory cell may be selectively scheduled in advance.

vi) The processor and/or the SAM controller may request the SAM to write E data according to the write-burst mode. Since the processor and/or the SAM controller know in advance to request the SAM to write the E data after the C data, operations such as precharge and/or refresh for the corresponding memory cell may be selectively scheduled in advance.

vii) The processor and/or the SAM controller may request the SAM to read the F data according to the read-burst mode. Since F data has an address following that of E data, it is possible to continuously operate in read-burst mode.

The processor and/or the SAM controller may predict in advance to request the SAM to read the same data written to the ANN DL unit #6 again from the ANN DL unit #8. Therefore, based on the ANN DL, it is possible to predict or calculate when the data access request corresponding to ANN DL unit #6 and ANN DL unit #8 will be processed. For the prediction or calculation, it is also possible to utilize information such as the clock speed of the processor, the size of E data corresponding to the ANN DL unit #6 & ANN DL unit #8, and the bandwidth of the memory bus. Accordingly, the SAM controller or the SAM may omit a task such as precharge and/or refresh of the corresponding memory cell or schedule said task with an optimal timing.

FIG. 26 is a table showing a third example of accessing a memory according to sequence information in ANN DL information.

In the third example illustrated in FIG. 26, a specific area in the memory may be set as a common region for the input feature map and the output feature map. That is, the SAM and/or the SAM controller may be configured to classify a region of the SAM based on a specific domain.

Since the input feature map and/or the output feature map may be data that cannot be reused once used, they may be alternately recorded in the same region.

M_FMAP in the illustrated table indicates the size of the largest feature map among the plurality of input feature maps and the plurality of output feature maps. Since the size of the feature maps for each layer is different, if the maximum value of the feature map of the artificial neural network model is set, problems such as overflow can be prevented.

All of the start addresses for reading or writing the feature map may be the same, and the end address may be changed according to the actual size of the corresponding feature map.

In the third example, since a specific area of the memory is used in common, the following condition must be satisfied.

M_FMAP≥C, E, G, I, and K (partially omitted in the FIG. 26, but the example ANN DL information for Mobilenet V1.0 includes 84 units, M_FMAP is the maximum value among all feature maps). In memory, kernels may be stored sequentially.

Figure 27A:
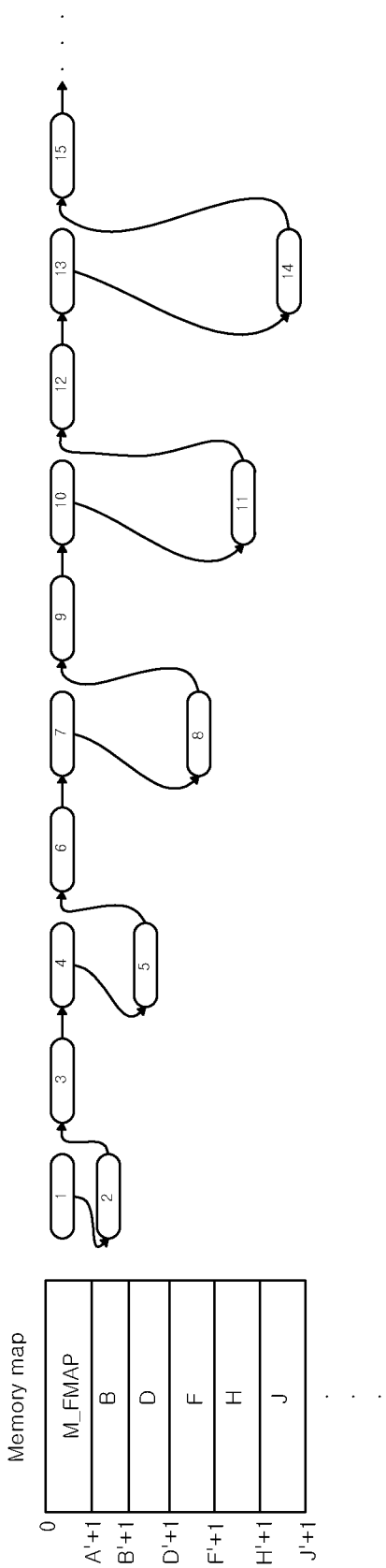
FIGS. 27A and 27B show examples of setting a memory address map according to ANN DL information.
Figure 27B:
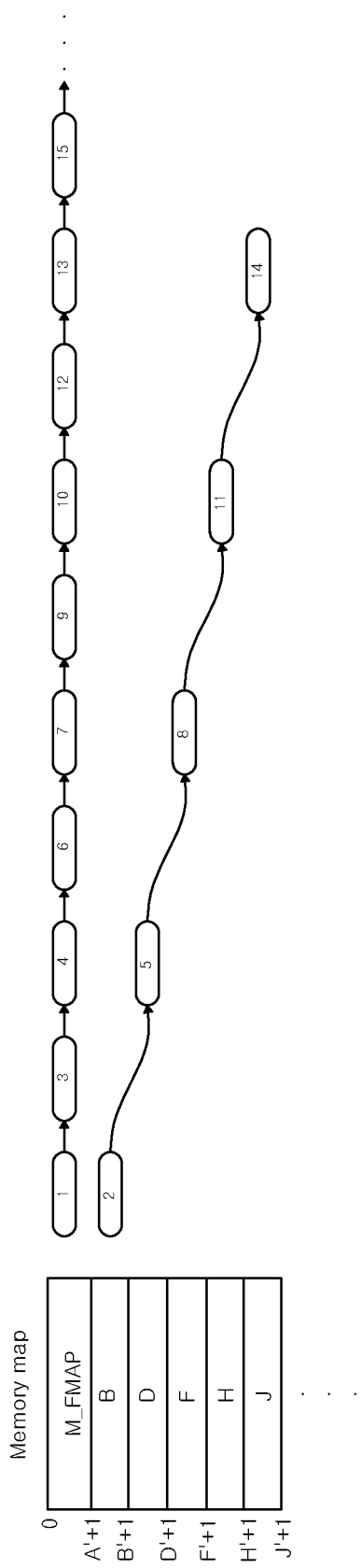

FIGS. 27A and 27B show an example of setting a memory address map according to ANN DL information.

The SAM controller may control the CAS signal and/or the RAS signal of the SAM based on the compiled ANN DL information to sequentially assign data to be requested by the processor (e.g., NPU) in the memory address map.

As shown in FIGS. 27A and 27B, since the SAM knows that the processor (e.g., the NPU) will command to read or write a specific size of data into a specific address in memory, the SAM knows in what sequence the data will be processed.

The feature map may be recorded in an overwrite command in a common region in the memory, and kernels are stored using sequentially ordered memory addresses. Accordingly, continuous data can be read or written according to the burst mode.

The first to third examples described so far will be briefly described as follows.

Referring to the first to third examples, a memory address map may be set according to ANN DL information. The memory address map may be set according to the above-described various conditions, performance, algorithms, structures of the ANN model, and the like. Furthermore, the SAM may set a memory address map based on the ANN DL information so that data can be read or written in burst mode by the ANN DL information.

According to the first to third examples, performance improvement for the kernels can be achieved due to the sequential nature of the SAM.

On the other hand, the feature map operations may be repeated in order from a write operation to a read operation.

When the main memory adopts the memory cell structure of DRAM, due to the inherent characteristics of DRAM, once data is read from the memory cell, the charge charged in the capacitor in the memory cell is discharged, and thus data is lost. Therefore, a restore operation for recharging the charge may be performed. That is, a plurality of dynamic memory cells of the main memory may have a leakage current characteristic.

When the main memory adopts the memory cell structure of DRAM, due to the inherent characteristics of DRAM, once data is read from the memory cell, the charge charged in the capacitor in the memory cell is discharged, and thus data is lost. Therefore, a restore operation for recharging the charge may be performed.

The first example is for a sequential pattern, but since the input feature map IFMAP is first read from the memory, the convolution operation can be performed after the kernel (Kernel) is read.

In the second example, since the kernel is first read from the memory, the convolution operation can be started after the input feature map IFMAP is read. From the viewpoint of performing convolution, the second example has an advantage.

In the third example, it may be effective when the capacity of the main memory is relatively small. Alternatively, it may be effective when the feature map and the kernel are separated, such as when the main memory is a memory having two channels.

Since the DRAM bus is generally single-channel, data can be sent and received in the manner according to the first to third examples. However, in another example, using a plurality of memories or a plurality of channels, it is also possible to implement the SAM by distinguishing the weight and the feature map.

However, the examples of the present disclosure are not limited thereto, and the examples described in FIGS. 22 to 27 may be set differently for each layer of the artificial neural network model according to the size of the feature map and the kernel of each layer.

Figure 28:
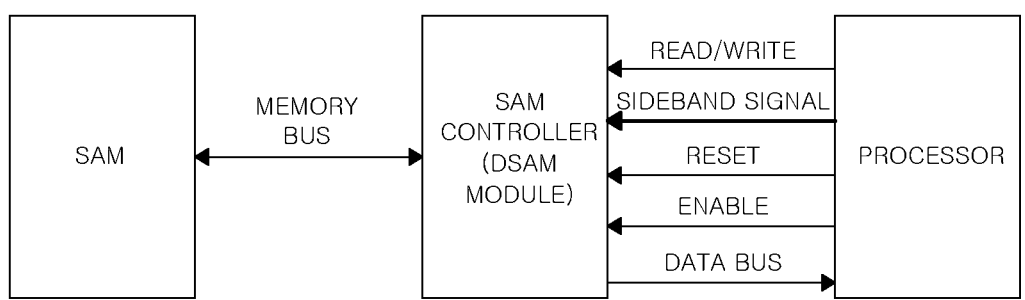
FIG. 28 is a conceptual diagram illustrating a control signal of a SAM controller.

FIG. 28 is a conceptual diagram illustrating a control signal of a SAM controller.

FIG. 28 shows the memory, the SAM controller and the processor. Signals transmitted from the processor may not be transmitted through individual physical wires, but may be logical signals (i.e., a packet) transmitted through one or more wires. However, the present disclosure is not limited thereto.

The SAM controller may include an internal memory that stores ANN DL information.

The ANN DL information may include information compiled to utilize a processor (e.g., NPU).

Read/write command: It refers to a read command signal or a write command signal delivered according to the sequence information in the ANN DL information. A memory address corresponding to each command signal may be transmitted together with a start address and an end address of the memory or clock count information.

Sideband signal: Various control signals for increasing processing efficiency according to ANN DL information may be selectively included as needed.

RESET signal: It can be used to reset the memory address map when the ANN model is changed.

ENABLE signal: When the ENABLE signal is ON, data can be transferred to the processor.

ANN DL information and SIDEBAND SIGNAL may have some redundant signals.

However, the ANN DL information may be static information according to the artificial neural network structure, and the sideband signal may be a dynamic control signal for ANN operation.

Figure 29:
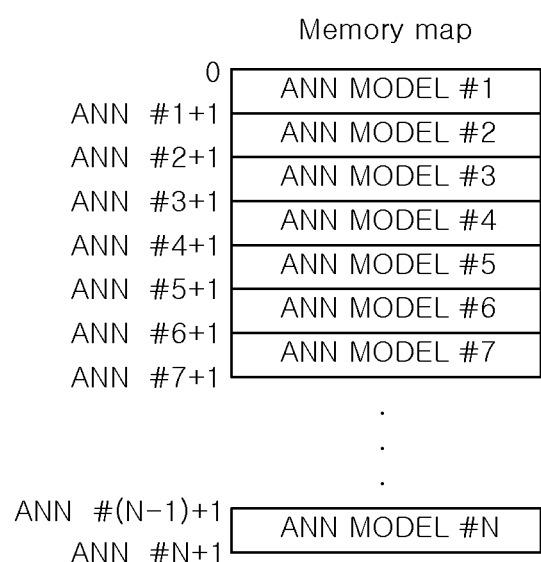
FIG. 29 is an exemplary diagram illustrating an example of setting a memory address map according to the sideband signal of FIG. 28.

FIG. 29 is an exemplary diagram illustrating an example of setting a memory address map according to the sideband signal shown in FIG. 28.

As shown in FIG. 29, a memory address map may be configured to process a plurality of ANN models.

When the processor (e.g., NPU) performs the time divisional operation in the # order of the ANN MODEL, the memory address map may be sequentially set in the # order of the ANN MODEL. Therefore, when the ANN model is changed, the SAM can be operated in burst mode. A memory address map for each ANN model may be set according to the first to third examples described above.

Figure 30A:
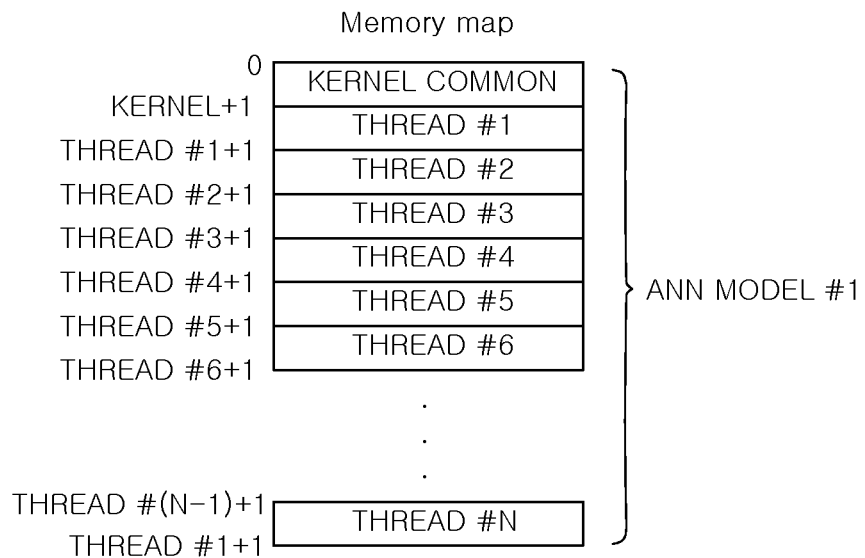
FIG. 30A shows an example of setting a memory address map according to a sideband signal.
Figure 30B:
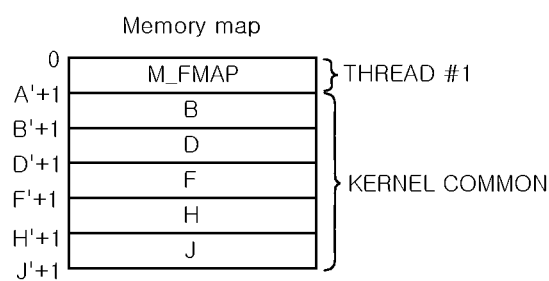
FIG. 30B shows an example of a memory address map in which only the kernel is sequentially set.

FIG. 30A shows an example of setting a memory address map according to a sideband signal, and FIG. 30B shows an example of a memory address map in which only the kernel is sequentially set.

As shown in FIG. 30A, multiple threads may be set for a specific ANN model (e.g., ANN MODEL #1). That is, a memory address map may be configured to process the ANN model in multi-threads when accessing multiple users.

By using multiple threads, multiple users can jointly use the kernel of one ANN model. Each thread may be allocated a memory address map for storing an input feature map and/or an output feature map.

Alternatively, when using multiple threads, only the kernel may be sequentially mapped into the memory address map as shown in FIG. 30B. The number of M_FMAP may be additionally created as the number of threads increases.

That is, a memory address for the kernel can be used jointly regardless of the number of users, and memory address for the feature map may be configured to increase in proportion to the number of users.

Figure 31B:
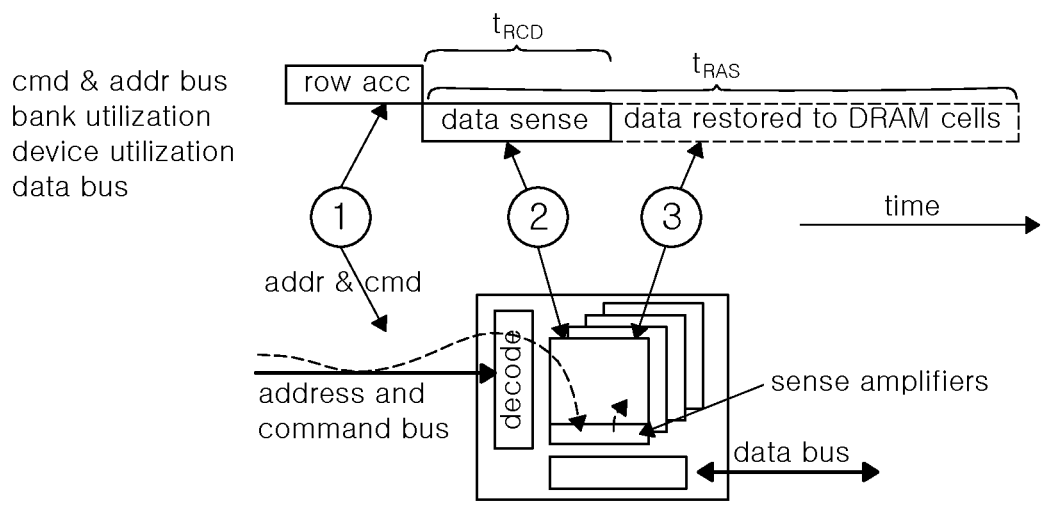
FIG. 31B shows an example of a READ command.

FIG. 31A is an exemplary diagram illustrating a READ_DISCARD command transmitted through a sideband signal according to an example of the present disclosure, and FIG. 31B shows an example of a READ command.

The designation $t_{RAS}$ shown in FIG. 31B indicates Data sense ($t_{RCD}$)+Data restored to DRAM cells time.

Data sense ($t_{RCD}$) time means the time for latching data to the sense amplifier. For the latching operation, precharge, access, and sense operations may be required.

Figure 32:
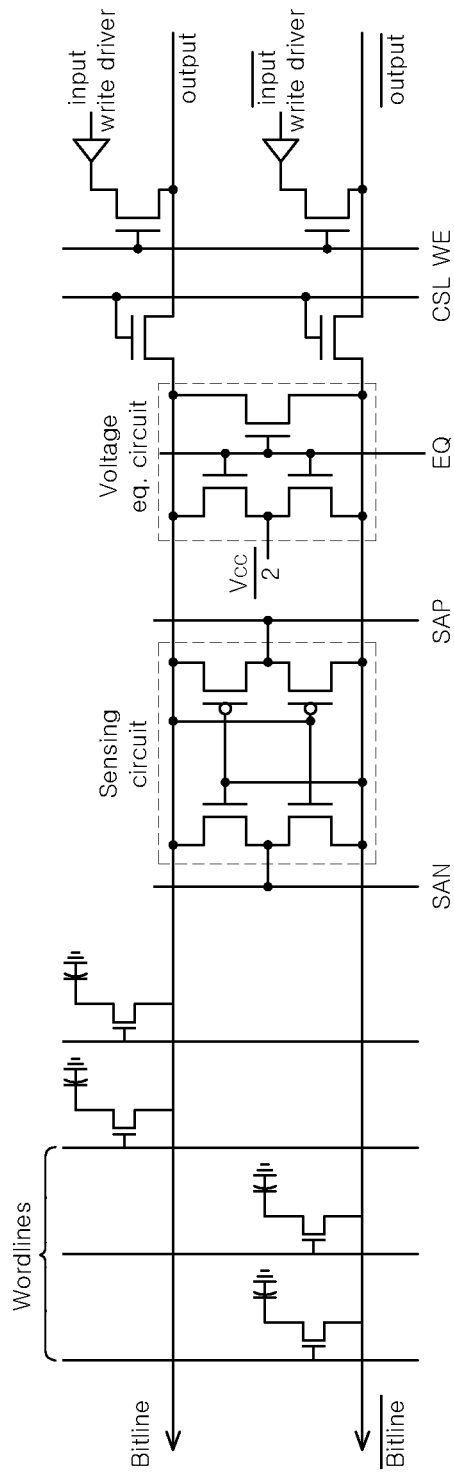
FIG. 32 shows a portion of a circuit diagram of an exemplary SAM implemented in the form of a memory cell of a DRAM according to an example of the present disclosure.
Figure 33:
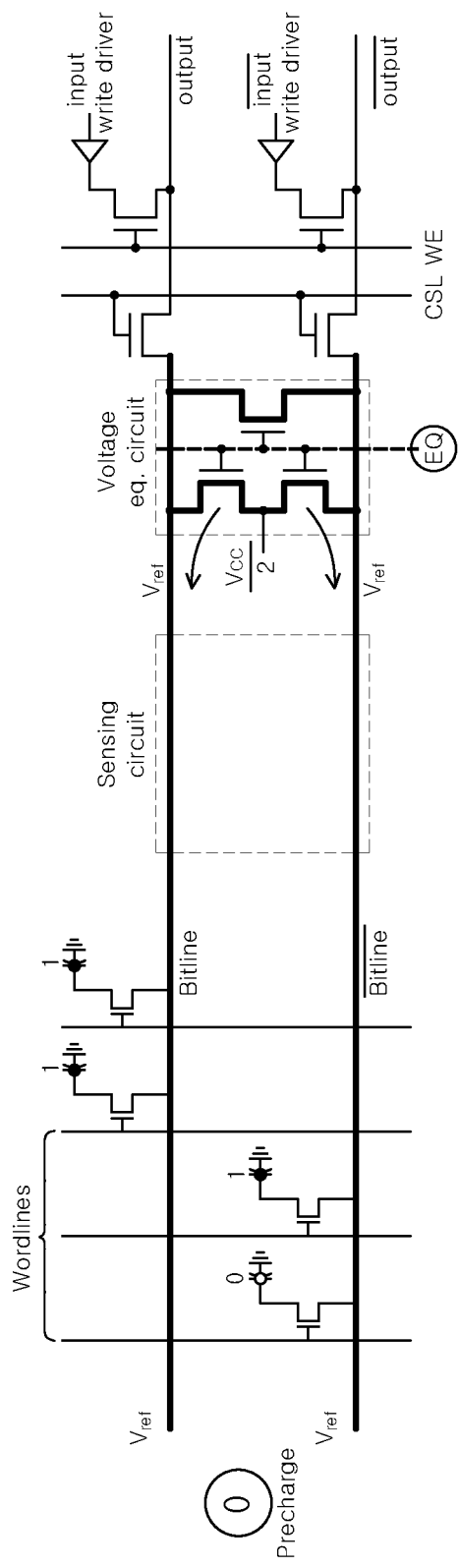
FIG. 33 is an exemplary diagram for explaining a precharge operation in the SAM circuit diagram of FIG. 32.
Figure 34:
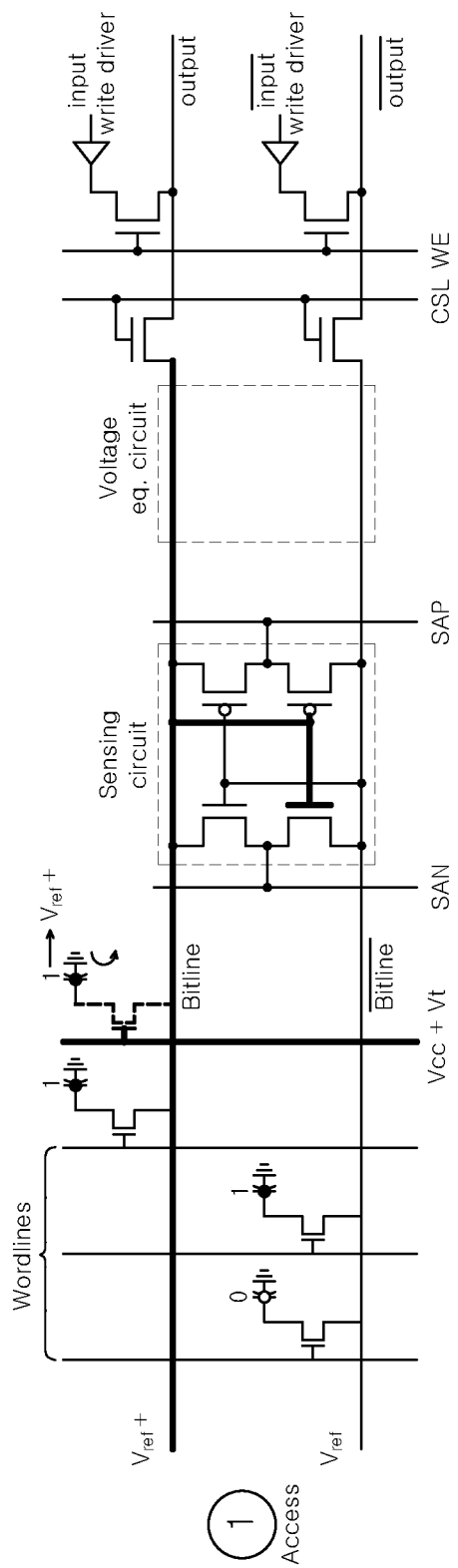
FIG. 34 is an exemplary diagram for explaining a memory cell access operation in the SAM circuit diagram of FIG. 32.

For the above operations, reference may be made to FIGS. 32, 33 and 34.

In addition, reference may also be made to FIG. 17 for the description of this example.

According to an example provided herein, the READ_DISCARD command may be performed only during $t_{RCD}$, and operation for data restored to DRAM cells may not be performed.

Therefore, the latency and power required for data restored to DRAM cells operation can be reduced. For example, after writing C data to the memory according to ANN DL unit #3 in the ANN DL information of FIG. 25, and then reading again the C data from the memory in ANN DL unit #5, the C data will not be used anymore according to the ANN DL information. Therefore, there is no need to perform the data restored to DRAM cells operation. Accordingly, sequence information and/or domain information may be used to determine said operation.

For example, the READ_DISCARD command can be set to a specific ANN DL unit #.

For example, an output feature map (OFMAP) of ANN DL unit #3 may be reused as an input feature map (IFMAP) of the next layer, which is ANN DL unit #5. That is, the input feature map (IFMAP) can utilize the fact that the input feature map will not be reused after convolution with the kernel (KERNEL).

That is, when reading the input feature map (IFMAP), the READ_DISCARD command can be set to the corresponding ANN DL unit #.

For example, when the output feature map (OFMAP) of the first layer is written to the memory, the corresponding data is used as the input feature map (IFMAP) of the second layer and read from the memory. However, since the input feature map (IFMAP) is not used again, even if the data is lost because data restored to DRAM cells is not performed, the ANN operation is not affected. Thus, according to an example of the present disclosure, the SAM controller may be configured to instruct a READ-DISCARD command to the memory.

This principle is shown in FIG. 31A. Data sense ($t_{RCD}$) shown in FIG. 31A is a time during which the sense amplifier read a value stored in memory cells of a specific row.

In other words, the READ_DISCARD command may be executed in a unit of a row of memory.

"Data restored to DRAM cells" refers to an operation of restoring the latched data back to the memory cell using the sense amplifier when data stored in the memory cell is lost by performing a read operation using the sense amplifier.

FIG. 32 shows a portion of a circuit diagram of an exemplary SAM implemented in the form of a memory cell of a DRAM according to an example of the present disclosure.

The circuit diagram of the SAM shown in FIG. 32 includes the sensing circuit (i.e., sense amplifier). The sensing circuit of SAM amplifies the difference between the reference voltage Vref supplied to the Bitline and the voltage on the Bitline to generate a digital signal of 0 or 1.

The sensing circuit of the SAM can selectively restore charge in a discharged memory cell through a Bitline. When the READ command is executed, restore operation is also executed. In case of a READ-DISCARD command, restore operation may not be performed.

The sensing circuit of the SAM may act as a buffer memory that latches the sensed voltage.

Here, the capacitor of the memory cell may have a leakage current characteristic.

FIG. 33 is an exemplary diagram for explaining a precharge operation in the SAM circuit diagram of FIG. 32.

In the precharge operation, the equalizing signal EQ is supplied, and the VOLTAGE EQ.

CIRCUIT is activated. When the EQ signal is supplied, the voltage Vref=Vcc/2 is applied to Bitline and $\overline{\text{Bitline}}$ (Bitline inverted) through each Tr. Accordingly, Bitline and $\overline{\text{Bitline}}$ are charged with Vref voltage. In addition, VOLTAGE EQ. CIRCUIT disconnects Bitline and $\overline{\text{Bitline}}$ such that both lines have the same voltage.

FIG. 34 is an exemplary diagram for explaining a memory cell access operation in the SAM circuit diagram shown in FIG. 32.

In the Access operation, the Bitline may be charged in the following order.

i) Over-drive a word line corresponding to a precharged Bitline to be accessed with a voltage of Vcc+Vt (illustrated in FIG. 34 as a thick Wordline). A voltage of Vcc+Vt is supplied to the word line to turn-on the transistor Tr of the memory cell to be accessed. CSL Tr is turned-off and data output is blocked.

ii) When the value stored in the capacitor of Tr of the memory cell is 1 (illustrated in FIG. 34 as a thick Bitline), the capacitor is discharged, and the voltage of the Bitline rises from Vref to Vref+. At this time, the voltage of the capacitor is lowered due to the discharge and the stored data is lost.

Figure 35:
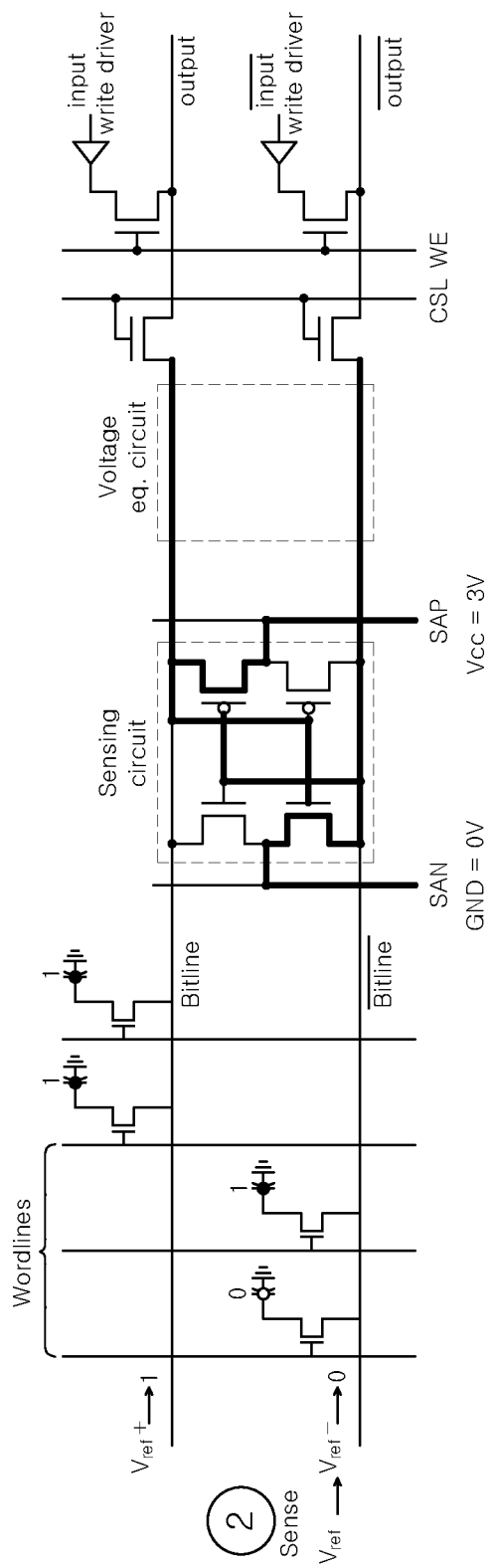
FIG. 35 is an exemplary diagram for explaining a data sense operation in the SAM circuit diagram of FIG. 32.

FIG. 35 is an exemplary diagram for explaining a data sense operation in the SAM circuit diagram shown in FIG. 32.

In the Sense operation, the sensing circuit charges the voltage of the Bitline in the following order.

i) When the Bitline is charged at Vref+voltage (illustrated in FIG. 35 as a thick solid line), the lower left transistor of the sensing circuit is turned-on. Therefore, the ground voltage GND, which is SAN, is applied to $\overline{\text{Bitline}}$. Therefore, $\overline{\text{Bitline}}$ becomes the GND voltage. Accordingly, the upper right transistor is turned-on.

ii) As illustrated in FIG. 35 as a thick line, when the upper right transistor of the sensing circuit is turned-on, the SAP, which is the Vcc voltage, is applied to the Bitline. Also, a voltage Vcc from Vref+ is applied to the gate of the lower left transistor. Therefore, Bitline=3V and $\overline{\text{Bitline}}$=0V is applied.

iii) Now the data from DRAM is ready to read. When the CSL signal is supplied, the output of the sensing circuit can be generated.

Figure 36:
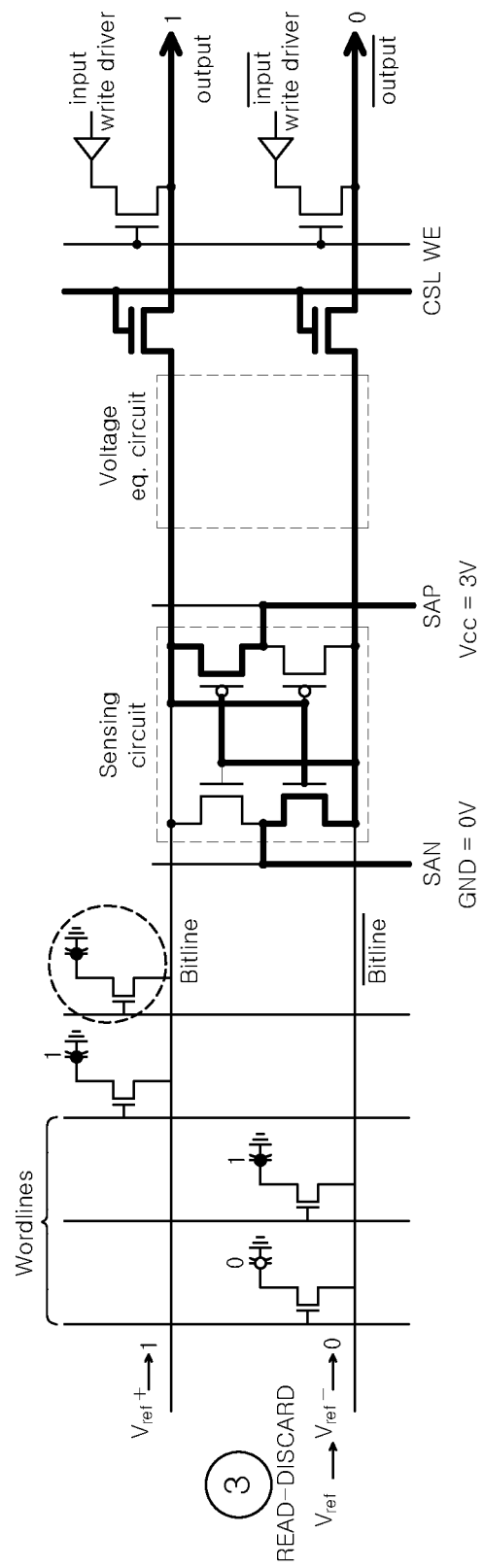
FIG. 36 is an exemplary diagram for explaining a READ-DISCARD operation in the SAM circuit diagram of FIG. 32.

FIG. 36 is an exemplary diagram for explaining a READ-DISCARD operation in the SAM circuit diagram shown in FIG. 32.

In the READ-DISCARD operation, the Column Select Line signal CSL is supplied, and the sensing circuit outputs data accordingly.

According to the example presented herein, after the data stored in the memory cell is read, the restoration for recharging the electric charge in the corresponding memory cell is not performed, so that power consumption and the restoration time may be reduced. For example, it is applicable when storing the output feature map and then using the output feature map as the input feature map of the next layer.

Referring to FIG. 31A and FIG. 31B by comparison, memory latency can be reduced by the $t_{RAS}$ time.

Meanwhile, in order to prevent the capacitor from being charged with an electric charge, the overdriven word line by VCC+Vt may be turned-off. Therefore, power consumption can be reduced.

Figure 37:
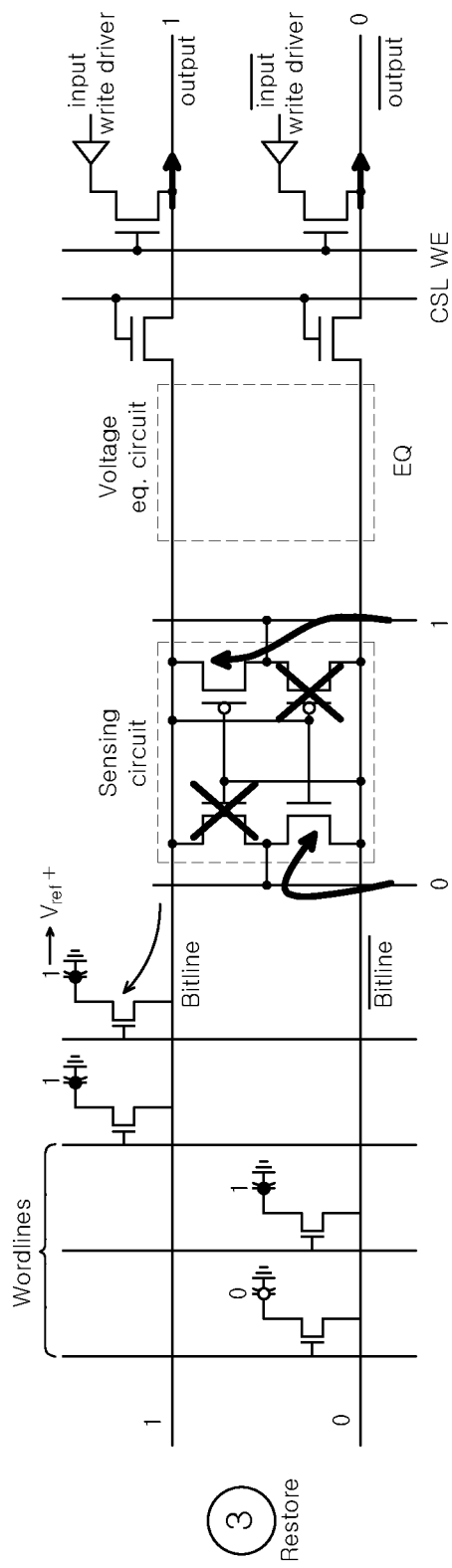
FIG. 37 is an exemplary diagram for explaining a READ operation in the SAM circuit diagram of FIG. 32.

FIG. 37 is an exemplary diagram for explaining a READ operation in the SAM circuit diagram of FIG. 32.

According to the READ command, the CSL signal is supplied and the sensing circuit outputs data.

According to the example presented herein, after the data stored in the memory cell is read, a restoration of recharging the electric charge in the corresponding memory cell may be performed.

Referring to FIG. 31B, $t_{RAS}$ time is required for restoration.

Keeping the word line being activated allows the fully driven Bitline voltage to restore the capacitor through the corresponding transistor of the sensing circuit. Therefore, power consumption according to the restoration is required.

Figure 38A:
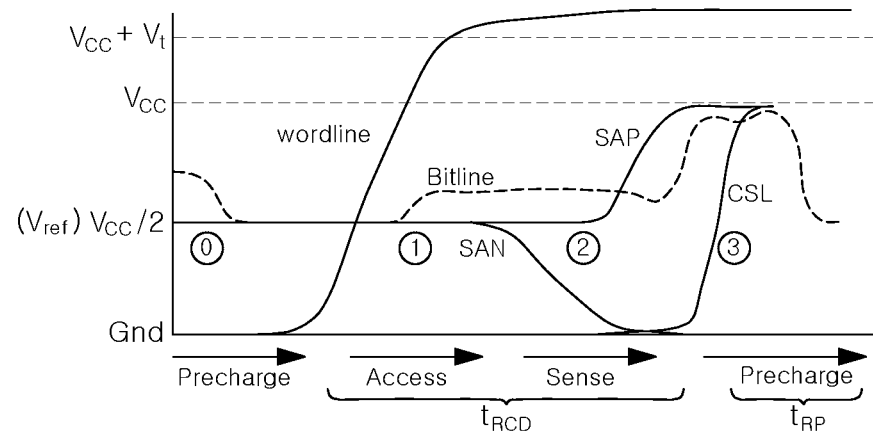
FIG. 38A is an exemplary waveform diagram of a READ-DISCARD operation.
Figure 38B:
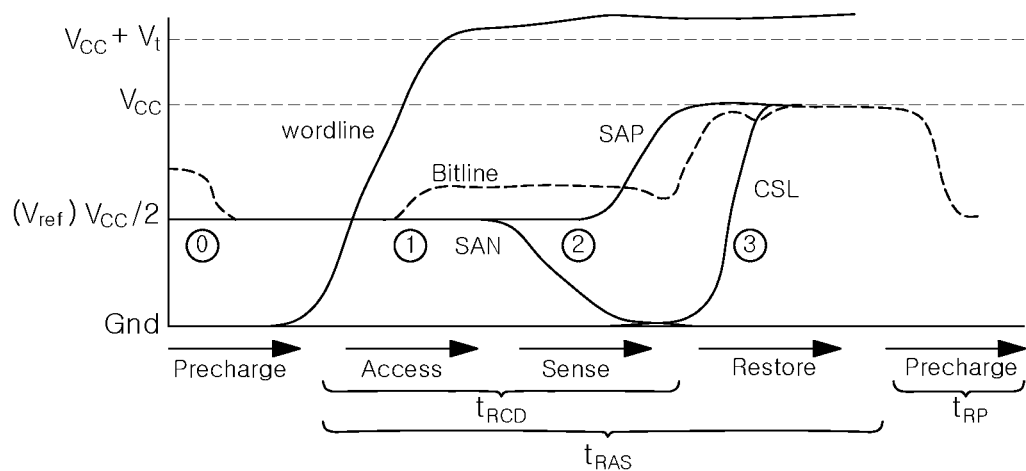
FIG. 38B is an exemplary waveform diagram of a READ operation.

FIG. 38A is an exemplary waveform diagram of a READ-DISCARD operation, and FIG. 38B is an exemplary waveform diagram of a READ operation.

In contrast to FIG. 38B, referring to FIG. 38A, since there is no RESTORE operation, the $t_{RAS}$ time may be shortened. FIGS. 31B and 31B may be referred to in order to understand the difference between the corresponding operations.

Figure 39:
FIG. 39 is a table showing part of the table of FIG. 21 in order to explain the REFREASH operation.

FIG. 39 is a table showing a part of the table of FIG. 21 in order to explain the REFREASH operation.

The table of FIG. 39 is for conceptually explaining the time to perform one inference time using the ANN model.

The time required for each unit of ANN DL # can be measured, calculated or predicted based on the processing speed of the processor, the bandwidth of the data bus, the operating speed of the memory and the like.

The SAM controller may control whether to refresh the data in a specific area (e.g., domain) of the memory based on the ANN DL information. The SAM controller may measure inference time based on the ANN DL information. For example, the repetition time of the same ANN DL unit # in the ANN DL information may be measured. That is, after performing the operation for ANN DL unit #1, it is possible to measure the time at which operation of ANN DL unit #1 returns again. As another example, it is possible to measure the time it takes to perform the start unit # and end unit # in the ANN DL information. That is, from unit #1 to unit #84 in the ANN DL information, the time taken to perform the operation may be measured. As another example, the processing time may be measured by setting a specific period in the ANN DL information.

If the SAM controller determines that one inference has been completed within the threshold time, memory refresh may be disabled. For example, if inference is completed once within a threshold time according to the ANN DL information, the refresh of the memory area in which the kernel is stored may be disabled.

The reason for doing this is as follows. When one inference operation is completed according to the ANN DL information, "read" or "write" of all kernels of the ANN model is completed once in the memory. In the case of the memory cell structure of DRAM, "reading" is substantially the same as refresh, so data can be preserved even if refresh is not repeatedly performed. However, when inference is interrupted in the middle of the inference or the threshold time is exceeded, the SAM controller may refresh only the memory cells (e.g., Rows) in which the kernel is stored. As another example, if one inference is completed within a threshold time according to the ANN DL information, the SAM controller may disable refresh for only the memory area in which the feature map is stored. The reason for doing this is as follows. Since the feature map cannot be reused, the feature map is insensitive to data loss, so it is possible to disable refresh. As another example, when a read-discard operation is performed, it may be effective to disable refresh because data has already been lost.

In detail, since a kernel may be a fixed value, it may be periodically refreshed. However, as described above, if repetition of read operations for the kernel can be predicted within the threshold time based on the ANN DL, refresh may be disabled.

However, the examples of the present disclosure are not limited thereto, and the read, write, and read-discard commands of the SAM may be appropriately selected based on the ANN DL, considering the characteristics of data, processing time, reuse or the like.

Meanwhile, the aforementioned threshold time may be exemplarily set to refresh threshold time $RT_{th}$=32 ms to 64 ms. The recommended time to prevent data loss may vary depending on the capacitance of the memory cell and the leakage current characteristic.

Also, when inference time (IT)<$RT_{th}$ is satisfied, the memory cells in which the feature map is stored may not receive a refresh command.

Data refresh policy can be set differently according to the ANN DL information.

For example, in the case of a kernel, a refresh policy may be set to increase the data protection level, and in the case of a feature map, the refresh policy may be set to decrease the data protection level.

By disabling refresh based on the ANN DL information, it is possible to reduce memory operation delay and reduce power consumption.

When the data of the artificial neural network model is distributed and stored in a plurality of banks in the memory, based on the ANN DL information, the precharge timing of the banks can be controlled, respectively.

Figure 40:
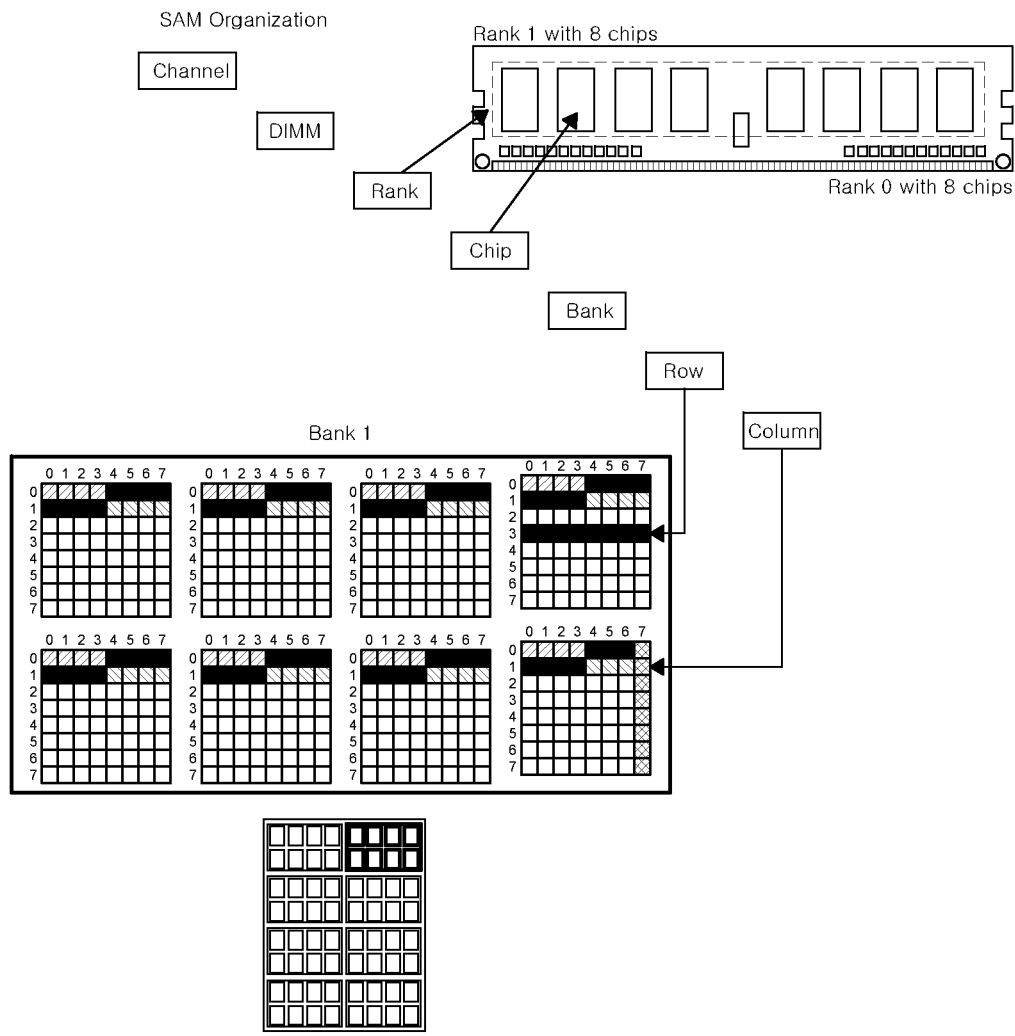
FIG. 40 shows an example in which a SAM memory is implemented in various forms according to an example of the present disclosure.

FIG. 40 shows an example in which a SAM memory is implemented in various forms according to an example of the present disclosure.

The SAM memory may be implemented in various forms according to application fields.

The memory bus, which is a data transfer path between cache memory in the AMC and/or the processor, may be implemented as a single channel or a dual channel. When the number of channels increases, power consumption increases, but there is an advantage in that the bandwidth can be improved by managing the kernel and/or the feature map, respectively. When two channels are used, the bandwidth is doubled compared to when one channel is used, so more data can be delivered to the cache in the AMC and/or the processor. The operations may be controlled based on the ANN DL.

A plurality of SAM memories may be grouped and driven in a "rank."

Each SAM memory may include a bank, which is a collection of independently operating memory cell arrays. For example, one bank may include eight memory cell arrays. Interleaving multiple memory banks can use low bandwidth devices to implement high bandwidth memory buses. Each memory array may include a row decoder, a column decoder, a sense amplifier, and an input/output buffer. "Row" refers to a row of a memory array. "Column" refers to a column of a memory array.

Figure 41:
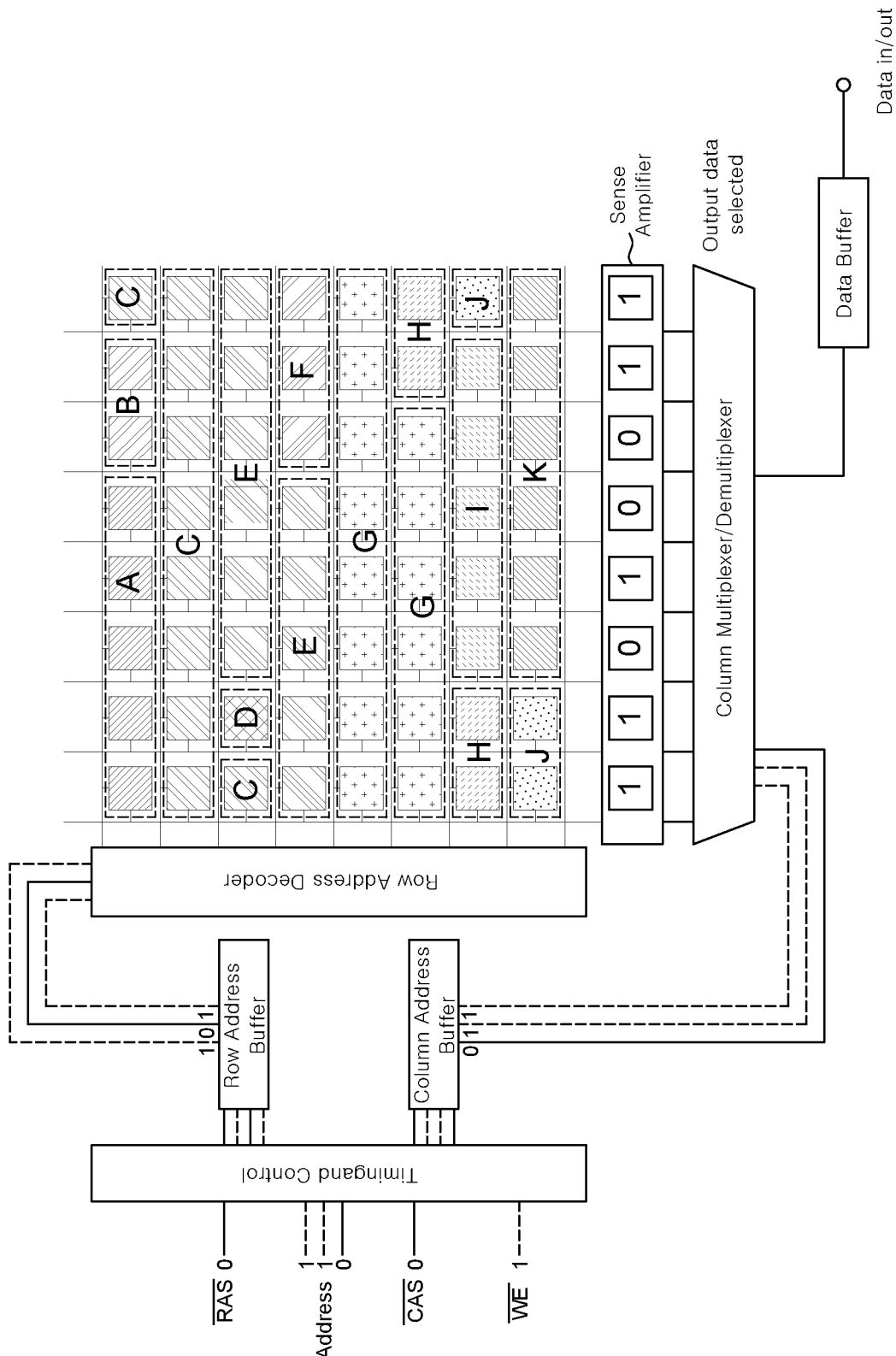
FIG. 41 is an exemplary diagram illustrating an example of a method of mapping an address of a main memory based on ANN DL information.

FIG. 41 is an exemplary diagram illustrating an example of a method of mapping an address of a main memory based on ANN DL information.

Referring to FIG. 41, the basic structure of the SAM is shown. The SAM includes a plurality of memory cells in a matrix structure having addresses of rows and columns. The SAM may be implemented as, for example, DRAM. However, examples of the present disclosure are not limited thereto.

A sense amplifier is disposed at lower ends of the plurality of memory cells of the matrix structure. The row address decoder selects a specific row. Thus, RAS latency is required to perform the corresponding operation. Data of the memory cells of the selected row are latched in the sense amplifier. The column address decoder selects necessary data from the data latched in the sense amplifier and transmits it to the data buffer. Thus, CAS Latency is required to perform the corresponding operation. The structure may be referred to as a bank of DRAM. A DRAM may include a plurality of banks.

In this case, when the DRAM operates in the burst mode, data is read or written while the addresses of the memory cells are sequentially increased. Therefore, RAS latency and CAS latency are minimized compared to the case of reading fragmented address data.

In other words, even if the AMC or NPU instructs the burst mode to the main memory, if the data stored in the DRAM is actually fragmented, RAS latency and CAS latency occur as much as the fragmentation. Therefore, it is difficult to substantially reduce RAS latency and CAS latency by simply executing the burst mode command if the data is fragmented.

Conversely, in the case of SRAM, whether data is fragmented does not substantially cause latency. Therefore, in the buffer memory or internal memory composed of SRAM, latency occurrence due to data fragmentation may not be fatal.

Referring to FIG. 41, based on the ANN DL information, the memory address map may be set in consideration of the sequence and size of data requested by the NPU to the memory cells of the DRAM. The memory map may be set based on a start address and an end address based on each data size. Therefore, if memory operations are performed in the sequence of ANN DL information in SAM, all memory operations may be operated in burst mode.

Accordingly, the main memory shown in FIG. 41 can be controlled based on the memory addresses and operation mode shown in Table 1.

TABLE 1

| Layer | Start address | End address | Operation mode | Domain | ANN DL | Size (Byte) |
|---|---|---|---|---|---|---|
| 1 | 0 | A = A' | Read-Burst | IFMAP | 1 | A |
| 1 | A' + 1 | A + 1 + B = B' | Read-Burst | Kernel | 2 | B |
| 1 | B' + 1 | B' + 1 + C = C' | Write-Burst | OFMAP | 3 | C |
| 2 | B' + 1 | B' + 1 + C = C' | Read-Burst | IFMAP | 4 | C |
| 2 | C' + 1 | C' + 1 + D = D' | Read-Burst | Kernel | 5 | D |
| 2 | D' + 1 | D' + 1 + E = E' | Write-Burst | OFMAP | 6 | E |
| 3 | D' + 1 | D' + 1 + E = E' | Read-Burst | IFMAP | 7 | E |
| 3 | E' + 1 | E' + 1 + F = F' | Read-Burst | Kernel | 8 | F |
| 3 | F' + 1 | F' + 1 + G = G' | Write-Burst | OFMAP | 9 | G |
| 4 | F' + 1 | F' + 1 + G = G' | Read-Burst | IFMAP | 10 | G |
| 4 | G' + 1 | G' + 1 + H = H' | Read-Burst | Kernel | 11 | H |
| 4 | H' + 1 | H' + 1 + I = I' | Write-Burst | OFMAP | 12 | I |
| 5 | H' + 1 | H' + 1 + I = I' | Read-Burst | IFMAP | 13 | I |
| 5 | I' + 1 | I' + 1 + J = J' | Read-Burst | Kernel | 14 | J |
| 5 | J' + 1 | J' + 1 + K = K' | Write-Burst | OFMAP | 15 | K |

In more detail, for the domain of Table 1, it is also possible to utilize the domain information described with reference to FIG. 12. To elaborate, it is also possible to utilize the operation mode information described in FIG. 12 for the operation mode of Table 1.

Since data is mapped to sequential addresses according to ANN DL information, the data can be processed with burst mode commands.

That is, the AMC can cache the necessary data before the NPU makes a request based on the ANN DL information (ANN DL), and can determine the sequence of all requests. Therefore, the cache hit rate of the buffer memory of the AMC can theoretically be 100%.

In addition, since the memory map of the main memory is set based on the ANN DL information, it is possible for all memory operations to operate in the burst mode.

Although a single memory bank is exemplarily shown in FIG. 29, address mapping may be performed in a bank interleaving method according to the configuration of a bank, a rank, and a channel of the memory.

If there are no considerations with respect to the ANN DL information, it is practically impossible to sequentially store data requested by the NPU in DRAM. That is, even if general artificial neural network model information is provided, if there is no ANN DL information described in various examples, it is impossible to know all the sequences of data operations requested by the NPU to the main memory.

If the AMC does not have the ANN DL information, it is difficult for the AMC to know whether the NPU will first request the kernel of the first layer of the artificial neural network model first or the input feature map of the first layer of the artificial neural network model first. Accordingly, it is substantially difficult to set a memory address map considering the burst mode in the main memory.

Figure 42:
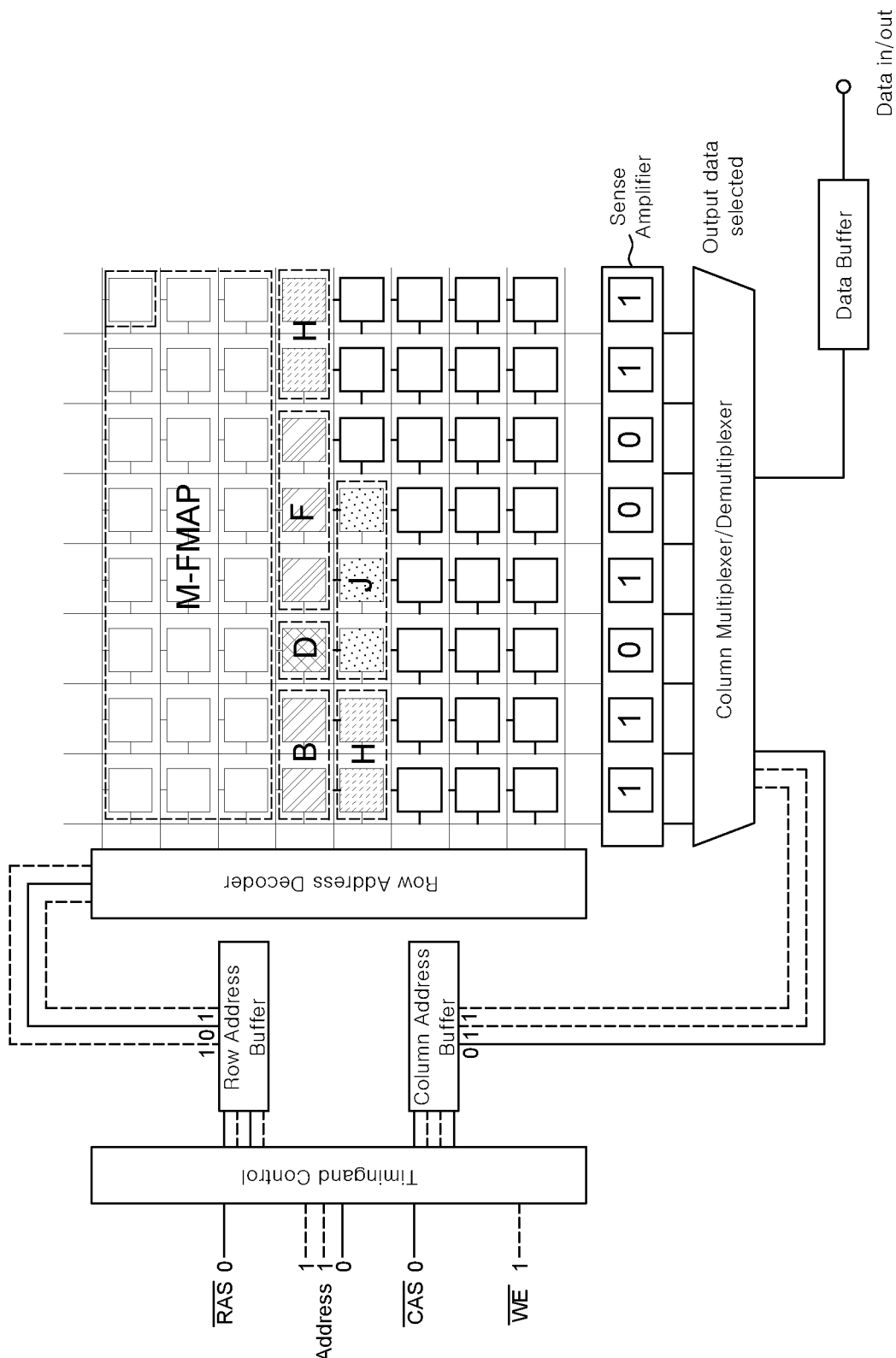
FIG. 42 is an exemplary diagram illustrating another example of a method of mapping an address of a main memory based on ANN DL information.

FIG. 42 is an exemplary diagram illustrating another example of a method of mapping an address of a main memory based on ANN DL information.

Since the structure of the main memory shown in FIG. 42 is substantially the same as that of the main memory shown in FIG. 41, a redundant description may be omitted.

Referring to FIG. 42, based on the ANN DL information, the memory map may be set in consideration of the sequence and size of data requested by the NPU to the memory cells of the DRAM. The memory map may be set based on a start address and an end address based on each data size. Therefore, if memory operations are performed in the sequence of the ANN DL information in the DRAM, all memory operations may be operable in the burst mode.

Accordingly, the main memory shown in FIG. 42 can be controlled based on the memory address and operation mode shown in Table 2.

The ANN DL information corresponding to FIG. 42 and Table 2 is an example of a case in which the NPU is set to use the input feature map and the output feature map in common.

TABLE 2

| Layer | Start address | End address | Operation mode | Domain | ANN DL | Size (Byte) |
|---|---|---|---|---|---|---|
| 1 | 0 | M_FMAP = A' | Read-Burst | IFMAP | 1 | M_FMAP |
| 1 | A' + 1 | A' + 1 + B = B' | Read-Burst | Kernel | 2 | B |
| 1 | 0 | C | Write--Burst | OFMAP | 3 | C |
| 2 | 0 | C | Read-Burst | IFMAP | 4 | C |
| 2 | B' + 1 | B' + 1 + D = D' | Read-Burst | Kernel | 5 | D |
| 2 | 0 | E | Write-Burst | OFMAP | 6 | E |
| 3 | 0 | E | Read-Burst | IFMAP | 7 | E |
| 3 | D' + 1 | D' + 1 + F = F' | Read-Burst | Kernel | 8 | F |
| 3 | 0 | G | Write-Burst | OFMAP | 9 | G |
| 4 | 0 | G | Read-Burst | IFMAP | 10 | G |
| 4 | F' + 1 | F' + 1 + H = H' | Read-Burst | Kernel | 11 | H |
| 4 | 0 | I | Write-Burst | OFMAP | 12 | I |
| 5 | 0 | I | Read-Burst | IFMAP | 13 | I |
| 5 | H' + 1 | H' + 1 + J = J' | Read-Burst | Kernel | 14 | J |
| 5 | 0 | K | Write-Burst | OFMAP | 15 | K |

The value of the kernel is fixed when training of the artificial neural network model is completed. Therefore, the value of the kernel has a constant characteristic. On the other hand, since the input feature map and the output feature map may be inputs of image data, camera, microphone, radar, lidar, and the like, once used, they may not be reused any more.

Referring to FIG. 20 as an example, the sizes of the input feature map and the output feature map of the artificial neural network model are defined. Therefore, it is possible to select the largest data size (M_FMAP) among the input feature maps and the output feature maps of the artificial neural network model. In the case of the artificial neural network model of FIG. 20, the feature map (M_FMAP) of the maximum size is 802,816 bytes. Therefore, the input feature maps and output feature maps of each layer of the artificial neural network model in Table 2 are set to have the same start address. That is, the input feature map and the output feature map may operate in the method of overwriting the same memory address. As described above, due to the characteristics of the artificial neural network model, when the input feature map and the kernel are convolved, an output feature map is generated, and the corresponding output feature map becomes the input feature map of the next layer. Therefore, the feature map of the previous layer is not reused anymore and may be deleted.

According to the above-described configuration, the size of the memory map of the main memory can be reduced by setting the memory area set based on the maximum feature map as the common area of the input feature map and the output feature map.

FIG. 43 is a table showing an example of accessing a memory according to sequence information in ANN DL information.

The SAM controller may control the burst length based on the ANN DL information. The SAM controller can efficiently control the burst mode according to the ANN DL information by using the burst-terminate command. The burst length may be defined by AXI protocol.

1) In case of ANN DL unit #1, it has a start address 0 and end address A'. Therefore, the end command of the burst mode indicated by the SAM controller may correspond to the data size A.

2) In case of ANN DL unit #2, it has start address A'+1 and end address B'. Therefore, the end command of the burst mode indicated by the SAM controller may correspond to the data size B.

3) In case of ANN DL unit #3, it has a start address B'+1 and end address C'. Therefore, the end command of the burst mode indicated by the SAM controller may correspond to the data size C.

4) In case of ANN DL unit #4, it has a start address B'+1 and end address C'. Therefore, the end command of the burst mode indicated by the SAM controller may correspond to the data size C.

5) In case of ANN DL unit #5, it has start address C'+1 and end address D'. Therefore, the end command of the burst mode indicated by the SAM controller may correspond to the data size D.

Examples of the present disclosure are not limited to the contents described above, and the burst length is programmable in the following ways.

a. Use a short fixed burst length.

b. Explicitly identifies the burst length of a read or write command.

c. The burst length is programmed using the DRAM fuse (laser programmable fuses, electrically programmable fuses).

d. Use a long, fixed burst length with the burst end command.

e. It uses a BEDO style protocol where each CAS/pulse toggles one data column (burst mode extended data out; BEDO DRAM).

Figure 44:
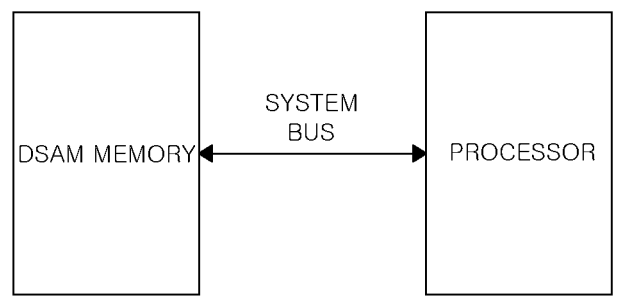
FIG. 44 is an exemplary diagram illustrating an example of a memory in which a SAM controller is embedded.

FIG. 44 illustrates an example of a memory in which a SAM controller is embedded.

In FIG. 44, the illustrated memory is an improved dedicated memory for an artificial neural network, and the memory may have a SAM controller embedded therein. That is, DSAM may refer to a SAM implemented based on DRAM.

Figure 45:
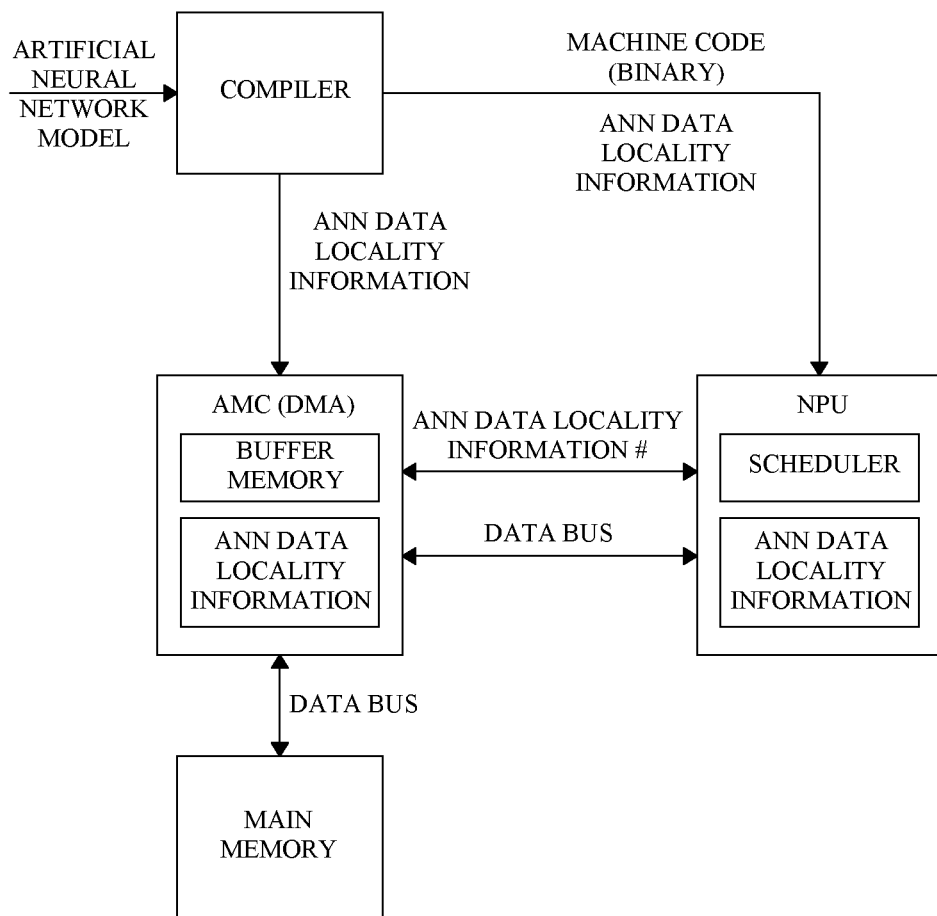
FIG. 45 is an exemplary diagram illustrating an architecture including a compiler.

FIG. 45 illustrates an architecture including a compiler.

In FIG. 45, the compiler may convert the artificial neural network model into machine code that can be run in the NPU.

The compiler may include a frontend and a backend. An intermediate representation (IR) may exist between the frontend and the backend. These IRs are abstract concepts of programs and are used for program optimization. The artificial neural network model can be converted to various levels of IR.

The high-level IR may be on the frontend of the compiler. The frontend of the compiler receives information about the artificial neural network model. For example, the information on the artificial neural network model may be the information exemplified in FIG. 23. The front end of the compiler may perform hardware-independent conversion and optimization.

The high-level IR may be at the graph level, and can optimize computation and control flow. The low-level IR may be located at the end of the compiler.

The backend of the compiler may convert the high-level IR to the low-level IR. The backend of the compiler may perform NPU optimization, CODE generation, and compilation.

The backend of the compiler may perform optimization tasks such as hardware intrinsic mapping, memory-allocation, and the like.

The ANN data locality information may be generated or defined in a low-level IR.

The ANN data locality information may include all memory operation sequence information to be requested by the NPU to the main memory. Therefore, the AMC can know the sequence of all memory operations that the NPU will request. As described above, the compiler may generate the ANN data locality information, or the AMC may generate the ANN data locality information by analyzing the repetition pattern of the memory operation commands requested by the NPU from the main memory.

ANN data locality information may be generated in the form of a register map or a lookup table.

After analyzing or receiving the ANN data locality information ANN DL, the compiler may generate a caching schedule of the AMC and/or the NPU based on the ANN DL. The caching schedule may include a caching schedule of an on-chip memory of the NPU and/or a caching schedule of a buffer memory of the AMC.

Meanwhile, the compiler may compile an artificial neural network model with optimization algorithms (e.g., Quantization, Pruning, Retraining, Layer fusion, Model Compression, Transfer Learning, AI Based Model Optimization, and another Model Optimizations).

In addition, the compiler may generate ANN data locality information of the artificial neural network model optimized for the NPU. The ANN data locality information may be separately provided to the AMC, and it is also possible for the NPU and the AMC to receive the same ANN data locality information, respectively. Also, as described above with reference to FIG. 14, there may be at least one AMC.

The ANN data locality information may include an operation sequence configured in a unit of memory operation request of the NPU, a data domain, a data size, a memory address map configured for sequential addressing.

The scheduler in the illustrated NPU may control an artificial neural network operation by receiving a binary machine code from the compiler.

The compiler may provide sequentially assigned memory address map information of the main memory to the DMA, which is the ANN memory controller (AMC), and the AMC may arrange or rearrange the artificial neural network model data in the main memory based on the sequential memory address map. The AMC may perform data reordering operations in the main memory during initialization of the NPU or runtime.

In this case, the AMC may optimize the read-burst operation in performing the arrangement or rearrangement. The arrangement or rearrangement may be performed when the NPU operation is initialized. In addition, the arrangement or rearrangement may be performed upon detection of a change in the ANN DL. These functions may be independently performed in the AMC during NPU operation without the compiler.

The AMC and the NPU may receive or provide the ANN data locality information to each other. That is, the compiler may provide the ANN data locality information to the AMC and the NPU. The AMC may be provided with information on the operation sequence of the ANN data locality information being processed by the NPU in real time. In addition, the AMC may synchronize the ANN data locality information with the NPU.

If the NPU is processing data corresponding to the ANN data locality information of token #N, the AMC predicts that data corresponding to the ANN data locality information of token #(N+1) will be requested from the NPU, considers the latency of the main memory, and requests the data corresponding to the ANN data locality information of token #(N+1) to the main memory. The corresponding operation may be independently performed by the AMC before receiving memory operation request from the NPU.

The compiler may generate a caching policy to store data necessary for a predicted operation according to ANN data locality in a buffer memory in the AMC. The compiler caches as much data as possible before the NPU requests it according to the buffer size of the DMA.

For example, the compiler may provide a caching policy to AMC to cache up to ANN data locality information token #(N+M). Here, M may be an integer value that satisfies the case where the data size of the ANN data locality information tokens #(N+1) to #(N+M) is smaller than or equal to the cache memory capacity of the AMC.

The compiler may determine that when the remaining cache memory capacity of the AMC is larger than the data size of the ANN data locality information token #(N+M+1), the ANN data locality information token #(N+M+1) data may be stored in an area in which data corresponding to the ANN data locality information token #(N) is stored.

To elaborate, the caching may be performed independently by the AMC without a command of the NPU based on the ANN DL stored in the ANN data locality information management unit of the AMC.

The compiler may provide a model lightening function. The compiler can further optimize and lighten the deep learning model to fit the corresponding NPU architecture.

Figure 46:
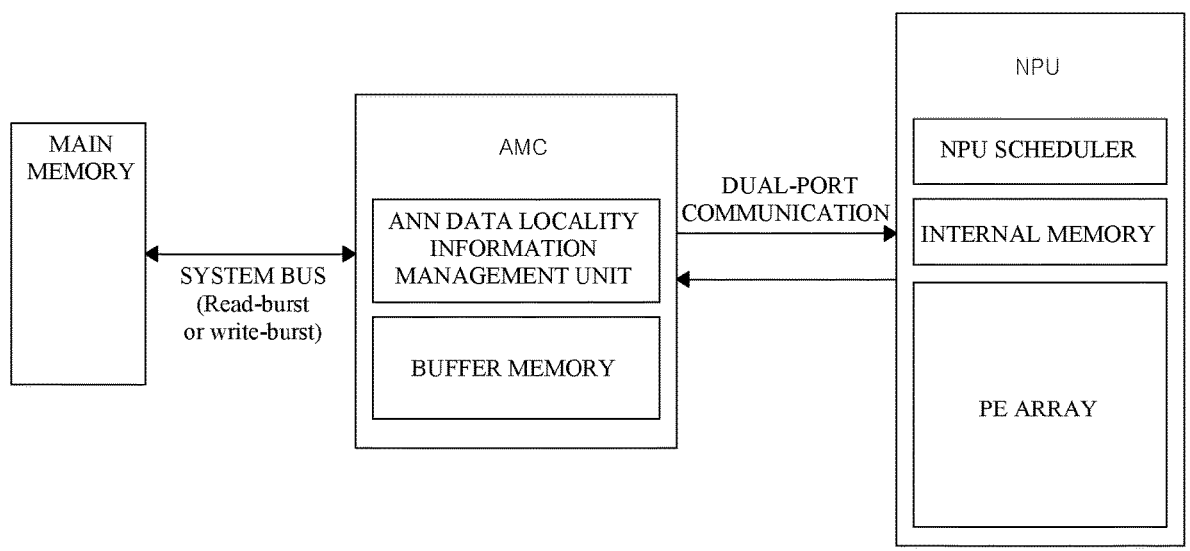
FIG. 46 shows an architecture according to the first example.

FIG. 46 shows an architecture of a system according to the first example.

Referring to FIG. 46, an NPU, an artificial neural network memory controller (AMC), and a main memory that is an external memory are shown. In some cases, the main memory may be referred to as an external memory.

For convenience of description below, the artificial neural network memory controller of various examples of the present disclosure may be referred to as an AMC.

The NPU may include an NPU scheduler, an internal memory and a PE array.

The PE array of various examples of the present disclosure may include a plurality of processing elements. The plurality of processing elements is independently drivable individually or drivable as a group. A PE array may be referred to as a plurality of processing elements.

The NPU may further include the SFU.

The PE array may perform an operation for an artificial neural network. For example, when input data is input, the PE array may perform an operation of deriving an inference result through an artificial neural network. In some examples, a plurality of processing element may be configured to operate independently from each other.

The NPU scheduler may be configured to control the operation of the PE array for the inference operation of the NPU and the read and write sequence of the NPU internal memory. In addition, the NPU scheduler may be configured to control the PE array and the NPU internal memory based on ANN data locality information.

The NPU scheduler may analyze the structure of the artificial neural network model to be operated in the PE array or may receive the analyzed information. For example, the compiler of the NPU may be configured to analyze the artificial neural network data locality. The data that the artificial neural network model may include includes at least an input feature map of each layer according to the locality of the artificial neural network data, a kernel, and an output feature map. Each layer may be selectively tiled according to the size of the layer and the size of the internal memory.

The ANN data locality information may be stored in a memory provided inside the NPU scheduler or the NPU internal memory. The NPU scheduler can access the main memory to read or write necessary data. In addition, the NPU scheduler may utilize the ANN data locality information or information about the structure based on data such as a feature map and a kernel for each layer of the artificial neural network model. The kernel may also be referred to as a weight. The feature map may also be referred to as node data. For example, ANN data locality may be generated when designing, completing training, or compiling an artificial neural network model. The NPU scheduler may store the ANN data locality information in the form of a register map. However, the present disclosure is not limited thereto.

The NPU scheduler can schedule the operation sequence of the artificial neural network model based on ANN data locality information.

The NPU scheduler may acquire a memory address value, in which the feature map and the kernel data of each layer of the artificial neural network model, are stored based on the ANN data locality information. For example, the NPU scheduler may obtain a memory address value in which the feature map and the kernel data of the layer of the artificial neural network model stored in the memory. Therefore, the NPU scheduler may prefetch at least a part of the feature map and kernel data of the layer of the artificial neural network model to be driven from the main memory, and then provide it to the NPU internal memory in a timely manner. The feature map of each layer may have a corresponding memory address value. Each kernel data may have a corresponding memory address value, respectively.

The NPU scheduler may schedule the operation sequence of the PE array based on the ANN data locality information, for example, data arrangement for layers of an artificial neural network of an artificial neural network model or information about a structure.

Since the NPU scheduler schedules the operations based on ANN data locality information, it may operate differently from the general CPU scheduling concept. Scheduling of a general CPU operates to achieve the best efficiency by considering fairness, efficiency, stability, and response time. That is, it is scheduled to perform the most processing within the same time in consideration of priority and operation time.

The conventional CPU used an algorithm for scheduling tasks in consideration of data such as the priority order of each processing, operation processing time, and the like.

That is, since the scheduling of a general CPU is random and difficult to predict, it is determined based on statistics, probability, and priority. On the contrary, since the orders of the artificial neural network operation are predictable rather than random, more efficient scheduling is possible. In particular, since artificial neural network computation has a huge amount of data, the computational processing speed of artificial neural network can be significantly improved according to efficient scheduling.

The NPU scheduler may determine the operation order based on the ANN data locality information.

Further, the NPU scheduler may determine the operation order based on the ANN data locality information and/or the data locality information of the NPU to be used or information about the structure.

According to the structure of the artificial neural network model, calculations for each layer are sequentially performed. That is, when the structure of the artificial neural network model is determined, the operation sequence for each layer may be determined. The sequence of operations or data flow according to the structure of the artificial neural network model can be defined as the data locality of the artificial neural network model at the algorithm level.

The PE array (i.e., a plurality of processing elements) means a configuration in which a plurality of PEs, configured to calculate a feature map and a kernel of an artificial neural network, are arranged. Each PE may include a multiply and accumulate (MAC) operator and/or an Arithmetic Logic Unit (ALU) operator. However, examples according to the present disclosure are not limited thereto.

On the other hand, the internal memory in the NPU may be a static memory. For example, the internal memory may be a SRAM or a register. The internal memory may simultaneously perform a read operation and a write operation. To this end, the AMC and the NPU may be connected through a dual-port communication interface. Alternatively, when the AMC and the NPU are connected through a single-port communication interface, a read operation and a write operation may be sequentially performed in a time-division multiplexing (TDM) manner.

The AMC may include an ANN data locality information management unit and a buffer memory.

The AMC may monitor the operation sequence information of the NPU through the ANN data locality information management unit.

The ANN data locality information management unit may order and manage the data to be provided to the plurality of PEs according to the operation sequence of the NPU. The buffer memory may temporarily store data read from the main memory before providing the data to the NPU. Also, the buffer memory may temporarily store the output feature map provided from the NPU before transferring it to the main memory.

The AMC reads the data to be requested by the NPU based on the ANN data locality information from the main memory before the NPU requests it and stores it in the buffer memory. The AMC immediately provides the corresponding data stored in the buffer memory when the NPU actually requests the corresponding data. Therefore, as the AMC is provided, the RAS latency and CAS latency that may be generated by the main memory can be substantially removed by monitoring the operation sequence of the artificial neural network model processed by the NPU.

The main memory may be a dynamic memory. For example, the main memory may be a SAM or a DRAM. The main memory, which is the DRAM, and the AMC may be connected through a system bus, for example, an AXI interface. The system bus may be implemented as a single-port. In this case, the DRAM may not be able to simultaneously process a read operation and a write operation.

Meanwhile, the AMC may rearrange data in the main memory so that a read operation becomes a burst operation based on the ANN data locality information.

Accordingly, when the DRAM, which is the main memory, supplies data to the buffer memory in a burst operation, the buffer memory may stream the data to the NPU.

The buffer memory may be implemented as a first in, first out (FIFO) form. The AMC switches to a standby state when the buffer memory is full. When the buffer memory transmits data to the NPU, the AMC reads data from the main memory based on the ANN data locality information and stores the data in the buffer memory. The AMC may exchange first data stored in a first memory address and second data stored in a second memory address.

If the size of the buffer memory is small (e.g., 1 KB), the buffer memory may only perform caching for hiding latency between the main memory and the NPU. In this case, a large amount of data may be transferred at once between the main memory and the NPU according to a burst operation. If the burst operation is performed sufficiently as such, the bandwidth of the main memory may be substantially maximized.

As a modified example of FIG. 17, the AMC may be embedded in the NPU, embedded in the main memory, or embedded in a system bus.

Figure 47:
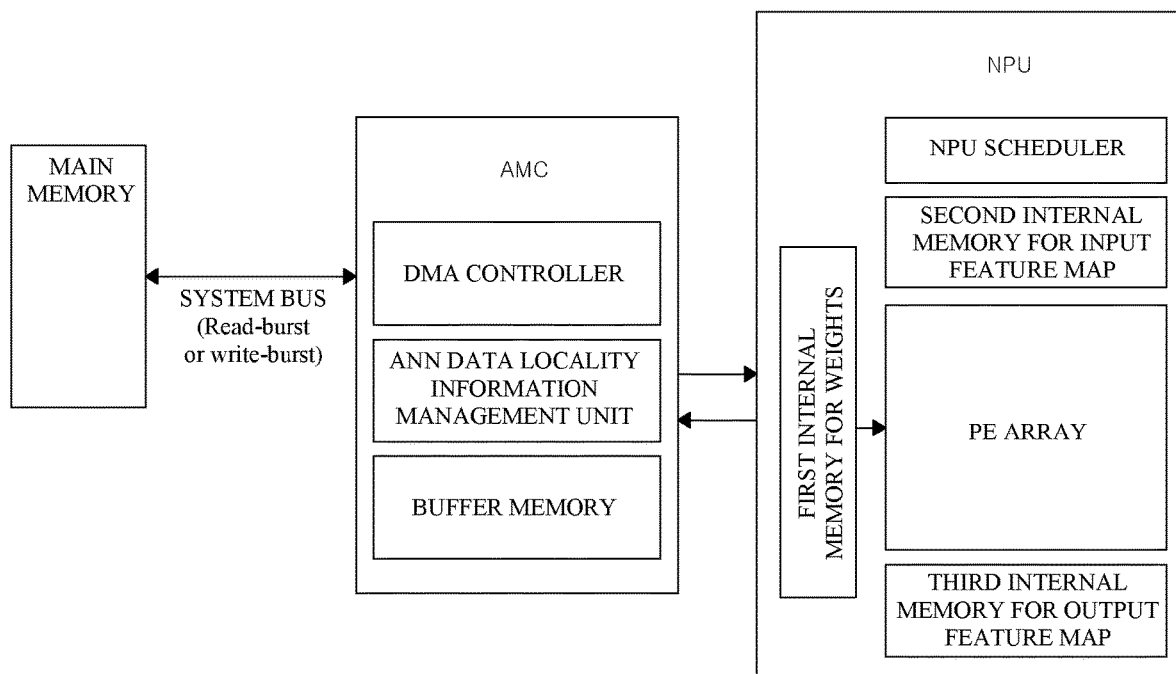
FIG. 47 shows an architecture according to the second example.

FIG. 47 shows an architecture of a system according to the second example.

Referring to FIG. 47, the NPU, the AMC and the main memory are shown. In the second example, duplicate descriptions described in other examples may be omitted for convenience of description. Configurations of other examples may be selectively applicable to this example.

The NPU may include an NPU scheduler, a plurality of internal memories, and a PE array.

Unlike FIG. 46, the plurality of internal memories in the NPU of FIG. 47 may include a first internal memory for a kernel, a second internal memory for an input feature map, and a third internal memory for an output feature map. The first to third internal memories may be a plurality of regions allocated in one physical memory. Each internal memory may each be provided with a port capable of communicating with the PE array. If each port is provided for each internal memory, the bandwidth of each internal memory may be guaranteed.

The size of each internal memory may be variably adjusted time to time. For example, the total of each internal memory is one Mbyte, and the size of each internal memory may be divided in a ratio of A:B:C. For example, the size of each of the internal memories may be divided in a ratio of 1:2:3. The ratio of each internal memory may be adjusted according to the size of the input feature map, the size of the output feature map, and the size of the kernel for each operation sequence of the artificial neural network model.

Unlike FIG. 46, the AMC of FIG. 47 may include a direct memory access (DMA) controller.

The external main memory may be a SAM or a DRAM.

Even if the DMA controller does not receive a command from the NPU while the PE array of the NPU is performing an operation for inference, data may be independently read from the main memory and stored in the buffer memory based on the ANN data locality information.

The DMA controller reads the data to be requested by the NPU based on the ANN data locality information from the main memory before the request from the NPU, and stores it in the buffer memory. The DMA controller immediately provides the corresponding data stored in the buffer memory when the NPU actually requests the corresponding data. Accordingly, as the DMA controller is provided, it is possible to substantially eliminate a RAS latency and a CAS latency that may be caused by the main memory.

Figure 48:
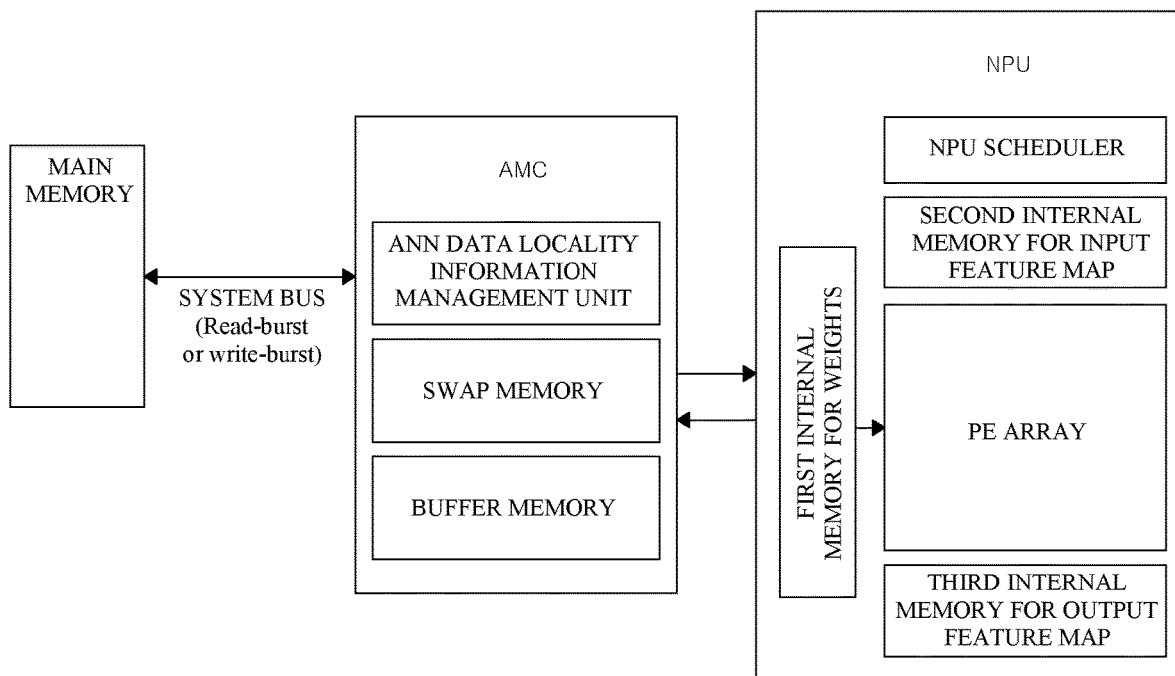
FIG. 48 shows an architecture according to the third example.

FIG. 48 shows an architecture of a system according to the third example.

Referring to FIG. 48, a NPU, an AMC, and a main memory is shown. In the third example, duplicate descriptions described in other examples may be omitted for convenience of description. Configurations of other examples may be selectively applicable to this example.

The NPU may include an NPU scheduler, a plurality of internal memories, and a PE array.

Unlike FIG. 46, the plurality of internal memories in the NPU of FIG. 48 may include a first internal memory for a kernel, a second internal memory for an input feature map, and a third internal memory for an output feature map. The first to third internal memories may be a plurality of regions allocated in one physical memory.

Unlike FIG. 46, the AMC of FIG. 48 may include an ANN data locality information management unit, a swap memory, and a buffer memory.

The external main memory may be a SAM or a DRAM.

A swap memory in the AMC may be used to rearrange data in the main memory.

In the main memory, data may be fragmented and stored at random addresses. However, when data is randomly stored, a non-sequential memory address must be used to read data from the main memory. In this case, CAS latency and RAS latency may occur frequently.

To solve such problem, the AMC may rearrange the data in the main memory based on the ANN data locality information. Specifically, the AMC temporarily stores at least a portion of the fragmented data from the main memory to the swap memory. Subsequently, the data stored in the main memory may be rearranged to enable a burst operation based on the ANN data locality information.

The data rearrangement operation may be performed only once during the initial stage. However, the present disclosure is not limited thereto. If the ANN data locality information is changed, the reordering operation may be performed again based on the altered ANN data locality information.

Meanwhile, as a modification, the AMC may perform the data rearrangement by allocating a swap area in the main memory without using the swap memory.

Figure 49:
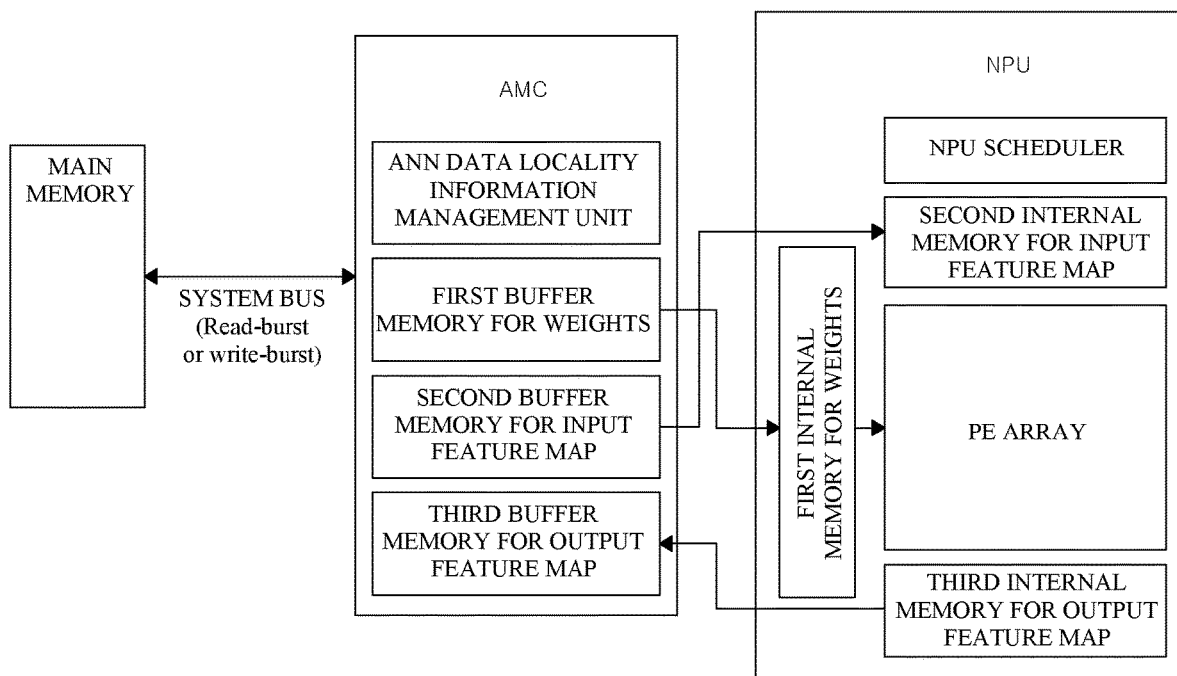
FIG. 49 shows an architecture according to the fourth example.

FIG. 49 shows an architecture of a system according to the fourth example.

Referring to FIG. 49, a NPU, an AMC, and a main memory is shown. In the fourth example, duplicate descriptions described in other examples may be omitted for convenience of description. Configurations of other examples may be selectively applicable to this example.

The NPU may include an NPU scheduler, a plurality of internal memories, and a PE array.

Unlike FIG. 46, the plurality of internal memories in the NPU of FIG. 49 may include a first internal memory for a kernel, a second internal memory for an input feature map, and a third internal memory for an output feature map.

The AMC may include an ANN data locality information management unit and a plurality of buffer memories.

Unlike FIG. 46, the plurality of buffer memories shown in FIG. 49 may include a first buffer memory for a kernel, a second buffer memory for an input feature map, and a third buffer memory for an output feature map. The first to third buffer memories may be a plurality of regions allocated in one physical memory.

Each internal memory in the NPU may be connected to each buffer memory in the AMC. For example, the first internal memory may be directly connected to the first buffer memory, the second internal memory may be directly connected to the second buffer memory, and the third internal memory may be connected to the third buffer memory.

Each buffer memory may be provided with a port that can communicate with each internal memory of the NPU, respectively.

The size of each buffer memory may be variably adjusted. For example, the total of each buffer memory is 1 Mbyte, and the size of each buffer memory may be divided in a ratio of A:B:C. For example, the size of each buffer memory may be divided in a ratio of 1:2:3. The ratio of each buffer memory may be adjusted according to the size of the input feature map, the size of the output feature map, and the size of the kernel data for each operation order of the artificial neural network model.

The AMC may individually store data for the operation of the NPU in each of the buffer memories based on the ANN data locality information.

On the other hand, as can be seen with reference to FIG. 23, when the artificial neural network model is based on Mobilenet V1.0, the size deviation of the kernel (i.e., weight) for depth-wise convolution and/or point-wise convolution may be quite large.

Accordingly, the size of each internal memory may be adjusted based on the ANN data locality information. Similarly, the size of each buffer memory may be adjusted.

Figure 50:
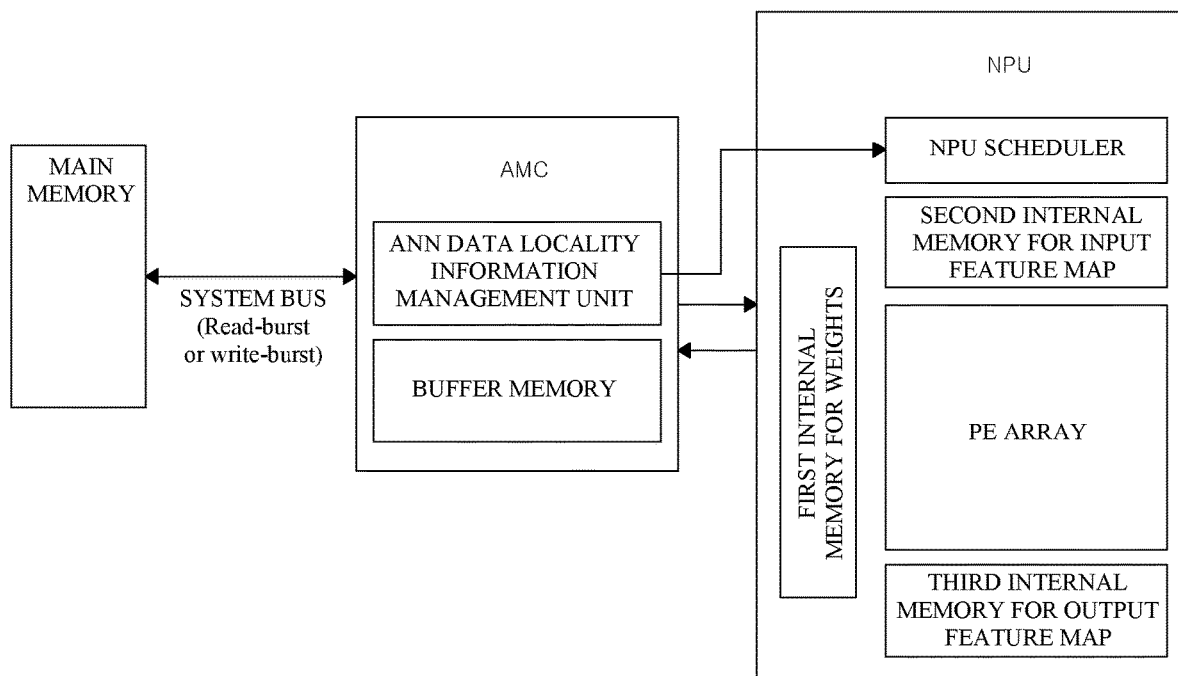
FIG. 50 shows an architecture according to the fifth example.

FIG. 50 shows an architecture of a system according to the fifth example.

Referring to FIG. 50, a NPU, an AMC, and a main memory is shown. In the fifth example, duplicate descriptions described in other examples may be omitted for convenience of description. Configurations of other examples are selectively applicable to this example.

The NPU may include an NPU scheduler, a plurality of internal memories, and a PE array.

Unlike FIG. 46, the plurality of internal memories in the NPU shown in FIG. 50 may include a first internal memory for a kernel, a second internal memory for an input feature map, and a third internal memory for an output feature map.

The AMC may include an ANN data locality information management unit and a buffer memory.

As mentioned in another examples, data may be randomly fragmented in the main memory. However, when data is randomly stored in this way, a non-sequential memory address must be used to read data from the main memory. As a result, CAS latency and RAS latency may occur.

To solve this problem, the AMC may rearrange the data in the main memory based on the ANN data locality information. Specifically, the AMC temporarily stores at least a portion of the fragmented data in the main memory in the buffer memory. Subsequently, the data stored in the main memory may be rearranged to enable a burst operation based on the ANN data locality information.

Meanwhile, when data is rearranged, a memory address may be changed. Accordingly, the ANN data locality information management unit in the AMC and the NPU scheduler may communicate with each other. Specifically, the ANN data locality information management unit stores the updated memory address after the data rearrangement. Then, the ANN data locality information management unit may update the previous memory address stored in the NPU scheduler.

Figure 51:
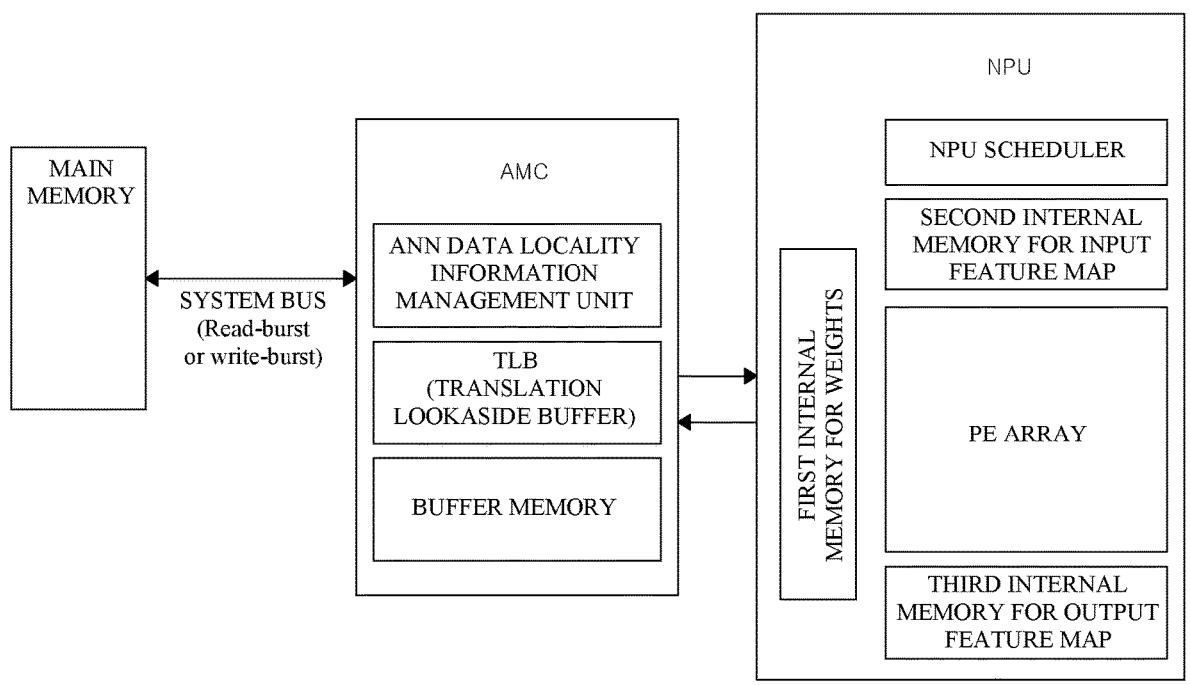
FIG. 51 shows an architecture according to the sixth example.

FIG. 51 shows an architecture of a system according to the sixth example.

Referring to FIG. 51, a NPU, an AMC, and a main memory is shown. In the sixth example, duplicate descriptions described in other examples may be omitted for convenience of description. Configurations of other examples are selectively applicable to this example.

The NPU may include an NPU scheduler, a plurality of internal memories, and a PE array.

Unlike FIG. 46, the plurality of internal memories in the NPU shown in FIG. 51 may include a first internal memory for weights, a second internal memory for input feature maps, and a third internal memory for output feature maps. The first to third internal memories may be a plurality of regions allocated in one physical memory The AMC may include an ANN data locality information management unit, a translation lookaside buffer (TLB), and a buffer memory.

The data may be randomly stored in the main memory. However, when data is randomly stored as such, in order to read data from the main memory, a non-sequential memory address must be used, so there is a possibility that CAS latencies and RAS latencies may occur.

To solve this problem, the AMC may rearrange the data in the main memory based on the ANN data locality information. Specifically, after temporarily storing the data stored in the main memory into the buffer memory, the AMC may rearrange the data stored in the main memory to enable a burst operation based on the ANN data locality information.

Meanwhile, when data is rearranged, a memory address may be changed. Accordingly, the TLB in the AMC may store the old memory address before the rearrangement and the new memory address after the rearrangement in the form of a table.

When the scheduler in the NPU requests data using the old memory address, the TLB in the AMC may convert the old memory address to the new memory address, read data from the main memory, and store the data in the buffer memory. Accordingly, unlike FIG. 21, the main memory can operate in the burst mode without updating the memory address stored in the NPU scheduler through the TLB.

In the various examples described above, the AMC and the NPU are shown in a separate configuration, but the AMC may be configured to be included in the NPU.

Figure 52:
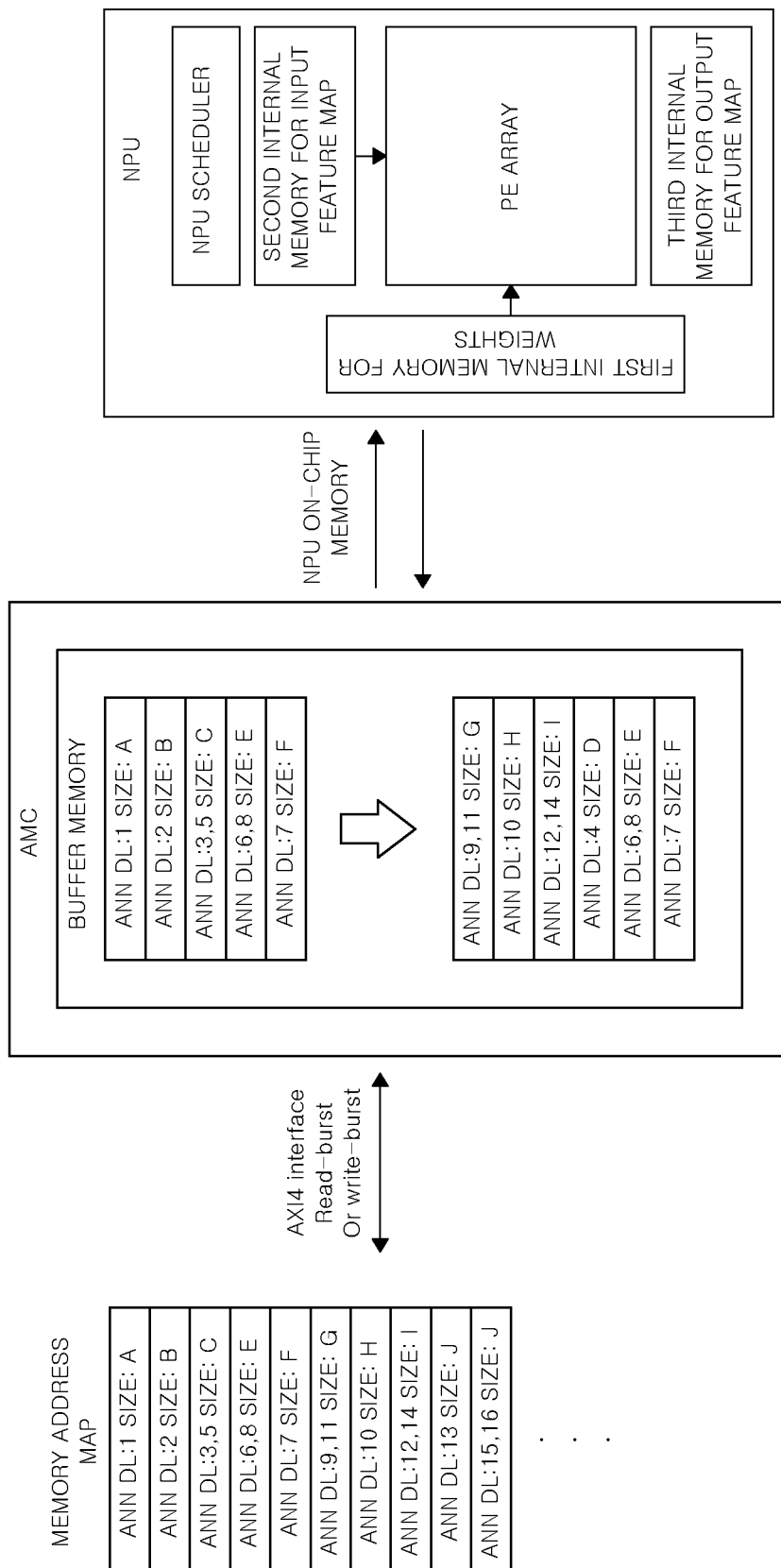
FIG. 52 is an exemplary diagram illustrating an operation according to the sixth example shown in FIG. 51.

FIG. 52 is an exemplary diagram illustrating an operation according to the sixth example shown in FIG. 51.

As can be seen with reference to FIG. 52, the memory address map may be set based on a table according to the ANN DL. In the buffer memory of the AMC, data are sequentially cached in advance according to the sequence in the ANN DL information. In order not to overflow the buffer memory, data in the oldest sequence may be deleted based on the size of the buffer memory.

FIGS. 53A and 53B are exemplary diagrams showing an example of convolution operation.

Referring to FIG. 53A, a first layer for performing a convolution operation is shown. The size of the input feature map may be 9×9×1, the size of the kernel including weights may be 3×3×1, the stride is 1, and the size of the output feature map may be 7×7×1.

If the first input feature map is read from the main memory following the direction of the arrow as shown in FIG. 53A, the convolution operation can be started relatively faster. The direction in which the first input feature map is read may be read along the vertically scanning arrow direction as much as the height of the kernel and then read along the horizontally scanning arrow direction.

Figure 54:
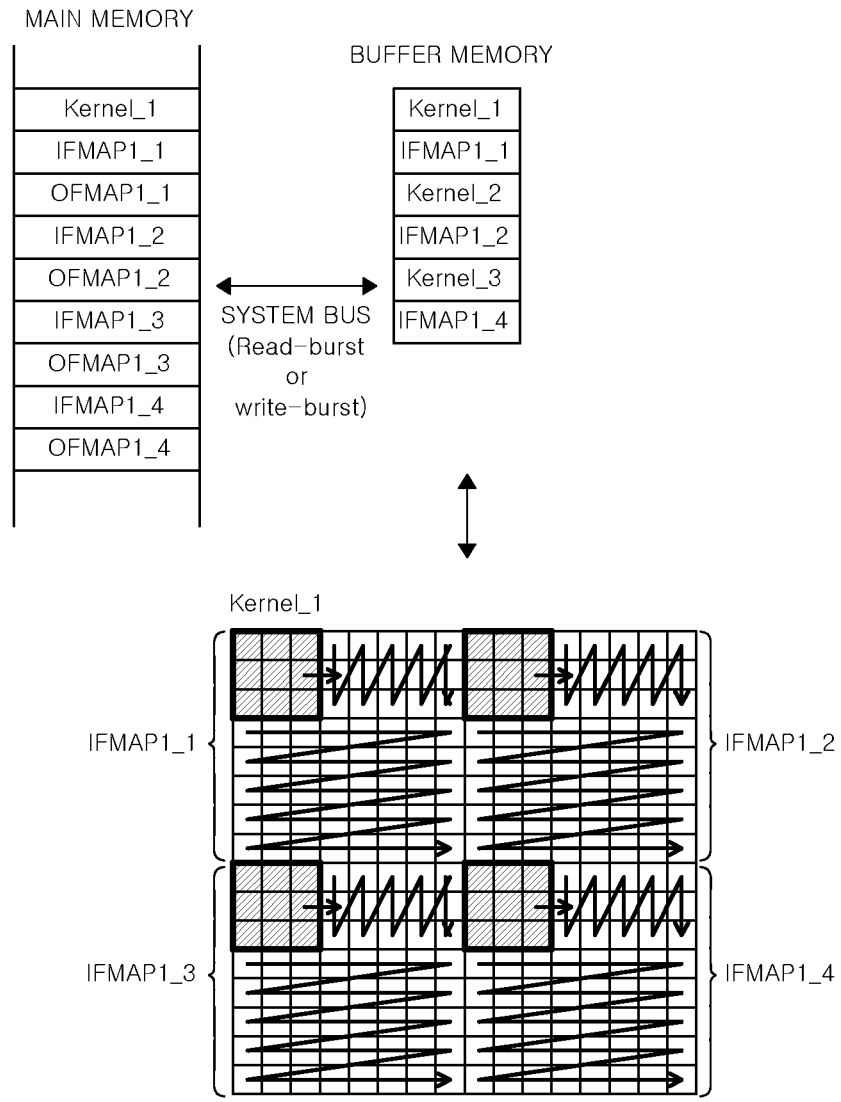
FIG. 54 shows another example of performing an operation based on a tiling technique after caching data from the main memory to the cache memory.

FIG. 54 shows another example of performing an operation based on a tiling technique after caching data from the main memory to the cache memory.

Referring to FIG. 54, the main memory and the buffer memory (i.e., cache memory) in the AMC are shown. The main memory and the buffer memory may be connected to each other through a system bus. The example of FIG. 54 is an example to which the tiling algorithm is applied. Hereinafter, an example of tiling will be described.

At least one of a kernel, an input feature map, and an output feature map stored in the main memory may be tiled. The memory address map of the main memory may be tiled.

At least one of a kernel, an input feature map, and an output feature map stored in the buffer memory may be tiled. The memory address map of the buffer memory may be tiled.

As shown, it is assumed that the input feature map for the first layer has a size of 18×18×1 only for convenience of description. The input feature map may be tiled into four input feature maps having a size of 9×9×1.

That is, the first input feature map for the first layer may be a combination of a first input feature map tile IFMAP_1-1, a second input feature map tile IFMAP_1-2, a third input feature map tile IFMAP_1-3, and a fourth input feature map tile IFMAP_1-4. The four input feature map tiles may be combined to form a first input feature map.

In this case, the first kernel (Kernel_1) of the first layer may be reused. Therefore, the same kernel can be used for the convolution of each tile. In this case, the first kernel (Kernel_1) may be reused in the NPU internal memory until the four tilings are completed.

That is, when the first kernel (Kernel_1) and the first input feature map tile (IFMAP_1-1) are convolved, the first output feature map tile (OFMAP_1-1) is generated. When the first kernel (Kernel_1) and the second input feature map tile (IFMAP_1-2) are convolved, the second output feature map tile (OFMAP_1-2) is generated. When the first kernel (Kernel_1) and the third input feature map tile (IFMAP_1-3) are convolved, the third output feature map tile (OFMAP_1-3) is generated. When the first kernel (Kernel_1) and the fourth input feature map tile (IFMAP_1-4) are convolved, the fourth output feature map tile (OFMAP_1-4) is generated. The four output feature map tiles may be combined to form a first output feature map.

In this case, the memory address map of the main memory may be set to operate in a burst mode based on the tiled ANN DL information. That is, the ANN DL information may be changed according to the tiling method. The tiling policy may be variously modified.

That is, the ANN DL information may include the sequence of data to be requested by the NPU to the main memory and the sequence according to tiling.

For example, the ANN DL information may include a sequence of a first input feature map tile (IFMAP_1-1), a second input feature map tile (IFMAP_1-2), a third input feature map tile (IFMAP_1-3), and a fourth input feature map tile (IFMAP_1-4).

For example, the ANN DL information may include a sequence of a fourth input feature map tile (IFMAP_1-4), a third input feature map tile (IFMAP_1-3), a second input feature map tile (IFMAP_1-2), and a first input feature map tile (IFMAP_1-1).

That is, the buffer memory of the AMC may receive or generate the ANN DL information, predict the sequence to be requested by the NPU, and sequentially cache data corresponding to the sequence.

Figure 55:
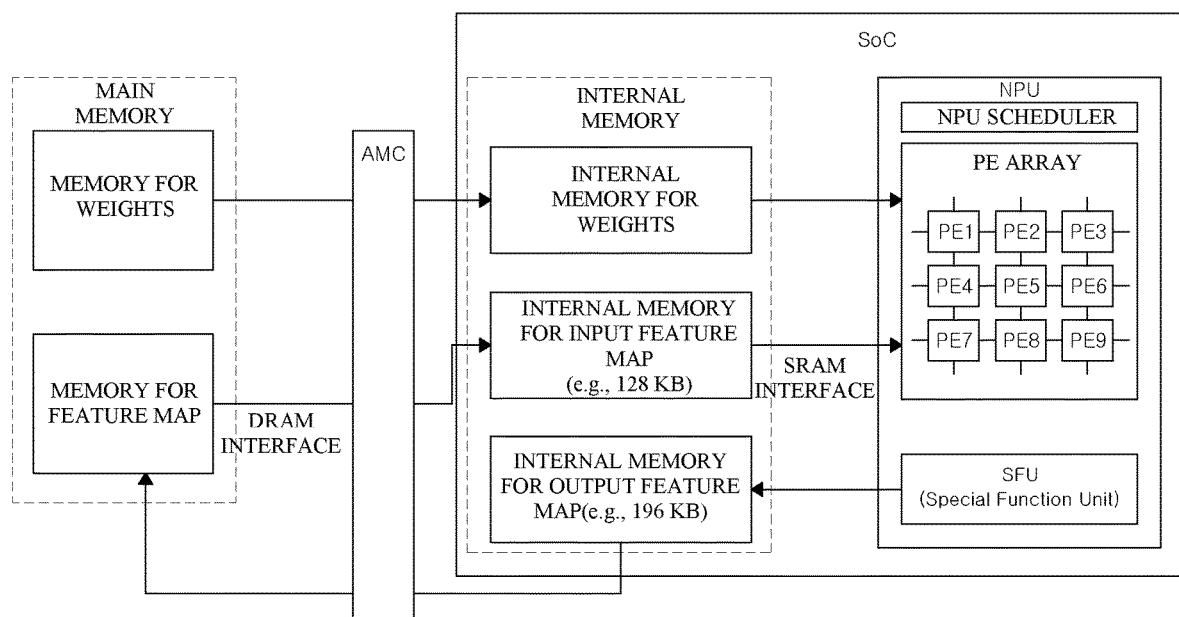
FIG. 55 is a schematic diagram illustrating an artificial neural network memory system according to various examples of the present disclosure.

FIG. 55 illustrates an artificial neural network memory system according to various examples of the present disclosure.

Referring to FIG. 55, the NPU and one or more internal memories are implemented in the form of a System on Chip (SoC). The internal memory may be SRAM. Accordingly, the NPU and the internal memory may be connected through an SRAM interface.

An AMC may be disposed between the SoC and the main memory. The AMC, disposed between the main memory and the internal memory, may be configured to predict the data to be requested by the NPU based on the ANN DL information, and to cache the data stored in the main memory in advance before the NPU requests the actual request.

The internal memory may include a first internal memory for storing weights, a second internal memory for storing an input feature map, and a third internal memory for storing an output feature map. The three internal memories may be a plurality of logical regions allocated in one physical memory. For example, the size of the second internal memory may be 128 KB, and the size of the third internal memory may be 196 KB.

The NPU may include a PE array including a plurality of PEs and a special function unit (SFU). The NPU may read the weights from the first internal memory, may read the input feature map from the second internal memory, and then may perform a convolution operation on the input feature map and the weights, and then output an output feature map.

In addition, one or more external main memories may exist outside the SoC, and are electrically connected to the SoC. The external main memory may be a SAM or DRAM. Accordingly, the one or more external main memories and the SoC may be connected through a DRAM interface.

The external main memory may include a first external main memory for storing weights and a second external main memory for storing a feature map. The two external main memories may be a plurality of areas allocated within one physical memory.

The SoC may read the weight in the first external main memory and the feature map in the second external main memory through a read command, and may store the data in the first internal memory and the second internal memory, respectively. Also, the SoC may store the output feature map stored the third internal memory to the second external main memory through a write command.

Figure 56:
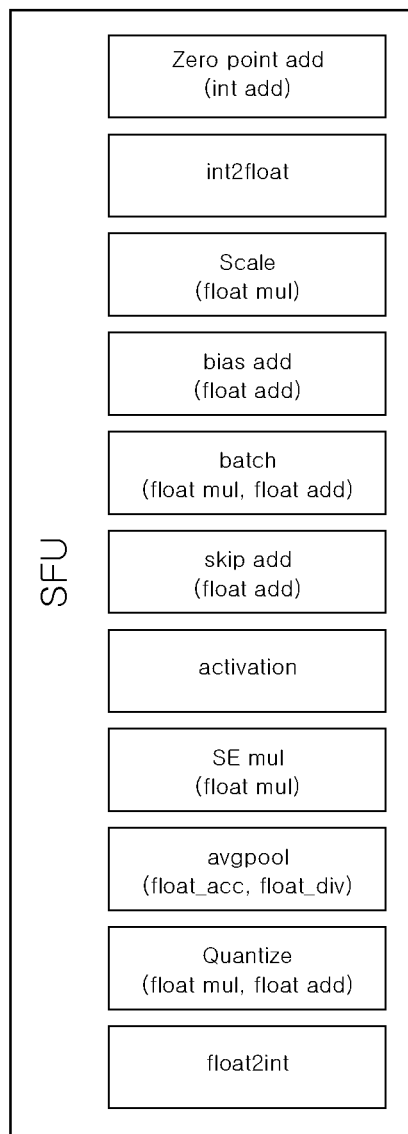
FIG. 56 shows the detailed configuration of the SFU of FIG. 55.

FIG. 56 shows the detailed configuration of the SFU shown in FIG. 55.

An example of each operation configuration of the SFU of FIG. 56 may be organized in the following table.

TABLE 3

|  | Description | Operation |
| --- | --- | --- |
| Zero point add | Offset addition by Filter or Tensor (Dequantize offset operation) | Int add |
| Int2float | Type casting | |
| Scale | Scale Multiply by Filter or Tensor (Dequantize offset operation) | Float mul |
| Bias add | Add bias value for each filter | Float add |
| Batch | Floating point values for each filter and mul/add. Scale factor and zero point are fusing | Float mul Float add |
| Skip add | Block previous output and element wise add (Skip connection add) | Float add |
| Activation | Activation Function | |
| SE mul | SE block output and previous output and channel wise multiplication (SE module output and multiply) | Float mul |
| Avgpool | After Accumulate feature dimension divide | Float add Float Mul |
| Quantize | Zero-point addition, scale multiply | Float add Float Mul |
| Float2Int | Type casting | |

Figure 57:
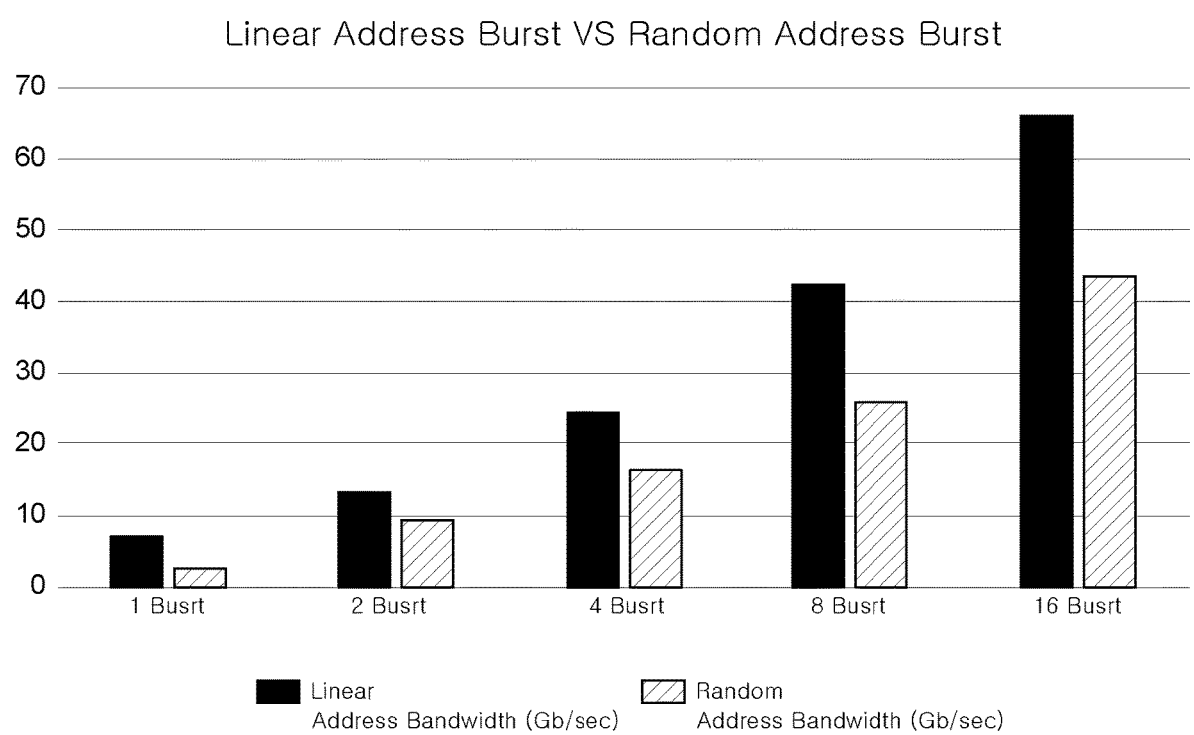
FIG. 57 shows a graph measuring the bandwidth of the data bus between the buffer memory (cache) and the main memory.

FIG. 57 shows a graph measuring the bandwidth of the data bus between the buffer memory (cache) and the main memory.

The graph shown in FIG. 57 shows the result of measuring the bandwidth when the buffer memory (cache) and the main memory are connected through the AXI4 interface.

The measurement of the bandwidth was performed in a situation in which 2 Mbytes of data was read from the DRAM, which is the main memory, to the SRAM, which is the buffer memory, 10 times for each AXI burst length (1 to 16). The AXI interface can adjust the burst length.

The graph shown in FIG. 57 may be summarized in a table as follows:

TABLE 4

| | Burst length | 1 | 2 | 4 | 8 | 16 |
| --- | --- | --- | --- | --- | --- | --- |
| Linear Address | Time (ns) | 2,310,440 | 1,198,699 | 654,484 | 378,766 | 242,023 |
| | Bandwidth (Gb/sec) | 6.93 | 13.35 | 24.45 | 42.24 | 66.11 |
| Random Address | Time (ns) | 6,108,015 | 1,738,665 | 983,017 | 617,457 | 363,018 |
| | Bandwidth (Gb/sec) | 2.62 | 9.20 | 16.28 | 25.91 | 44.07 |

When the address is linear regardless of the burst length, the transmission bandwidth, that is, the transmission speed is improved.

If the burst length is the same, using a linear address may result in a faster transfer rate. It may be advantageous to efficiently allocate the address of the DRAM, which is the main memory, to enable the read-burst.

The burst length means a length of reading at a time in bursts. In the linear case, even if the burst length is short, since the DRAM addresses are sequentially incremental, the RAS latency and/or the CAS latency can be reduced.

That is, if the memory map of the main memory is set linearly based on the ANN data locality information, the bandwidth increases compared to the random case. Accordingly, the effective bandwidth between the main memory and the buffer memory can be increased.

The features, structures, effects and the like described in the foregoing embodiments are included in one embodiment of the present disclosure and are not necessarily limited to one embodiment. Moreover, the features, structures, effects and the like illustrated in each embodiment may be combined or modified by those skilled in the art for the other embodiments to be carried out. Therefore, the combination and the modification of the present disclosure are interpreted to be included within the scope of the present disclosure.

In the above description, the present disclosure has been described based on the examples, but the examples are for illustrative, and do not limit the present disclosure, and those skilled in the art will appreciate that various modifications and applications, which are not exemplified in the above description, may be made without departing from the scope of the essential characteristic of the present examples. For example, each constituent element specifically present in the example may be modified and carried out. Further, the differences related to the modification and the application should be construed as being included in the scope of the present invention defined in the accompanying claims.

What is claimed is:

1. A system for an artificial neural network (ANN), the system comprising:
a main memory including a dynamic memory cell electrically coupled to a bit line and a word line; and
a memory controller configured to selectively omit a restore operation during a read operation of the dynamic memory cell and to determine whether data stored in the dynamic memory cell is reused based on an ANN data locality,
wherein data of an output feature map of an ANN model is stored in the dynamic memory cell, and wherein the memory controller is further configured to determine that the output feature map data is not reused during the read operation after the storing of the output feature map data.

2. The system of claim 1, wherein the dynamic memory cell is configured to operate in a sequence of precharge, access, sense, and restore, or in a sequence of precharge, access, and sense.

3. The system of claim 1, wherein the main memory is configured to selectively omit the restoration operation during the read operation of the dynamic memory cell by controlling a voltage applied to the word line.

4. The system of claim 1, wherein the memory controller is further configured to determine whether to perform the restoration operation by determining whether data stored in the dynamic memory cell is reused.

5. The system of claim 1, wherein a latency of the read operation of the main memory is shorter when the restore operation is omitted than when the restore operation is not omitted.

6. The system of claim 1, wherein the omission of the restore operation is configured to reduce a charging time of the dynamic memory cell such that data stored in the dynamic memory cell is lost.

7. A memory for an artificial neural network (ANN), the memory comprising:
a memory controller; and
at least one dynamic memory cell electrically connected to a bit line and a word line, the at least one dynamic memory cell configured to perform a read-discard operation from the memory controller to selectively omit a restore operation during a read operation, wherein the at least one dynamic memory cell includes a first area configured to store output feature map data of an ANN model corresponding to the read-discard operation based on an ANN data locality, and wherein the memory controller is further configured to determine that the output feature map data is not reused during the read operation after the storing of the output feature map data.

8. The memory of claim 7, wherein the at least one dynamic memory cell includes a first area configured to store data corresponding to the read-discard operation.

9. The memory of claim 7, wherein data corresponding to the read-discard operation is a feature map data of an artificial neural network model.

10. The memory of claim 7,
wherein the at least one dynamic memory cell includes an area corresponding to the read-discard operation, and
wherein the area corresponding to the read-discard operation is set in a unit of the word line.

11. The memory of claim 7, wherein a refresh operation of the word line corresponding to the read-discard operation is deactivated until a write operation.

12. A system for an artificial neural network (ANN), the system comprising:
at least one memory cell array of N columns and M rows;
a memory controller configured to operate at least a portion of a read operation as a read-discard operation based on sequential access information, when the at least one memory cell array receives a command for the read operation; and
a processor configured to provide ANN data locality information to the memory controller, wherein the at least one memory cell array receives a command for the read-discard operation by which stored data is read, and wherein the at least one memory cell array receives the read-discard operation command when the stored data is an output feature map and the stored data is read.

13. The system of claim 12, wherein the sequential access information includes a repeating pattern of an input feature map, a kernel, and an output feature map in order.

14. The system of claim 12, wherein the sequential access information includes a repeating pattern of a kernel, an input feature map, and an output feature map in order.

15. The system of claim 12,
wherein the memory controller includes a cache memory,
wherein the memory controller is further configured to store data of at least one subsequent processing step performed by a processor, and
wherein the at least one subsequent processing step is based on a current processing step and includes a request sent from the at least one memory cell array to the cache memory.

16. The system of claim 12, wherein the sequential access information includes information on a predetermined operation sequence of an artificial neural network to be processed by a processor.

* * * * *